(12) United States Patent
Uehara et al.

(10) Patent No.: US 10,504,598 B2
(45) Date of Patent: Dec. 10, 2019

(54) NON-VOLATILE SEMICONDUCTOR STORAGE DEVICE WITH TWO WRITE MODES

(71) Applicant: Toshiba Memory Corporation, Tokyo (JP)

(72) Inventors: Kazuto Uehara, Kanagawa (JP); Yoshikazu Harada, Kanagawa (JP); Kenta Shibasaki, Kanagawa (JP); Junichi Sato, Kanagawa (JP); Akio Sugahara, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/881,664

(22) Filed: Jan. 26, 2018

(65) Prior Publication Data

US 2018/0261290 A1    Sep. 13, 2018

(30) Foreign Application Priority Data

Mar. 9, 2017  (JP) .................................. 2017-044919

(51) Int. Cl.
| | |
|---|---|
| *G11C 16/10* | (2006.01) |
| *G11C 16/26* | (2006.01) |
| *G11C 16/34* | (2006.01) |
| *G11C 16/04* | (2006.01) |
| *G11C 11/56* | (2006.01) |
| *G11C 16/08* | (2006.01) |
| *G11C 16/32* | (2006.01) |

(52) U.S. Cl.
CPC .......... *G11C 16/10* (2013.01); *G11C 11/5628* (2013.01); *G11C 11/5642* (2013.01); *G11C 16/0483* (2013.01); *G11C 16/08* (2013.01); *G11C 16/26* (2013.01); *G11C 16/32* (2013.01); *G11C 16/3459* (2013.01); *G11C 2211/5621* (2013.01)

(58) Field of Classification Search
None
See application file for complete search history.

(56) References Cited

U.S. PATENT DOCUMENTS

| | | | |
|---|---|---|---|
| 5,781,478 A | * | 7/1998 | Takeuchi ............... G11O 5/063 365/185.11 |
| 7,024,598 B2 | | 4/2006 | Jeong et al. |
| 7,242,615 B2 | | 7/2007 | Nagashima |
| 7,451,366 B2 | | 11/2008 | Youn et al. |
| 7,813,186 B2 | | 10/2010 | Park et al. |

(Continued)

*Primary Examiner* — J. H. Hur
(74) *Attorney, Agent, or Firm* — Kim & Stewart LLP

(57) ABSTRACT

A non-volatile semiconductor storage device includes a memory cell array and a control circuit configured to control a data write operation for the memory cell array in a first or second write mode in response to a write command sequence. In the first write mode, the control circuit performs a first write operation, which includes an operation in which one or more bit lines are charged according to write data and an operation in which a write voltage is applied to a selected word line according to address data included in the write command sequence. In the second write mode, the control circuit performs a second write operation, which includes the operation in which the one or more bit lines are charged according to the write data and does not include the operation in which the write voltage is applied to the selected word line.

18 Claims, 40 Drawing Sheets

(56) References Cited

U.S. PATENT DOCUMENTS

| | | | |
|---|---|---|---|
| 8,108,739 B2 | 1/2012 | Adams et al. | |
| 8,856,625 B2 | 10/2014 | Miyashita | |
| 2007/0036001 A1* | 2/2007 | Kanda | G11C 16/12 |
| | | | 365/185.18 |
| 2009/0052255 A1* | 2/2009 | Moon | G11C 16/10 |
| | | | 365/185.19 |
| 2009/0319840 A1 | 12/2009 | Hara et al. | |
| 2010/0275076 A1 | 10/2010 | Maehara | |
| 2013/0194872 A1* | 8/2013 | Sim | G11C 16/26 |
| | | | 365/185.17 |

\* cited by examiner

FIG. 13
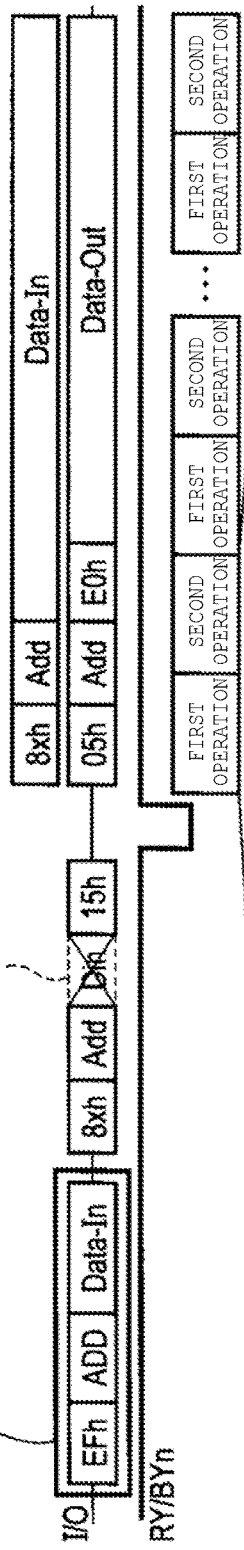
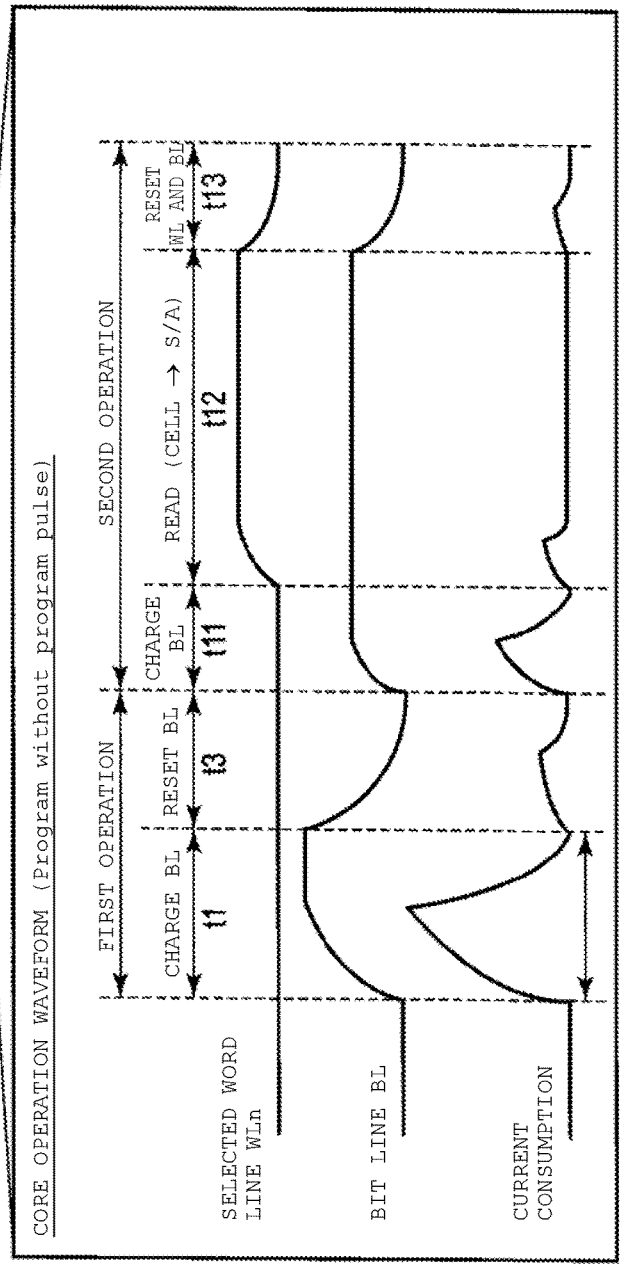

FIG. 26

MODE SET by Set feature

| Item | Description |
|---|---|
| XNOR | 0:disable  1:enable |
| EACH State | 0:disable  1:enable |
| Start and end col | 0:disable  1:enable |
| Read CYCLES | 1~15 |
| VCG step | 0:small step  1:large step |
| TEMPCODE Update Option | 0: EACH Level<br>1: ONLY IN INITIAL STAGE ONCE |

NON-VOLATILE SEMICONDUCTOR STORAGE DEVICE WITH TWO WRITE MODES

CROSS-REFERENCE TO RELATED APPLICATION

This application is based upon and claims the benefit of priority from. Japanese Patent Application No. 2017-044919, filed Mar. 9, 2017, the entire contents of which are incorporated herein by reference.

FIELD

Embodiments described herein relate generally to a non-volatile semiconductor storage device.

BACKGROUND

In recent years, a technology for improving reliability in a non-volatile semiconductor storage device, such as a NAND flash memory, is needed.

DESCRIPTION OF THE DRAWINGS

FIG. 13 is a diagram showing the relationship between a core operation waveform and a write operation, in which the application of the program pulse is skipped and a program data pattern is automatically generated, and which is performed by the non-volatile semiconductor storage device of the first embodiment.

FIG. 26 is a diagram showing a plurality of operation modes supported by the non-volatile semiconductor storage device of the second embodiment.

DETAILED DESCRIPTION

Figure 1:
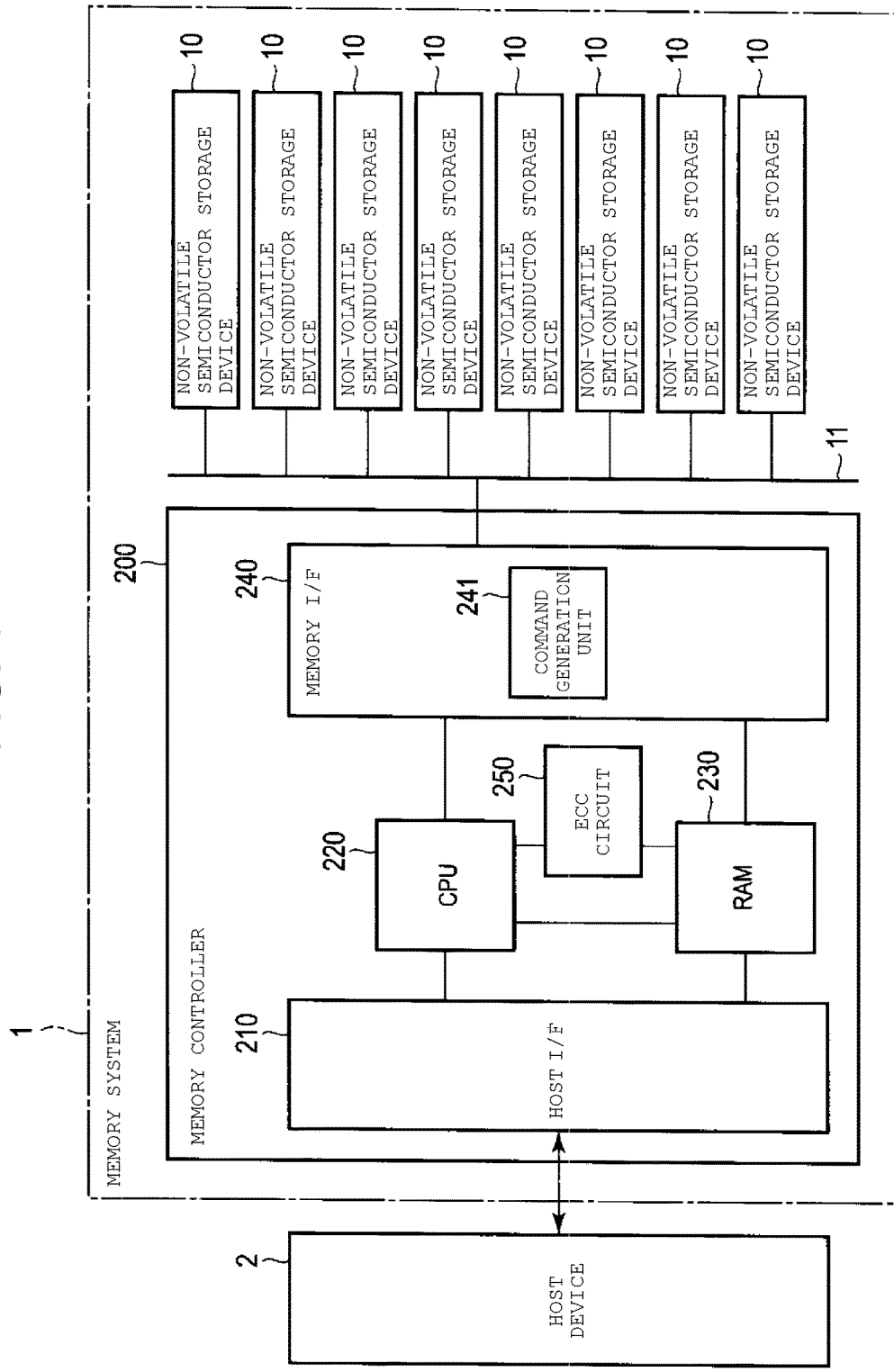
FIG. 1 is a block diagram showing a configuration example of a memory system including a non-volatile semiconductor storage device of a first embodiment.

Embodiments provide a non-volatile semiconductor storage device capable of improving reliability.

In general, according to one embodiment, a non-volatile semiconductor storage device includes a memory cell array including a plurality of non-volatile memory cells that are connected to a plurality of bit lines and a plurality of word lines, and a control circuit configured to control a data write operation for the memory cell array in one of first and second write modes in response to a write command sequence. In the first write mode, the control circuit performs a first write operation, which includes an operation in which one or more bit lines of the plurality of bit lines are charged according to write data and an operation in which a write voltage is applied to a selected word line of the plurality of word lines according to address data included in the write command sequence. In the second write mode, the control circuit performs a second write operation, which includes the operation in which the one or more bit lines are charged according to the write data and does not include the operation in which the write voltage is applied to the selected word line.

In general, according to another embodiment, a non-volatile semiconductor storage device includes a memory cell array that includes a plurality of non-volatile memory cells that are connected to a plurality of bit lines and a plurality of word lines, and a control circuit configured to write m (m is an integer of 2 or more) pages of data in a first non-volatile memory cell group connected to a selected word line of the plurality of word lines, by setting the non-volatile memory cells of the first non-volatile memory cell group to be in any one of $2^m$ states of threshold voltage levels that are different from one another. In response to a first command, the control circuit applies a first read voltage corresponding to a first state of the $2^m$ states to the selected word line, and reads first data from the non-volatile memory cells of the first non-volatile memory cell group, applies a second read voltage corresponding to a second state of which a threshold voltage level is higher than that of the first state, to the selected word line, and reads second data from the non-volatile memory cells of the first non-volatile memory cell group, applies a third read voltage which corresponds to the first state and is higher than the first read voltage to the selected word line, and reads third data from the non-volatile memory cells of the first non-volatile memory cell group, applies a fourth read voltage which corresponds to the second state and is higher than the second read voltage to the selected word line, and reads fourth data from the non-volatile memory cells of the first non-volatile memory cell group, and counts a first number of turned-on non-volatile memory cells that changed based on the first data and the third data and counts a second number of turned-on non-volatile memory cells that changed based on the second and the fourth data. The selected word line and the plurality of bit lines are discharged to a reference voltage and voltages of the plurality of bit lines are raised to a pre-charge voltage from the reference voltage during a transition from the read operation of the second data to the read operation of the third data.

Hereinafter, an embodiment will be described with reference to the drawings.

First Embodiment

Initially, a configuration of a memory system including non-volatile semiconductor storage devices according to a first embodiment will be described with reference to FIG. 1.

FIG. 1 shows a memory system 1 including a memory controller 200 and a non-volatile semiconductor storage devices 10 of the first embodiment. The memory system 1 may function as a storage device configured to write data in the non-volatile semiconductor storage device 10 and read data from the non-volatile semiconductor storage device 10 based on an instruction from a host device 2. For example, the example of the memory system 1 includes, but not limited to, a solid-state drive (SSD), a universal flash storage (UFS) device, a memory card, and a USB memory. An example of the host device 2 includes, but not limited to, a server, a computing device such as a personal computer, and a portable device such as a mobile phone or a smartphone.

In FIG. 1, an example in which eight non-volatile semiconductor storage devices 10 are provided in the memory system 1 is illustrated. Each non-volatile semiconductor storage device 10 is a non-volatile memory, and is, for example, a NAND flash memory.

The memory controller 200 receives various requests such as I/O requests (e.g., read request and write request) from the host device 2, and controls the non-volatile semiconductor storage devices 10 based on the received requests. Specifically, the memory controller 200 writes data in the non-volatile semiconductor storage device 10 according to the write request from the host device 2, reads data from the non-volatile semiconductor storage device 10 according to the read request from the host device 2, and transmits the read data to the host device 2.

The memory controller 200 includes a host interface 210, a processor (CPU) 220, a RAM 230, a memory interface 240, and an ECC circuit 250.

The host interface 210 is connected to the host device 2 via a communication interface. For example, PCI Express (PCIe), Serial Advanced Technology Attachment (SATA), Universal Serial Bus (USB), Serial Attached SCSI (SAS), Mobile Industry Processor Interface (MIPI), or UniPro may be used as a standard of the communication interface.

The processor (CPU) 220 controls the host interface 210, the memory interface 240, and the ECC circuit 250 by executing firmware (program) stored in a ROM (not shown).

The RAM 230 is a random-access memory that temporarily stores write data or read data. The memory interface 240 controls the non-volatile semiconductor storage devices 10 according to the control of the processor (CPU) 220.

The memory interface 240 includes a command generation unit 241. The command generation unit 241 generates various commands to be transmitted to the non-volatile semiconductor storage devices 10 according to the control of the processor (CPU) 220. The ECC circuit 250 includes an ECC encoder and an ECC decoder. The ECC encoder encodes write data, and generates memory write data including user data and an error-correcting code (ECC). The ECC decoder decodes memory read data including user data and an error-correcting code (ECC), and corrects an error of user data.

The memory interface 240 is connected to the plurality of non-volatile semiconductor storage devices 10 via a memory bus 11. A chip enable signal CEn, a command latch enable signal CLE, an address latch enable signal ALE, a write enable signal WEn, a read enable signal REn, a write protect signal WPn, a ready/busy signal RY/BYn, I/O signals DQ0 to DQ7 and DQn0 to DQn7, and data strobe signals DQS and DQSn may be used in communication between the memory interface 240 and the non-volatile semiconductor storage devices 10. In this example, "n" at a tail of a name of the signal means that this signal is a negative logic signal. An I/O bus and a plurality of control signal lines for delivering the I/O signals DQ0 to DQ7 and DQn0 to DQn7 are provided in the memory bus 11. These control signal lines are used for delivering the signals CEn, CLE, ALE, WEn, REn, WPn, and RY/BYn.

The chip enable signal CEn is a signal for selecting the non-volatile semiconductor storage device (in this example, NAND flash memory) 10. The command latch enable signal CLE is a signal for notifying the non-volatile semiconductor storage device 10 that the I/O signals DQ0 to DQ7 and DQn0 to DQn7 flowing to the non-volatile semiconductor storage device 10 in parallel with the signal CLE are commands. The address latch enable signal ALE is a signal for notifying the non-volatile semiconductor storage device 10 that the I/O signals DQ0 to DQ7 and DQn0 to DQn7 flowing to the non-volatile semiconductor storage device 10 in parallel with the asserted signal ALE are addresses. The write enable signal WEn is a signal for instructing the non-volatile semiconductor storage device 10 to receive the I/O signals DQ0 to DQ7 and DQn0 to DQn7 flowing to the non-volatile semiconductor storage device 10 in parallel with the asserted signal WEn. The read enable signal REn is a signal for instructing the non-volatile semiconductor storage device 10 to output the I/O signals DQ0 to DQ7 and DQn0 to DQn7. The write protect signal WPn is a signal for instructing the non-volatile semiconductor storage device 10 to prohibit data write and erase. The ready/busy signal RY/BYn is a signal indicating whether the non-volatile semiconductor storage device 10 is in a ready state and a busy state. The non-volatile semiconductor storage device 10 is capable of receiving a command from the memory controller 200 in the ready state, and is not capable of receiving a command from the memory controller 200 in the busy state.

For example, the I/O signals DQ0 to DQ7 and DQn0 to DQn7 are differential signal pairs each having an 8-bit width. The I/O signals DQ0 to DQ7 and DQn0 to DQn7 are used for transmitting a command, an address, and data from the memory controller 200 to the non-volatile semiconductor storage device 10 and transmitting data and a status from the non-volatile semiconductor storage device 10 to the memory controller 200. The data strobe signals DQS and DQSn indicating input and output timings of the I/O signals DQ0 to DQ7 and DQn0 to DQn7.

The memory controller 200 has a test function for checking a state of the overall transmission path including a data path and the memory bus 11 within each non-volatile semiconductor storage device 10. The test function also includes a training function of measuring a difference between data output timings between the non-volatile semiconductor storage devices 10 to adjust input and output timings of various signals.

Figure 2:
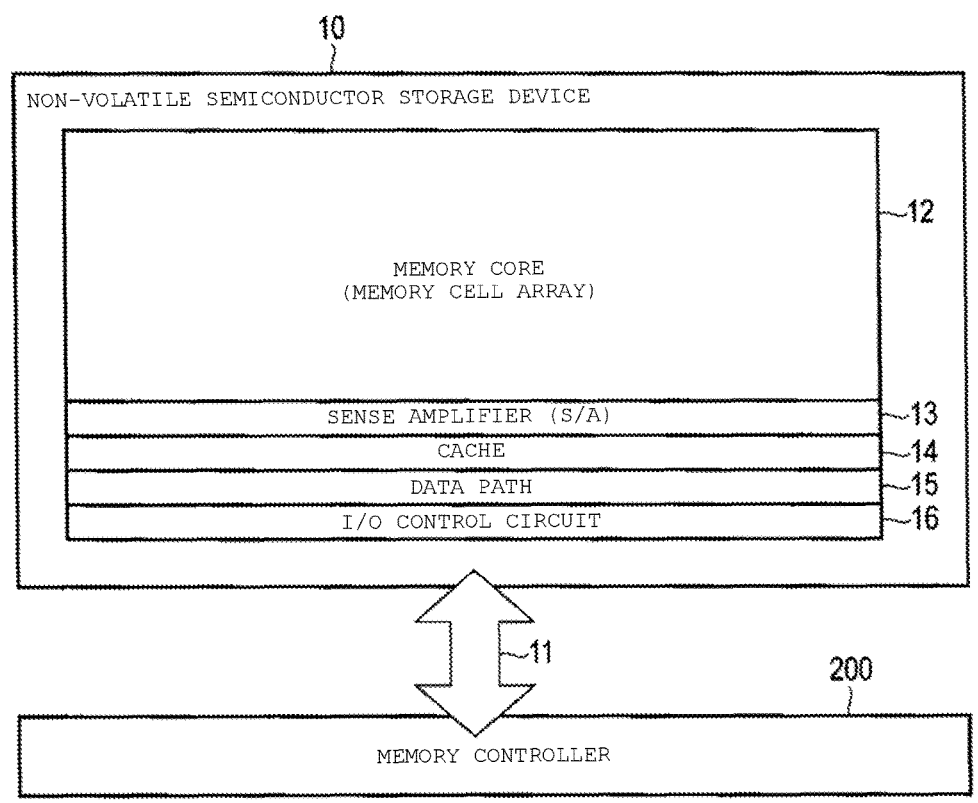
FIG. 2 is a block diagram showing the relationship between a memory controller and the non-volatile semiconductor storage device of the first embodiment.

FIG. 2 shows the relationship between one non-volatile semiconductor storage device 10 and the memory controller 200.

The non-volatile semiconductor storage device 10 includes a memory core (which is a memory cell array) 12, a sense amplifier (S/A) 13, a cache 14, a data path 15, and an I/O control circuit 16. The memory core 12 includes a plurality of non-volatile memory cells (hereinafter, referred to simply as a memory cell). The memory cell array includes a plurality of blocks. The block is a unit of an erasing operation. Each block includes a plurality of pages. One page includes a plurality of memory cells connected to the same word line.

The memory write data is sent to the sense amplifier (S/A) 13 via the I/O control circuit 16, the data path 15, and the cache 14, and is written in a memory cell group within the memory cell array 12. The data path 15 is an internal wiring provided between the I/O control circuit 16 and the cache 14, and is used for transmitting memory write data/memory read data. Hereinafter, the memory write data and the memory read data are simply referred to as write data/read data.

Figure 3:
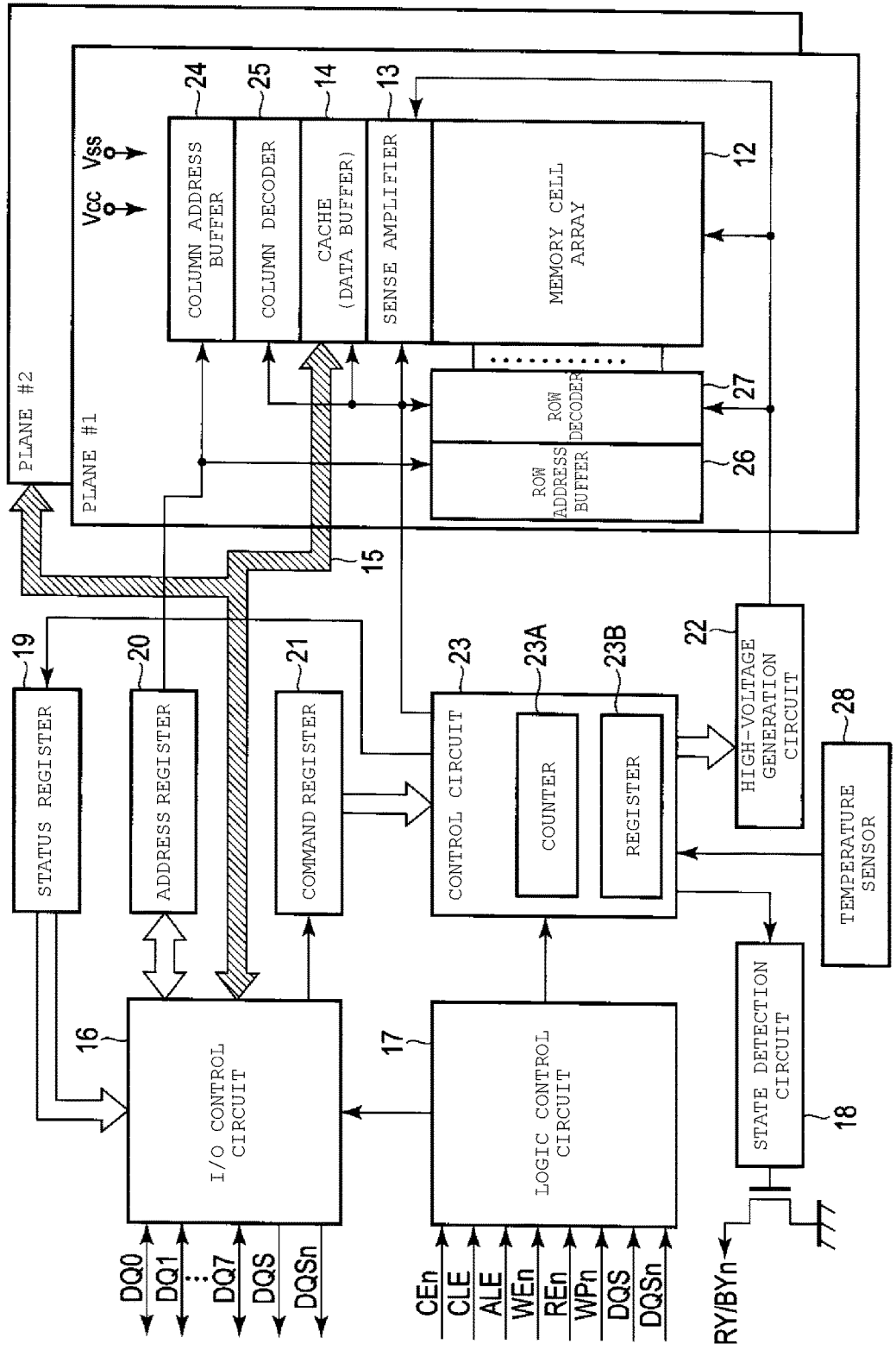
FIG. 3 is a block diagram showing a configuration example of the non-volatile semiconductor storage device of the first embodiment.

FIG. 3 shows a configuration example of the non-volatile semiconductor storage device 10. Hereinafter, it is assumed that the non-volatile semiconductor storage device 10 is the NAND flash memory.

A NAND flash memory chip includes the memory cell array 12, the sense amplifier 13, the cache 14, the data path 15, the I/O control circuit 16, a logic control circuit 17, a state detection circuit 18, a status register 19, an address register 20, a command register 21, a high-voltage generation circuit 22, a control circuit 23, a column address buffer 24, a column decoder 25, a row address buffer 26, a row decoder 27, and a temperature sensor 28.

The I/O control circuit 16 receives the I/O signals DQ0 to DQ7 and DQn0 to DQn7 from memory controller 200, and transmits the I/O signals DQ0 to DQ7 and DQn0 to DQn7 to the memory controller 200. The commands received by the I/O signals DQ0 to DQ7 and DQn0 to DQn7 are stored in the command register 21. The addresses received by the I/O signals DQ0 to DQ7 and DQn0 to DQn7 are stored in the address register 20. When the data or the status within the status register 19 is transmitted, the I/O control circuit 16 also transmits the data strobe signals DQS and DQSn.

The logic control circuit 17 receives various control signals from the memory controller 200, and controls the I/O control circuit 16 based on the control signal. The control signal includes the chip enable signal CEn, the command latch enable signal CLE, the address latch enable signal ALE, the write enable signal WEn, the read enable signal REn, the write protect signal WPn, and the data strobe signals DQS and DQSn.

The control circuit 23 functions as a sequencer configured to receive the command from the command register 21 and control the respective elements within the NAND flash memory chip based on the command. The control circuit 23 may perform various other functions in addition to the write/read/erasing operation. The control circuit 23 includes a counter 23A and a register 23B. The counter 23A is used for performing on-chip fail bit count (FBC) to be described below. The register 23B is an internal register for storing a fail bit count counted through the on-chip FBC. The details of the on-chip FBC will be described with reference to FIG. 18 and the subsequent diagrams.

The high-voltage generation circuit 22 receives a power supply voltage from the outside of the NAND flash memory chip, and generates various voltages from a power supply voltage. The generated voltages are supplied to the elements such as the memory cell array 12, the sense amplifier 13, and the row decoder 27.

The row decoder 27 receives a row address from the address register 20 via the row address buffer 26, and selects one word line within a certain block based on the row address signal. The sense amplifier 13 senses data items read into bit lines from the memory cell group connected to a selected word line when the data is read. When the data is written, the sense amplifier 13 outputs write data items to the bit lines. The read and write operations of data items for the memory cell array 12 are performed with the plurality of memory cells connected to the same word line as an operation unit, and the operation unit is the page.

The cache 14 is connected to the I/O control circuit 16 via the data path 15. The cache 14 includes multiple-stage data latches capable of storing write data items or read data items. The cache 14 stores write data from the I/O control circuit 16, and supplies the write data to the sense amplifier 13. The cache 14 receives read data from the sense amplifier 13, and sends the read data to the I/O control circuit 16 according to the control of the column decoder 25.

The NAND flash memory chip may be a multiplane configuration including a plurality of planes. When the NAND flash memory chip includes planes #1 and #2, each plane includes a memory cell array and a peripheral circuit thereof. For example, the peripheral circuit may include a row decoder, a row address buffer, a sense amplifier, a cache, a column decoder, and a column address buffer.

Figure 4:
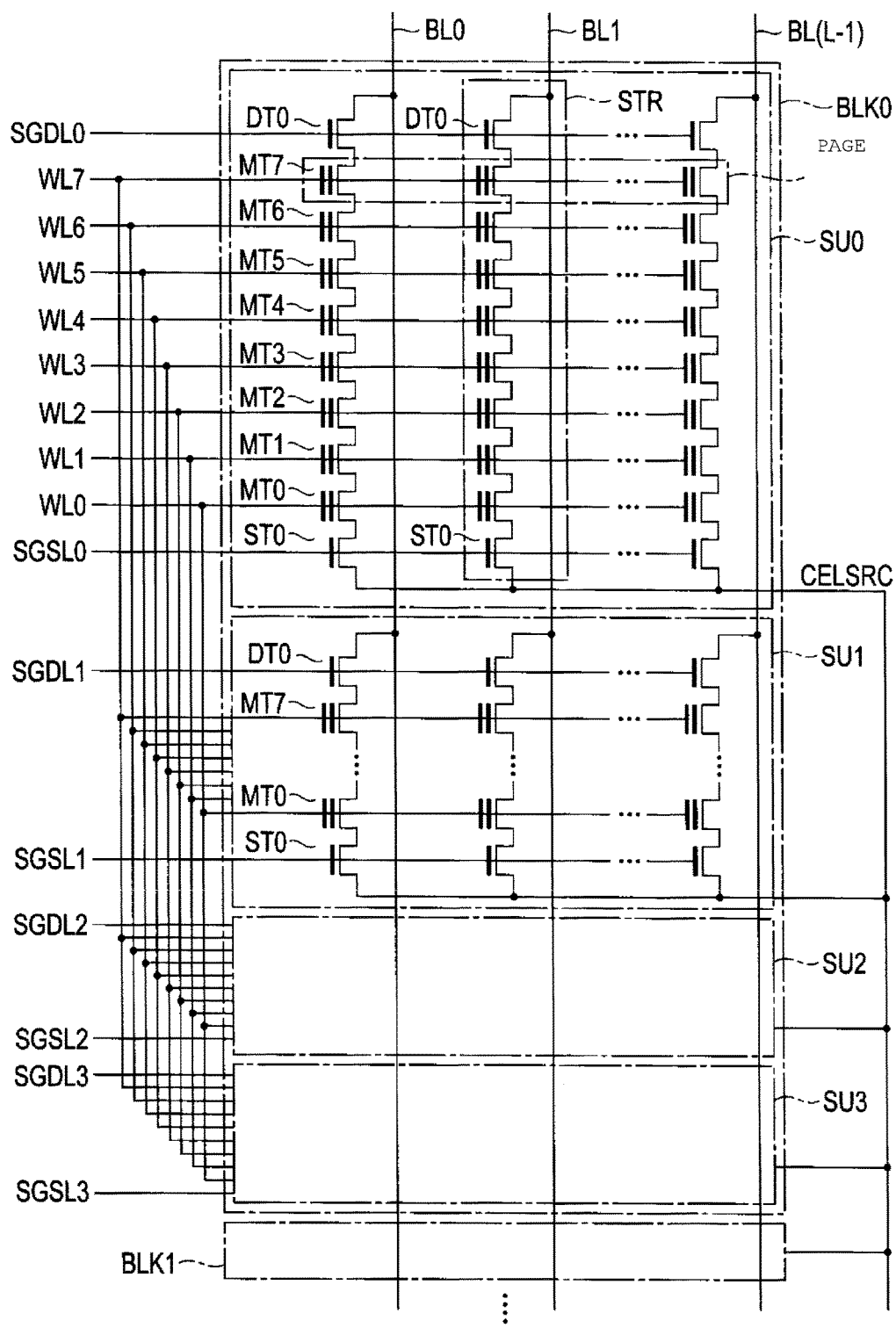
FIG. 4 is a diagram showing a part of a memory cell array provided in the non-volatile semiconductor storage device of the first embodiment.

FIG. 4 shows a configuration example of one of the plurality of blocks within the memory cell array 12.

One block BLK (in this example, BLK0) may include string units SU0 to SU3. The string units SU0 to SU3 have the same configuration, and thus, a configuration of the string unit SU0 will be described below.

The string unit SU0 is connected to a plurality of word lines WL0 to WL7 and a plurality of bit lines BL0 to BL (L-1). The string unit SU0 includes a plurality of NAND strings STR.

Each NAND string STR includes one select gate transistor ST0, a plurality (for example, eight) of memory cell transistors MT0 to MT7, and one select gate transistor DT0. The select gate transistor ST0, the memory cell transistors MT0 to MT7, and the select gate transistor DT0 are connected between a source line CELSRC and one bit line BL in series in this order. Each memory cell transistor MT functions as the memory cell. Each memory cell transistor MT includes a control gate and a charge storage layer. The control gates of the memory cell transistors MT0 to MT7 are respectively connected to the word lines WL0 to WL7. A gate of the select gate transistor ST0 is connected to a select gate line SGSL0. A gate of the select gate transistor DT0 is connected to a select gate line SGDL0.

In the string unit SU0, a group of memory cell transistors MT connected to the same word line WL is referred to as a page. The data write/read operation is performed in the unit of a page.

Figure 5:
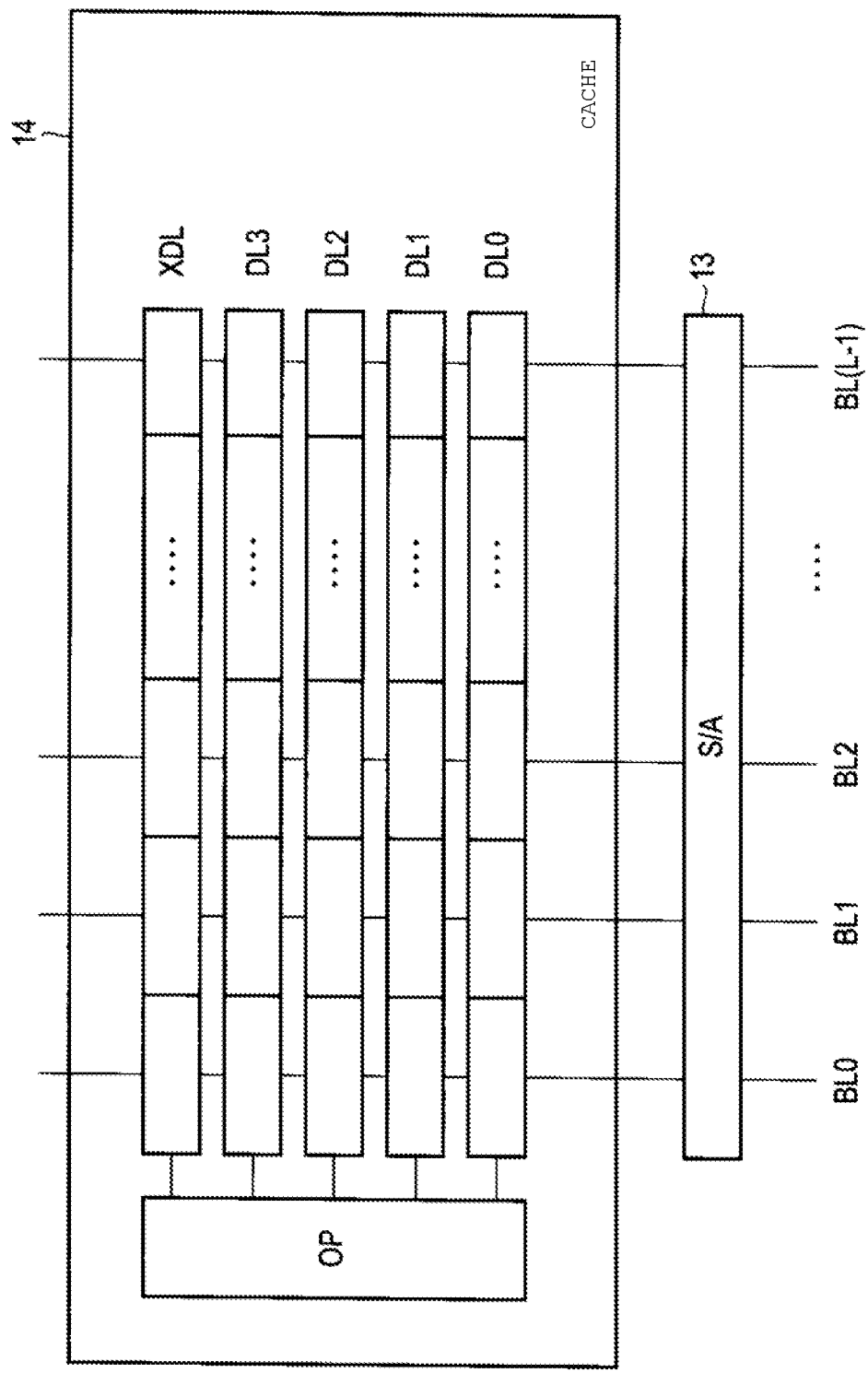
FIG. 5 is a block diagram showing a configuration example of a cache provided in the non-volatile semiconductor storage device of the first embodiment.

FIG. 5 shows a configuration example of the cache 14.

The cache 14 includes data latches DL0, DL1, DL2, DL3, and XDL, and an arithmetic operation circuit OP. Each of the data latches DL0, DL1, DL2, DL3, and XDL includes latch circuits corresponding to the number of bit lines BL0 to BL (L-1). The data latches DL0, DL1, DL2, and DL3 temporarily store read data from the sense amplifier (S/A) 13 or write data for the sense amplifier (S/A) 13. The XDL functions as a data latch (data cache) for an interface with the outside. The write data items from the memory controller 200 are transmitted to the data latches DL0, DL1, DL2, and DL3 or the sense amplifier (S/A) 13 via the XDL. The read data is output to the memory controller 200 via the XDL.

The arithmetic operation circuit OP performs various logic operations such as NOT operation, OR operation, AND operation, XOR operation, and XNOR operation based on the data items within the data latches DL0, DL1, DL2, DL3, and the XDL.

Figure 6:
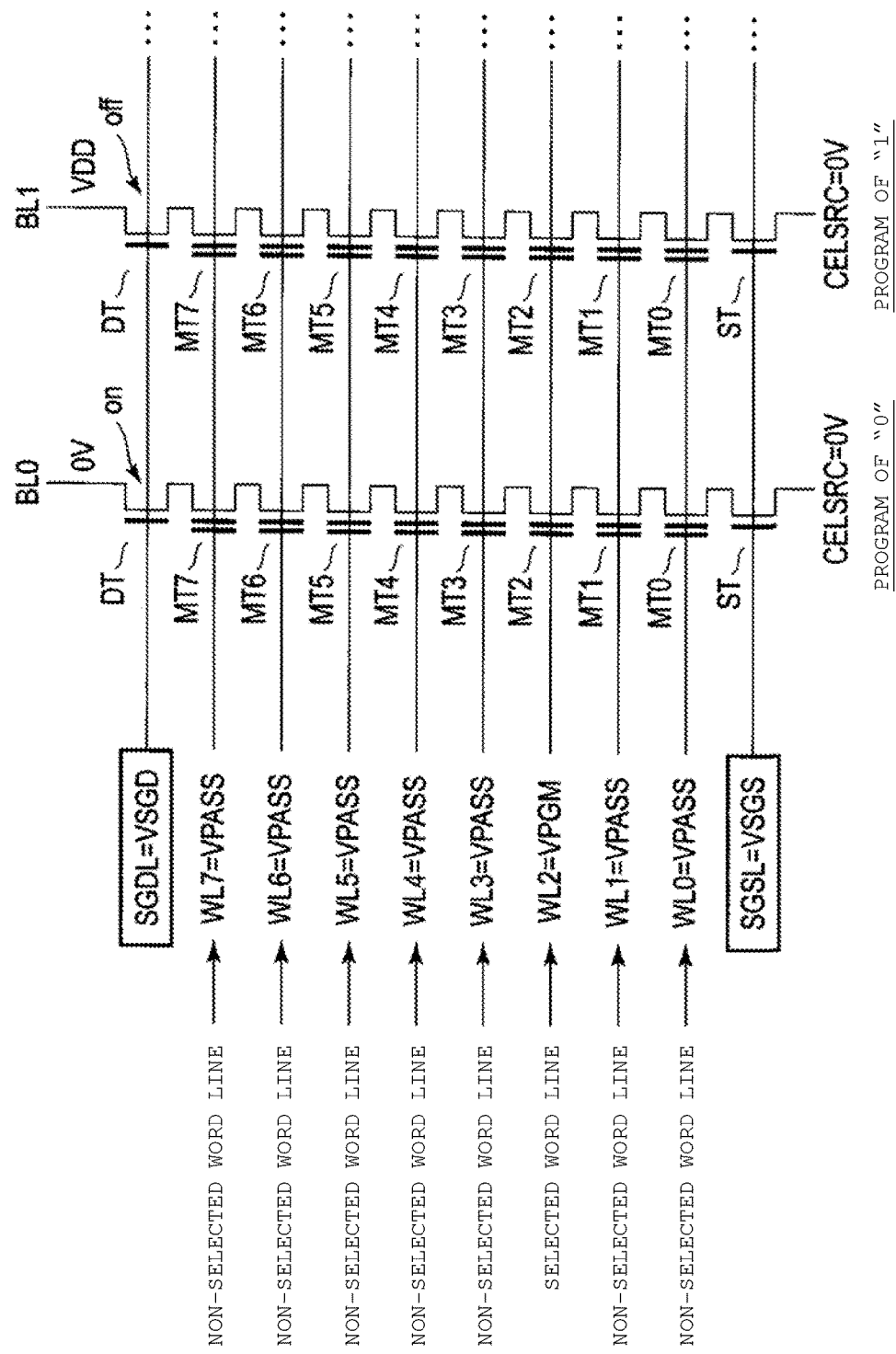
FIG. 6 is a diagram showing a write operation performed by the non-volatile semiconductor storage device of the first embodiment.

FIG. 6 shows the write operation.

The sense amplifier 13 applies 0V or a positive power supply voltage VDD to the bit line BL according to the write data. That is, when charges are injected into the charge storage layer of the memory cell transistor MT and a threshold voltage of the memory cell transistor MT is raised (program of "0"), the sense amplifier 13 applies, for example, 0V to the bit line BL. When the threshold voltage of the memory cell transistor MT is maintained at a threshold voltage level corresponding to an erase state (program of "1"), the sense amplifier 13 applies, for example, the positive power supply voltage VDD to the bit line BL.

For example, the row decoder 27 selects the word line WL2, applies a positive high voltage VPGM to the selected word line WL2, and applies a positive voltage VPASS to the other non-selected word lines WL0, WL1, and WL3 to WL7. The voltage VPGM is a program pulse for injecting charges into a charge storage layer of a memory cell transistor MT2 through FN tunneling. The VPASS is a voltage for turning on the non-selected memory cell transistors MT0, MT1, and MT3 to MT7 irrespective of the retention data items thereof, and VPGM>VPASS.

The row decoder 27 applies a positive voltage VSGD to the select gate line SGDL of the selected string unit SU, and applies VSGS to the select gate line SGSL.

As a result, the memory cell transistors MT0 to MT7 enter an ON state. The select transistor DT connected to the bit line BL to which 0V is applied enters an ON state, and the select transistor DT connected to the bit line BL to which VDD is applied enters a cut-off state. The select transistor ST enters an OFF state.

Accordingly, in the NAND string of which the select transistor DT is turned on, charges are injected into the charge storage layer of the memory cell transistor MT2 connected to the selected word line WL2, and the threshold voltage of the memory cell transistor MT2 is raised.

In the NAND string of which the select transistor DT is turned off, a channel of the memory cell transistor MT2 electrically floats, and a voltage thereof is raised to a voltage close to VPASS through coupling with the word line WL2. Asa result, in the memory cell transistor MT2, since a voltage difference between the control gate and the channel is small, the charges are not injected into the charge storage layer, and the threshold voltage of the memory cell transistor MT2 is maintained in a low threshold voltage level corresponding to the erase state.

Figure 7:
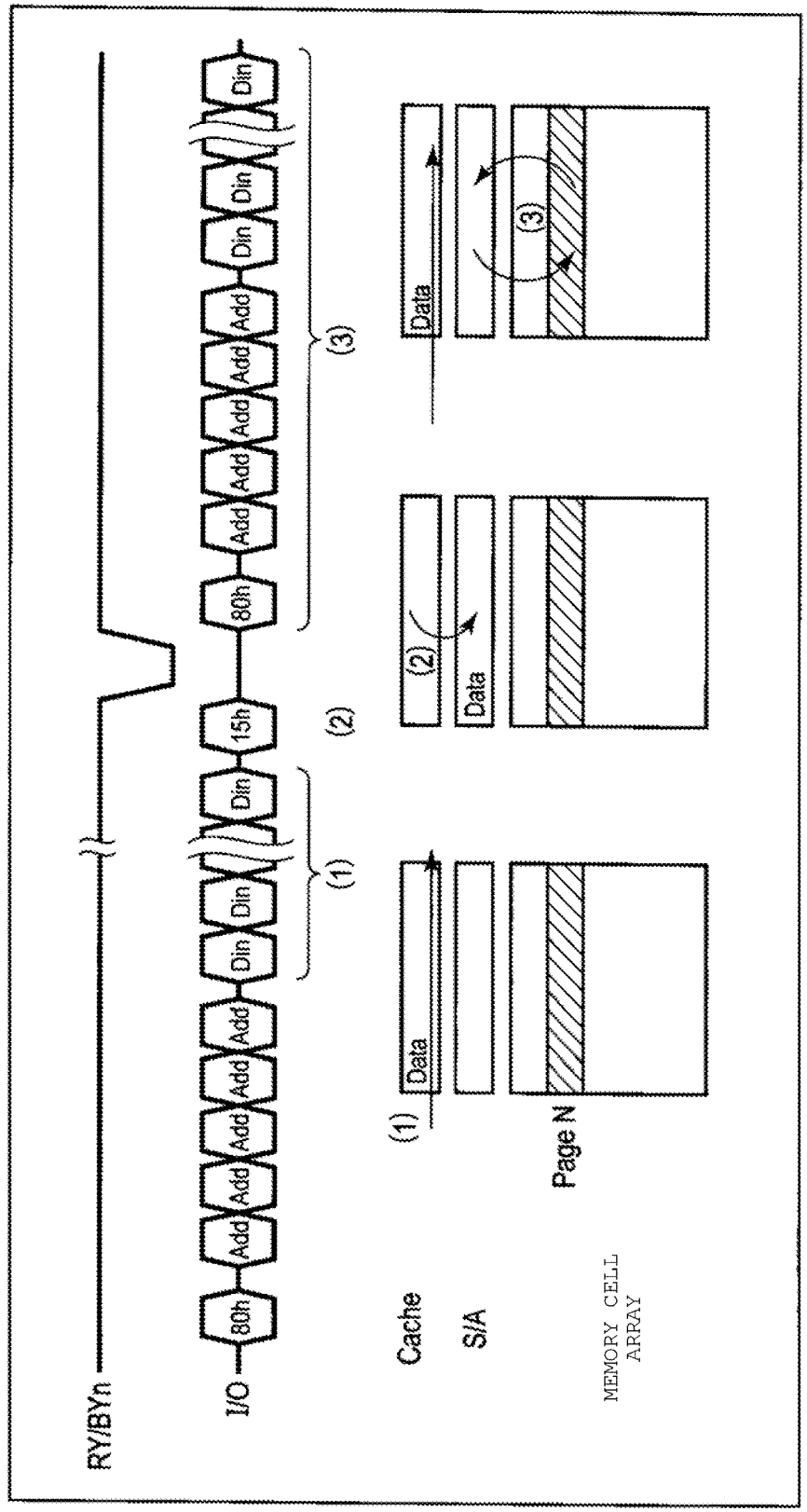
FIG. 7 is a diagram showing the relationship between a program command sequence and the write operation performed by the non-volatile semiconductor storage device of the first embodiment.

FIG. 7 shows the relationship between a program command sequence and a write operation (program operation) performed by the non-volatile semiconductor storage device (NAND flash memory) 10.

The memory controller 200 transmits the program command sequence (for example, command 80h, address Add, data Din, and command 15h) to the NAND flash memory 10 through the I/O signals DQ0 to DQ7 and DQn0 to DQn7. The command 80h is a command for serial input. The command 15h is one of several kinds of available program commands. When command 15h is received, the NAND flash memory 10 enters the busy state only for a period during which write data (Din) is transmitted from the cache 14 (XDL) to the sense amplifier 13 or another data latch, and enters the ready state in which a next command is able to be received after the write data is transmitted from the cache 14 (XDL) to the sense amplifier (S/A) 13 or another data latch. The command 81h for simultaneously writing data items in the plurality of planes may be used instead of command 80h.

(1) The write data (Din) to be input subsequent to command 80h is initially transmitted to the cache 14 (XDL) from the I/O control circuit 16 via the data path 15.

(2) When command 15h is received, the ready/busy signal RY/BYn is set to be in a low level by the state detection circuit (to indicate busy state). The write data (Din) is transmitted to another data latch or the sense amplifier (S/A) 13 from the cache 14 (XDL). When the transmission of the write data (Din) is completed, the ready/busy signal RY/BYn is returned to be in a high level (to indicate ready state).

(3) The program operation is started, and the data items are written in the memory cell group (page N) designated by the address (Add). A program verification operation for verifying whether or not the program operation succeeds is performed. The program and program verification operations are repeated until the program operation succeeds or the loop count of program and program verification operations reaches a set maximum loop count. When a next program command sequence (for example, command 80h, address Add, and data Din) is received from the memory controller 200 for a period during which the program and program verification operations are being performed, the write data (Din) is transmitted to the cache 14 (XDL) from the I/O control circuit 16.

Figure 8:
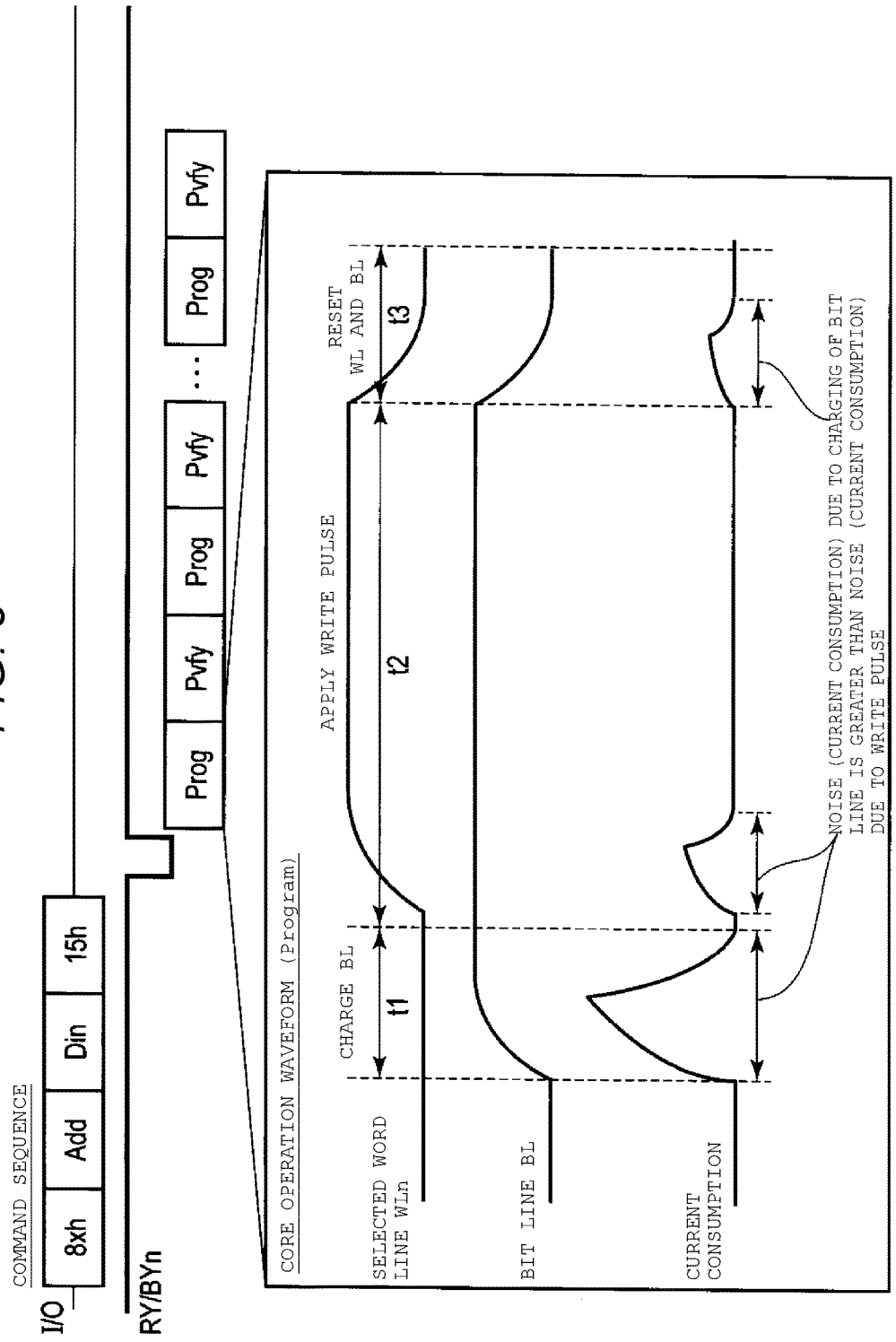
FIG. 8 is a diagram showing the relationship between a core operation waveform and the write operation performed by the non-volatile semiconductor storage device of the first embodiment.

FIG. 8 shows the relationship between a core operation waveform and the write operation performed by the NAND flash memory 10. In this example, the core operation waveform represents a voltage of the selected word line WLn and voltages of the bit lines BL0 to BL (L-1).

The memory controller 200 transmits a program command sequence (for example, command 8xh (80h or 81h), address Add, data Din, and command 15h) to the NAND flash memory 10 via the I/O signals DQ0 to DQ7 and DQn0 to DQn7.

In the NAND flash memory 10, the write data (Din) received from the memory controller 200 is transmitted to the cache 14 (XDL) from the I/O control circuit 16 via the data path 15. When the command 15h is received, the write data (Din) is transmitted to the sense amplifier (S/A) 13 from the cache 14 (XDL), and the write operation (program sequence) is started. The program sequence includes a program (Prog) operation and a program verification (Pvfy) operation. The program (Prog) operation and the program verification (Pvfy) operation are repeatedly performed.

The program operation includes a bit line charge period t1, a write pulse application period t2, and a word line/bit line reset period t3.

For the bit line charge period t1, the control circuit 23 charges the bit lines BL0 to BL (L-1) by controlling the sense amplifier (S/A) 13. The bit lines BL0 to BL (L-1) are charged according to the write data. That is, the bit line BL connected to the memory cell transistor MT in which data "1" is to be written (i.e., the memory cell transistor MT to be maintained in the erase state) is charged with the voltage VDD by the sense amplifier (S/A) 13. As a result, a current flows to this bit line BL. The bit line BL connected to the memory cell transistor MT in which data "0" is to be written (i.e., the memory cell transistor MT to transition to the program state from the erase state) is set to be 0V by the sense amplifier (S/A) 13. As a result, a current does not flow to this bit line BL.

For the write pulse application period t2, the control circuit 23 applies a write pulse (program pulse) to the selected word line WLn by controlling the row decoder 27, and sets the selected word line WLn to be the voltage VPGM. The control circuit 23 applies the voltage VPASS to each non-selected word line by controlling the row decoder 27. In general, the write pulse application period t2 is much longer than the bit line charge period t1.

For the word line/bit line reset period t3, the control circuit 23 discharges the bit lines BL0 to BL (L-1) by controlling the sense amplifier (S/A) 13, and discharges the word lines WL0 to WL8 by controlling the row decoder 27. Accordingly, the bit lines BL0 to BL (L-1) are returned to 0V, and the word lines WL0 to WL8 are returned to 0V.

For the core operation period during which the data is written in the memory cell array 12, much noise is generated from current consumption when charging the bit lines BL0 to BL (L-1). The amount of noise due to the charging of the bit lines BL0 to BL (L-1) is greater than the amount of noise due to the application of the write pulse.

For a period during which a large amount of noise is generated, data transmission using the data path 15 or data transmission using the memory bus 11 may be influenced. Accordingly, a case where a large amount of noise is generated in the NAND flash memory 10 is useful in testing the reliability of the NAND flash memory 10. For example, a test operation for checking the state of the overall transmission path may be performed while the data write operation is actually performed. Accordingly, it is possible to check the state of the overall transmission path in a state in which the influence of the noise is considered.

Figure 9:
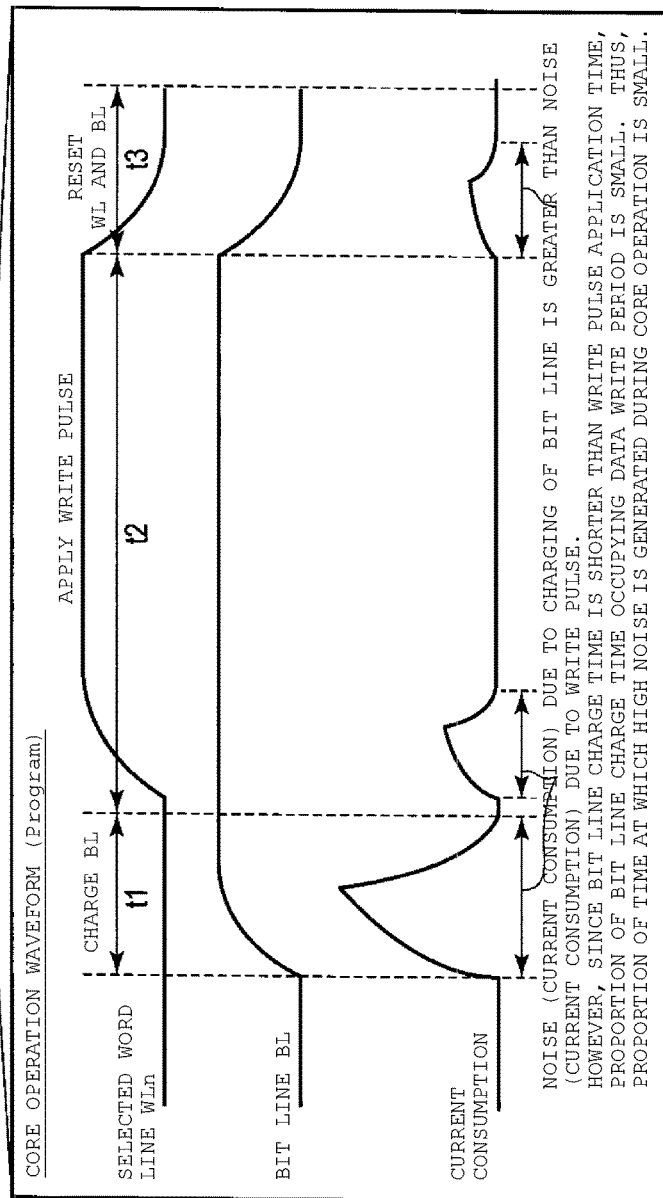
FIG. 9 is a diagram showing the relationship between the write operation and a data input and output operation capable of being performed for a period of the write operation.

FIG. 9 shows the relationship between the write operation and a data input and output operation capable of being performed for the period of the write operation.

As stated above, in a case where the write operation is performed using the command 15h, the NAND flash memory 10 may receive a next command from the memory controller 200 during the write operation. Accordingly, the NAND flash memory 10 may transmit the data received from the memory controller 200 to the cache 14 (XDL) and may transmit data to the memory controller 200 from the cache 14 (XDL) while performing the write operation (program sequence).

In FIG. 9, the memory controller 200 initially transmits a program command sequence (for example, command 8xh, address Add, data Din, and command 15h) to the NAND flash memory 10. The memory controller 200 monitors the ready/busy signal RY/BYn, and waits until the NAND flash memory 10 is returned to the ready state from the busy state.

In the NAND flash memory 10, the write data (Din) received from the memory controller 200 is transmitted to the cache 14 (XDL) from the I/O control circuit 16 via the data path 15. When the command 15h is received, the write data (Din) is transmitted to the sense amplifier (S/A) 13 from the cache 14 (XDL). When the transmission of the write data (Din) to the sense amplifier (S/A) 13 is completed, the ready/busy signal RY/BYn is returned to be in a high level, and the write operation (program sequence) is started. During the write operation, the program (Prog) and program verification (Pvfy) operations are repeatedly performed.

When a command sequence (for example, command 8xh, address Add, and data Data-In) is received from the memory controller 200 during the write operation, new data (Data-In) is transmitted from the I/O control circuit 16 to the cache 14 (XDL) via the data path 15. When a command sequence (for example, command 05h, address Add, and command E0h) is received from the memory controller 200, data designated by the address Add is read from the cache 14 (XDL), and the data is transmitted to the memory controller 200 via the data path 15 and the I/O control circuit 16.

Through the above-described operations, it is possible to input and output the data between the memory controller 200 and the cache 14 (XDL) while performing the data write operation. For example, the memory controller 200 may prepare test data, may input the data to the NAND flash memory 10 by using the command sequence (for example, command 8xh, address Add, and data Data-In), and may output the data to the NAND flash memory 10 by using the command sequence (for example, command 05h, address Add, and command E0h). In this case, the memory controller 200 may check whether or not the data transmission between the memory controller 200 and the cache 14 (XDL) of the NAND flash memory 10 is able to be correctly performed by comparing the data output from the NAND flash memory 10 with the test data. As stated above, it is possible to perform the test operation for checking the state of the transmission path while performing the data write operation. The example of the test operation is not limited to the above-described example.

As mentioned above, the amount of noise caused by charging the bit line is greater than the amount of noise caused by applying the write pulse. That is, a high noise is generated for the bit line charge period t1.

However, the write pulse application period t2 is much longer than the bit line charge period t1. Accordingly, a proportion of the bit line charge period t1 occupying the overall period of the write operation during which the program and program verification operations are repeated is low. As a result, since the high noise is not generated during long time intervals, a frequency at which the high noise is generated during the core operation is low.

In the present embodiment, in order to increase the occurrence frequency of the high noise during the core operation without stressing the memory cell transistors MT, the NAND flash memory 10 has a special write mode called a "program pulse skip" mode. The "program pulse skip" mode is a write mode in which an operation for applying the program pulse to the selected word line is skipped. In the "program pulse skip" mode, the control circuit 23 performs the write operation which includes an operation for charging the bit lines BL0 to BL (L-1) according to the write data and does not include an operation for applying the program pulse to the selected word line WLn.

The memory controller 200 may instruct the NAND flash memory 10 to enable a "program pulse skip" function. For example, the memory controller 200 may enable the "program pulse skip" function by transmitting a set feature command sequence (command EFh, address ADD, and data Data-In) to the NAND flash memory 10.

In this example, the command EFh is a command used for setting an additional function supported by the NAND flash memory 10. The address ADD subsequent to the command EFh is used for designating the additional function. Data Data-In subsequent to the command EFh and the address ADD is used for designating the enabling/disabling of the additional function.

Figure 10:
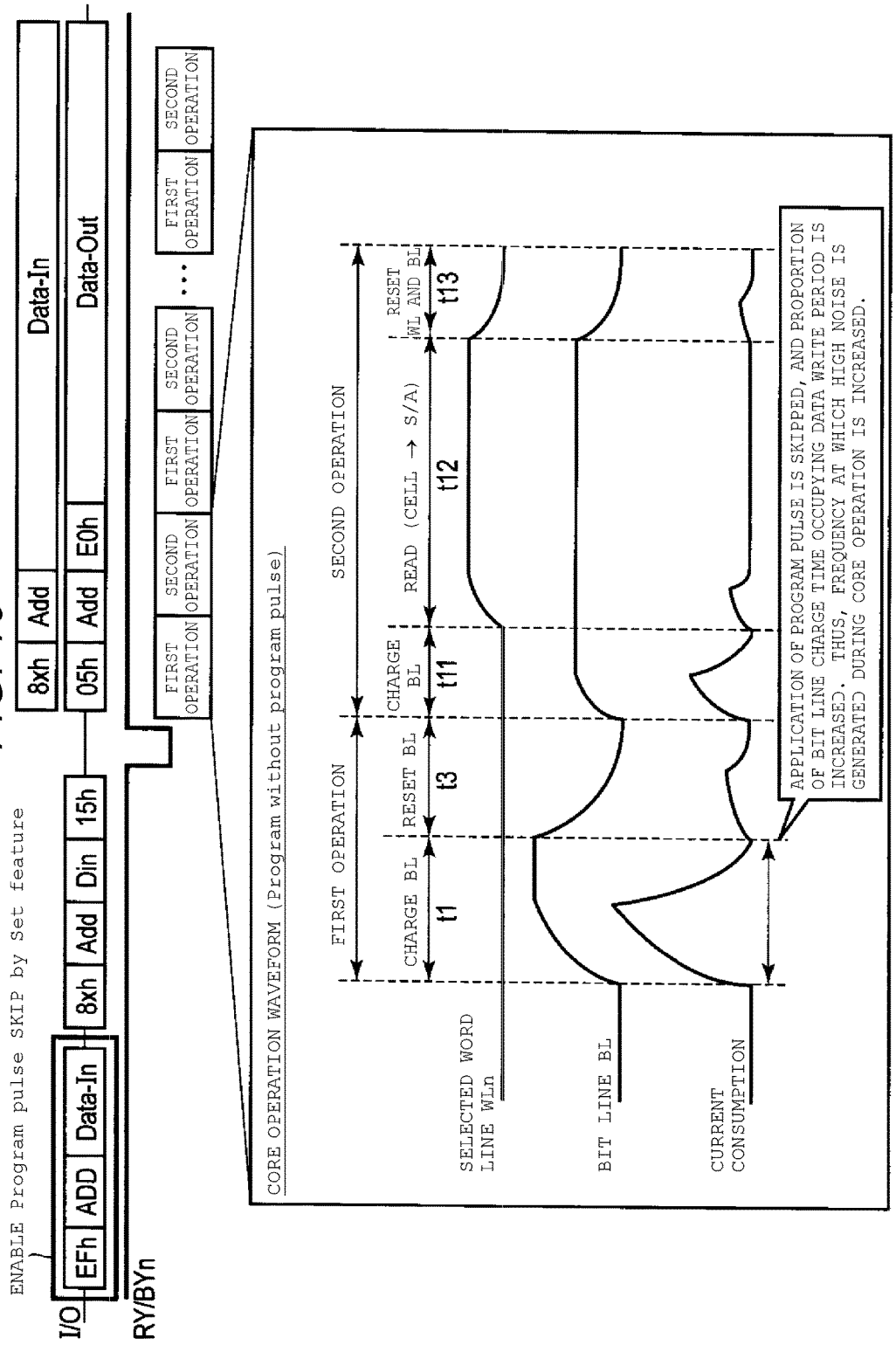
FIG. 10 is a diagram showing the relationship between a core operation waveform and a write operation, in which the application of a program pulse is skipped, and which is performed by the non-volatile semiconductor storage device of the first embodiment.

FIG. 10 shows the relationship between the "program pulse skip" mode and the core operation waveform.

The memory controller 200 initially transmits a set feature command sequence (command EFh, address ADD, and data Data-In) to the NAND flash memory 10 in order to enable the "program pulse skip" function. Subsequently, the memory controller 200 transmits a program command sequence (for example, command 8xh, address Add, data Din, and command 15h) to the NAND flash memory 10. The memory controller 200 monitors the ready/busy signal RY/BYn, and waits until the NAND flash memory 10 is returned to the ready state from the busy state. When the NAND flash memory 10 is returned to be in the ready state, the memory controller 200 transmits the command sequence (for example, command 8xh, address Add, and data Data-In) or the command sequence (for example, command 05h, address Add, and command E0h) to the NAND flash memory 10.

In the NAND flash memory 10, the "program pulse skip" function is enabled according to the set feature command sequence. The write data (Din) received from the memory controller 200 is transmitted to the cache 14 (XDL) from the I/O control circuit 16 via the data path 15. When the command 15h is received, the write data (Din) is transmitted to the sense amplifier (S/A) 13 from the cache 14 (XDL). When the transmission of the write data (Din) to the sense amplifier (S/A) 13 is completed, the ready/busy signal RY/BYn is returned to be in a high level, and the write operation is started in the "program pulse skip" mode.

A first operation and a second operation are repeatedly performed in the write operation in the "program pulse skip" mode. In this case, the first operation includes only the bit line charge period t1 and the word line/bit line reset period t3, and does not include the write pulse application period t2.

In the bit line charge period t1, the control circuit 23 charges the bit lines BL0 to BL (L-1) by controlling the sense amplifier (S/A) 13. The bit lines BL0 to BL (L-1) are charged according to the write data. When the charging of the bit line is completed, the write pulse application period t2 is skipped, and the discharging of the bit lines BL0 to BL (L-1) is immediately started (period t3).

As a result, it is possible to increase a proportion of the bit line charge period t1 occupying the overall period of the write operation during which the first operation and the second operation are repeated. Thus, a time interval between a certain bit line charge period t1 and a next bit line charge period t1 is shorter, and the high noise is generated at a higher frequency.

The second operation is an operation performed after the first operation in which the data is not actually programmed, and corresponds to one kind of program verification (Pvfy) operation. The second operation includes a bit line charge period t11, a read period t12, and a word line/bit line reset period t13.

For the bit line charge period t11, all the bit lines BL0 to BL (L-1) are charged and are set to be a certain pre-charge voltage (<VDD). For the read period t12, the control circuit 23 applies a predetermined read voltage to the selected word line WLn by controlling the row decoder 27, and applies a voltage Vread to each non-selected word line. The read voltage is a voltage determined according to a distribution of the threshold voltage of the memory cell transistor MT. The voltage Vread is a voltage for turning on the memory cell transistor MT irrespective of the data stored in the memory cell transistor MT. The data items read into the BL0 to BL (L-1) from the memory cell transistors MT connected to the selected word line WLn are sensed by the sense amplifier 13. For the word line/bit line reset period t13, the bit lines BL0 to BL (L-1) and the word lines WL0 to WL7 are discharged.

As stated above, in the write operation in the "program pulse skip" mode, since the write pulse (program pulse) is not applied to the selected word line WLn, it is possible to generate the high noise during the core operation (in particular, during the operation in which the bit lines BL0 to BL (L-1) are charged according to the write data) without stressing the memory cell transistors MT connected to the selected word line WLn.

Figure 11:
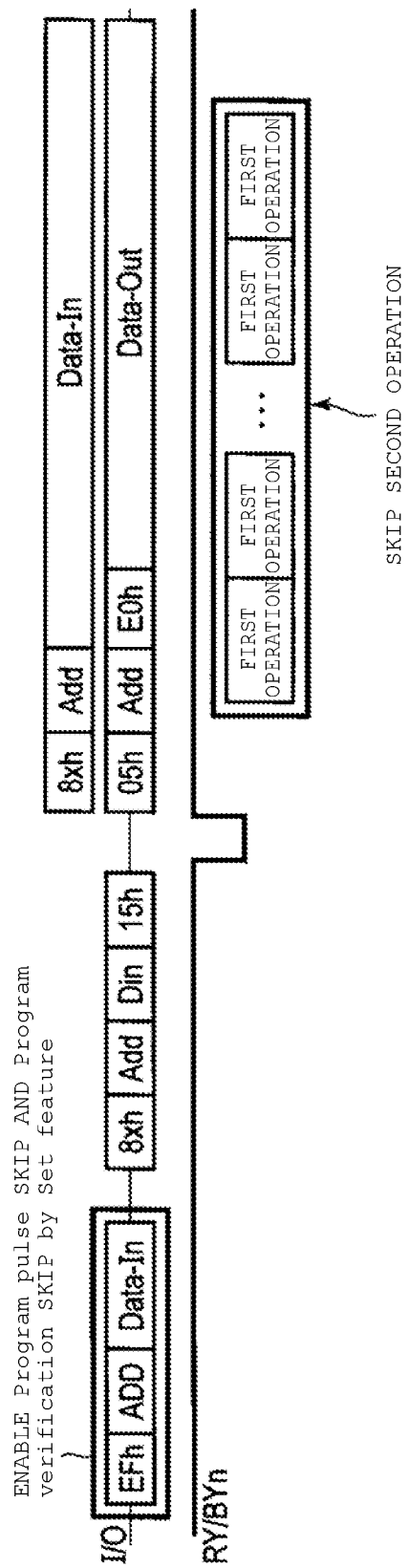
FIG. 11 is a diagram showing a write operation, in which both the application of a program pulse and the program verification are skipped, and which is performed by the non-volatile semiconductor storage device of the first embodiment.

FIG. 11 shows a write operation in which both the application of the program pulse and the second operation are skipped.

In the present embodiment, in order to further increase the occurrence frequency of the high noise, the NAND flash memory 10 also has the "program verification skip" function in addition to the "program pulse skip" function. When both the "program pulse skip" function and the "program verification skip" function are enabled, the operation in which the write pulse (program pulse) is applied is omitted, and the second operation is also omitted.

The memory controller 200 may instruct the NAND flash memory 10 to enable the "program pulse skip" function and the "program verification skip" function. For example, the memory controller 200 may enable the "program pulse skip" function and the "program verification skip" function by transmitting a set feature command sequence (command EFh, address ADD, and data Data-In) to the NAND flash memory 10. The memory controller 200 may transmit a set feature command sequence for enabling the "program pulse skip" function and a set feature command sequence for enabling the "program verification skip" function to the NAND flash memory 10.

When both the "program pulse skip" function and the "program verification skip" function are enabled, only the first operation is repeatedly performed in the write operation (such mode of operation being referred to as "program pulse skip+program verification skip" mode). The loop count of first operations may be set by the set feature command sequence. In each first operation, the operation in which the write pulse (program pulse) is applied is omitted.

Figure 12:
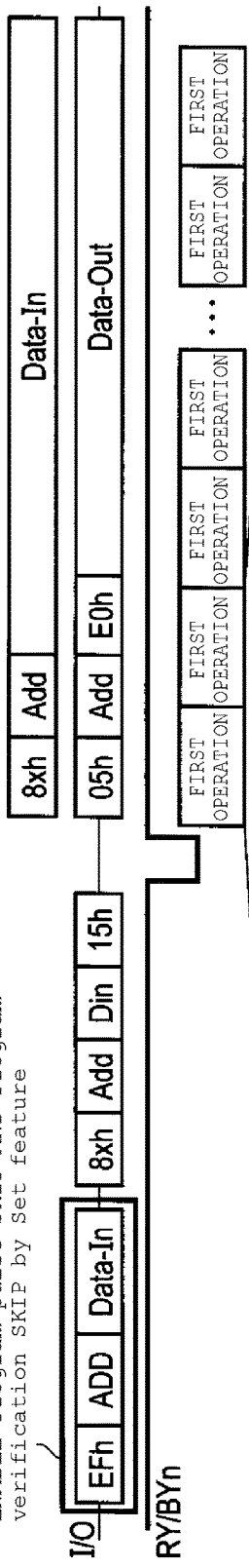
FIG. 12 is a diagram showing the relationship between a core operation waveform and a write operation, in which both the application of the program pulse and the program verification are skipped, and which is performed by the non-volatile semiconductor storage device of the first embodiment.

FIG. 12 shows the relationship between the "program pulse skip+program verification skip" mode and the core operation waveform.

In order to enable the "program pulse skip" function and the "program verification skip" function, the memory controller 200 initially transmits a set feature command sequence (command EFh, address ADD, and data Data-In) to the NAND flash memory 10. Subsequently, the memory controller 200 transmits a program command sequence (for example, command 8xh, address Add, data Din, and command 15h) to the NAND flash memory 10. The memory controller 200 monitors the ready/busy signal RY/BYn, and waits until the NAND flash memory 10 is returned to the ready state from the busy state. When the NAND flash memory 10 is returned to be in the ready state, the memory controller 200 transmits the command sequence (for example, command 8xh, address Add, and data Data-In) or the command sequence (for example, command 05h, address Add, and command E0h) to the NAND flash memory 10.

In the NAND flash memory 10, the "program pulse skip" function and the "program verification skip" function are enabled according to the set feature command sequence. The write data (Din) received from the memory controller 200 is transmitted to the cache 14 (XDL) from the I/O control circuit 16 via the data path 15. When the command 15h is received, the write data (Din) is transmitted to the sense amplifier (S/A) 13 from the cache 14 (XDL). When the transmission of the write data (Din) to the sense amplifier (S/A) 13 is completed, the ready/busy signal RY/BYn is returned to be a high level, and the write operation is started in the "program pulse skip+program verification skip" mode.

Only the first operation is repeatedly performed in the write operation of the "program pulse skip+program verification skip" mode. In this case, the first operation includes only the bit line charge period t1 and the word line/bit line reset period t3, and does not include the write pulse application period t2.

As a result, it is possible to increase a proportion of the bit line charge period t1 occupying the overall period of the write operation. That is, it is possible to generate the high noise whenever the period t3 elapses, and it is possible to further increase the frequency at which the high noise is generated. The second operation is also skipped, and thus, it is possible to shorten the time needed for the test.

FIG. 13 shows the relationship between the core operation waveform and the write operation in which the application of the program pulse is skipped and a program data pattern is automatically generated.

In the present embodiment, in order to skip the input of the write data (e.g., data corresponding to one page) to the NAND flash memory 10 from the memory controller 200, the NAND flash memory 10 also has an "automatic data pattern generation" function in addition to the "program pulse skip" function and the "program verification skip" function. The "automatic data pattern generation" function is a function of generating the write data (more particularly, a data pattern) within the chip. That is, the NAND flash memory 10 automatically generates the write data, and uses the automatically generated write data in order to charge the bit lines in the "program pulse skip" mode or the "program pulse skip+program verification skip" mode. The NAND flash memory 10 may have the function of automatically generating several kinds of data patterns. As a result, the data pattern to be used may be designated by the set feature command sequence.

The memory controller 200 may instruct the NAND flash memory 10 to enable both the "program pulse skip" function and an "automatic data pattern generation" function. For example, the memory controller 200 may enable the "program pulse skip" function and the "automatic data pattern generation" function by transmitting the set feature command sequence (command EFh, address ADD, and data Data-In) to the NAND flash memory 10. In this case, the memory controller 200 may designate the data pattern to be generated in the "automatic data pattern generation" function by the set feature command sequence.

The memory controller 200 may transmit the set feature command sequence for enabling the "program pulse skip" function and the set feature command sequence for enabling the "automatic data pattern generation" function to the NAND flash memory 10.

Alternatively, the memory controller 200 may instruct the NAND flash memory 10 to enable the "program pulse skip" function, the "program verification skip" function, and the "automatic data pattern generation" function.

When both the "program pulse skip" function and the "program verification skip" function are enabled, the write data automatically generated in the NAND flash memory 10 is used for charging the bit lines in each first operation, and the operation in which the write pulse (program pulse) is applied is omitted (such mode being referred to herein as the "program pulse skip+automatic data pattern generation" mode).

That is, as shown in FIG. 13, the memory controller 200 initially transmits a set feature command sequence (command EFh, address ADD, and data Data-In) to the NAND flash memory 10 in order to enable the "program pulse skip" function and the "automatic data pattern generation" function. Subsequently, the memory controller 200 transmits a program command sequence (for example, command 8xh, address Add, and command 15h) to the NAND flash memory 10. Since the data Din is automatically generated in the chip, the memory controller 200 may omit the transmission of the data Din. The memory controller 200 monitors the ready/busy signal RY/BYn, and waits until the NAND flash memory 10 is returned to the ready state from the busy state. When the NAND flash memory 10 is returned to be in the ready state, the memory controller 200 transmits the command sequence (for example, command 8xh, address Add, and data Data-In) or the command sequence (for example, command 05h, address Add, and command E0h) to the NAND flash memory 10.

In the NAND flash memory 10, the "program pulse skip" function and the "automatic data pattern generation" function are enabled according to the set feature command sequence. The control circuit 23 automatically generates the write data. The write data is transmitted to the cache 14 (XDL) via the data path 15. When the command 15h is received, the write data is transmitted to the sense amplifier (S/A) 13 from the cache 14 (XDL). When the transmission of the write data to the sense amplifier (S/A) 13 is completed, the ready/busy signal RY/BYn is returned to be in a high level, and the write operation is started in the "program pulse skip+automatic data pattern generation" mode.

The first operation and the second operation are repeatedly performed in the write operation of the "program pulse skip+automatic data pattern generation" mode. In this case, the first operation includes only the bit line charge period t1 and the word line/bit line reset period t3, and does not include the write pulse application period t2. For the bit line charge period t1, the bit lines BL0 to BL (L-1) are charged according to the automatically generated write data.

As mentioned above, the automatic data pattern generation" function is enabled, and thus, the transmission of the data (Din) corresponding to one page to the NAND flash memory 10 from the memory controller 200 may be omitted. Accordingly, it is possible to shorten a time necessary in the test. Since it is possible to shorten a time exclusively used by the I/O bus in order to perform communication between the memory controller 200 and one NAND flash memory 10, it is possible to efficiently drive the plurality of NAND flash memories 10 in parallel.

For example, examples of the data pattern capable of being automatically generated by the NAND flash memory 10 is as follows.

(1) Bit line stripe
(2) All "1"
(3) All "0"
(4) Random

Figure 14:
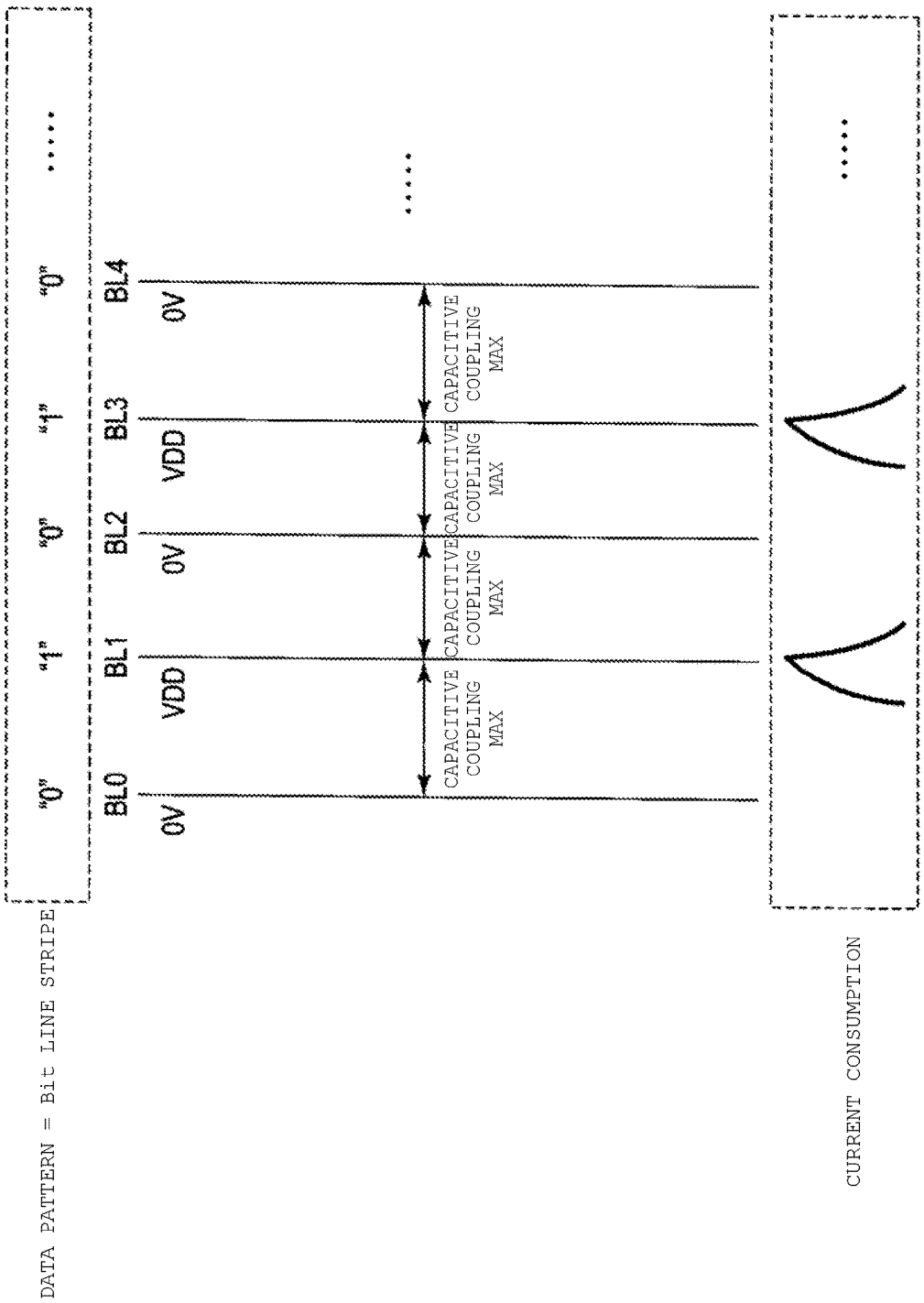
FIG. 14 is a diagram showing an example of a data pattern used in the automatic generation of the program data pattern.

As shown in FIG. 14, the bit line stripe is a data pattern (for example, 010101010101 . . . ) in which the voltage VDD is applied to one of two arbitrary bit lines adjacent to each other and 0V is applied to the other bit line. This data pattern is used, and thus, it is possible to maximize capacitive coupling between bit lines adjacent to each other. As a result, since it is possible to increase the amount of currents (current consumption) flowing to the bit lines BL0 to BL (L-1), it is possible to maximize the amount of noises caused by charging the bit lines BL0 to BL (L-1).

The all "1" is a data pattern (111111111111 . . . ) in which the voltage VDD is applied to all the bit lines BL0 to BL (L-1). The all "0" is a data pattern (000000000000 . . . ) in which 0V is applied to all the bit lines BL0 to BL (L-1). The random is a data pattern acquired by randomizing a specific data pattern based on the address Add (for example, row address) from the memory controller 200.

When the data pattern to be used is not designated by the set feature command sequence, the data pattern of the bit line stripe or the data pattern of the all "1" may be automatically selected.

Figure 15:
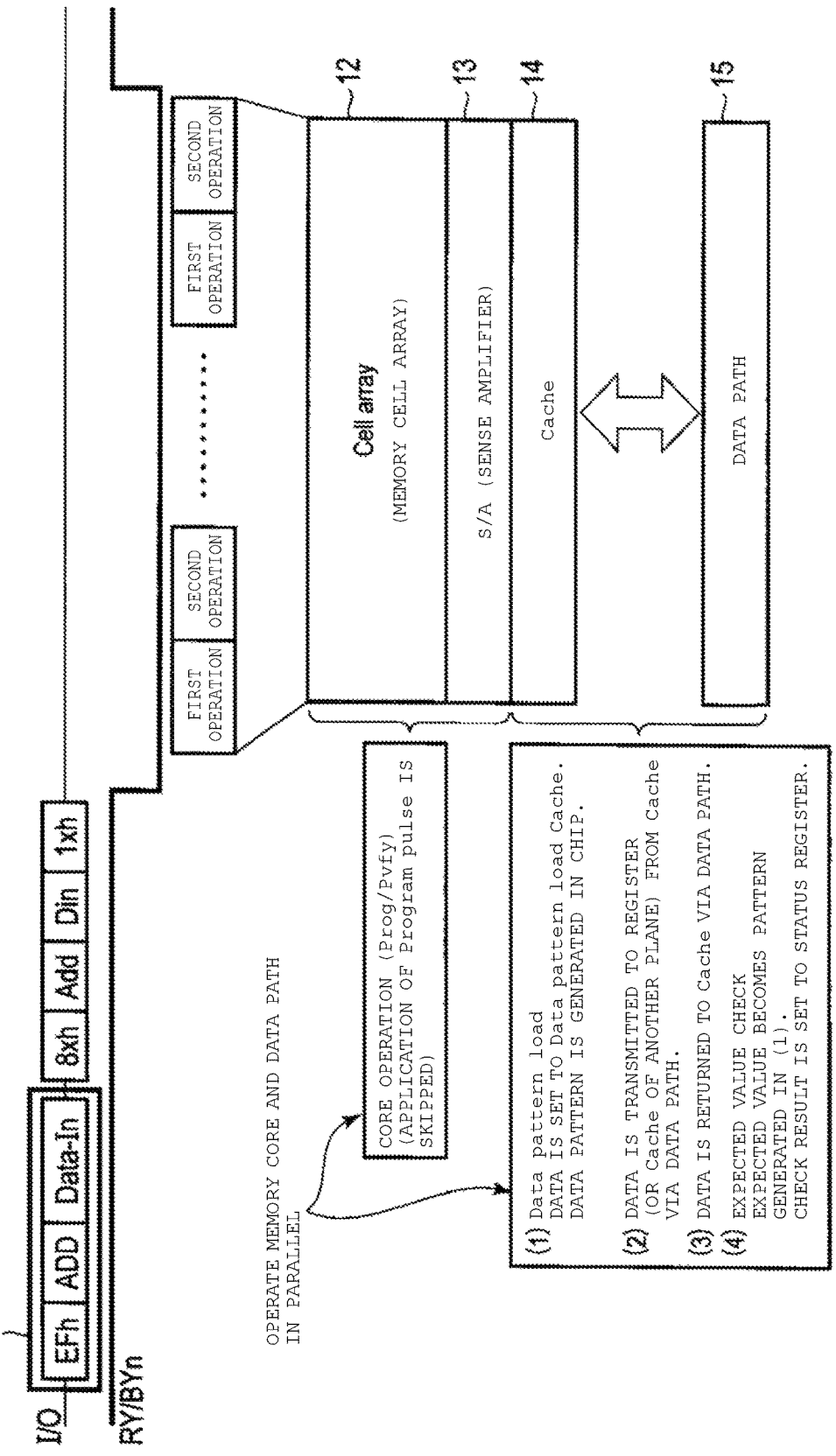
FIG. 15 is a diagram showing the relationship between a core operation waveform and a write operation, in which the application of the program pulse is skipped and a data path is automatically checked, and which is performed by the non-volatile semiconductor storage device of the first embodiment.

FIG. 15 shows the relationship between the core operation waveform and the write operation in which the application of the program pulse is skipped and the data path is automatically checked.

In the present embodiment, in order to automatically perform the data transmission using the data path 15, the NAND flash memory 10 also has an "automatic data path check" function in addition to the "program pulse skip" function, the "program verification skip" function, and the "automatic data pattern generation" function. The "automatic data path check" function is a function of checking the data path 15 in parallel with the core operation.

The memory controller 200 may instruct the NAND flash memory 10 to enable both the "program pulse skip" function and the "automatic data path check" function. For example, the memory controller 200 may enable the "program pulse skip" function and the "automatic data path check" function by transmitting a set feature command sequence (command EFh, address ADD, and data Data-In) to the NAND flash memory 10. The memory controller 200 may transmit a set feature command sequence for enabling the "program pulse skip" function and a set feature command sequence for enabling the "automatic data path check" function to the NAND flash memory 10.

Alternatively, the memory controller 200 may instruct the NAND flash memory 10 to enable any one of the combinations of the following functions.

(1) Combination of "program pulse skip" function and "automatic data path check" function (2) Combination of "program pulse skip" function, "program verification skip" function, and "automatic data path check" function (3) Combination of "program pulse skip" function, "automatic data pattern generation" function, and "automatic data path check" function (4) Combination of "program pulse skip" function, "program verification skip" function, "automatic data pattern generation" function, and "automatic data path check" function Hereinafter, an operation ("program pulse skip+automatic data path check" mode) when both the "program pulse skip" function and the "automatic data path check" function are enabled will be described.

That is, as shown in FIG. 15, the memory controller 200 transmits a set feature command sequence (command EFh, address ADD, and data Data-In) to the NAND flash memory 10 in order to enable the "program pulse skip" function and the "automatic data path check" function. Subsequently, the memory controller 200 transmits a program command sequence (for example, command 8xh, address Add, and command 1xh) to the NAND flash memory 10. The command 1xh may be the command 15h or may be the command 10h. When the command 10h is used, the NAND flash memory 10 is maintained in the busy state for a period during which the write operation is performed.

In the NAND flash memory 10, the "program pulse skip" function and the "automatic data path check" function are enabled according to the set feature command sequence. The write data (Din) received from the memory controller 200 is transmitted to the cache 14 (XDL) via the data path 15. When the command 10h is received, the write data (Din) is transmitted from the cache 14 (XDL) to the sense amplifier (S/A) 13, and the write operation is started in the "program pulse skip+automatic data path check" mode.

The first operation and the second operation are repeatedly performed in the write operation of the "program pulse skip+automatic data path check" mode. In this case, the first operation includes only the bit line charge period t1 and the word line/bit line reset period t3, and does not include the write pulse application period t2.

The following data transmission is performed in parallel with the write operation.

(1) Load of Data

The control circuit 23 loads the data to be used for data path check to the cache 14 (XDL). The data to be used for data path check may be automatically generated in the NAND flash memory 10. The data pattern of this data may be any one of the bit line stripes, the all "1", the all "0", and the random.

(2) Transmission of Data

The control circuit 23 transmits the data loaded to the cache 14 (XDL) to an internal register via the data path 15. The internal register may be a register within the I/O control circuit 16, or may be a cache (in this example, a cache within the plane #2) within another plane.

(3) Returning of Data to Cache

The control circuit 23 returns the data within the internal register to the cache 14 (XDL) via the data path 15.

(4) Checking of Expected Value

The control circuit 23 verifies whether or not the data returned to the cache 14 (XDL) matches the automatically generated data by comparing the data returned to the cache 14 (XDL) with the automatically generated data. That is, the automatically generated data is used as expected value data for verifying the data returned to the cache 14 (XDL). The control circuit 23 sets the comparison result, that is, the verification result to the status register 19.

The memory controller 200 may read the verification result from the status register 19 by transmitting a status read command to the NAND flash memory 10.

A case where the data returned to the cache 14 (XDL) matches the expected value data (verification result=pass) means that the data path 15 is normal. A case where the data returned to the cache 14 (XDL) does not match the expected value data (verification result=fail) means that there is a failure in the data path 15.

In the checking of the data path 15, data remaining in the cache 14 may be used as data transmitted between the cache 14 and the internal register in (1) to (3). In this case, the data remaining in the cache 14 may be the write data (Din) received from the memory controller 200.

As stated above, the "automatic data path check" function is enabled, and thus, it is possible to check the state of the data path 15 in the NAND flash memory 10 while performing the write operation.

Figure 16:
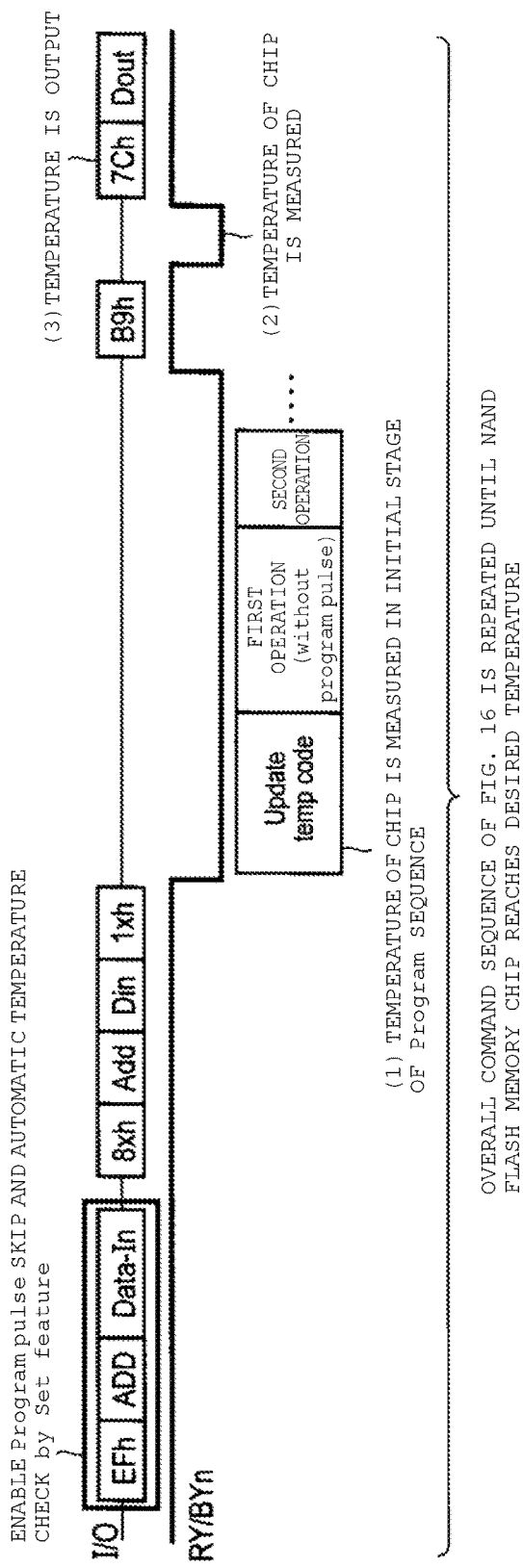
FIG. 16 is a diagram showing a write operation, in which the application of the program pulse is skipped and an internal temperature of a chip is automatically checked, and which is performed by the non-volatile semiconductor storage device of the first embodiment.

FIG. 16 shows the write operation in which the application of the program pulse is skipped and an internal temperature of the chip is automatically checked.

In the present embodiment, in order to automatically check the internal temperature of the NAND flash memory 10, the NAND flash memory 10 also has an "automatic temperature check" function in addition to the "program pulse skip" function, the "program verification skip" function, the "automatic data pattern generation" function, and the "automatic data path check" function. The "automatic temperature check" function is a function of checking the internal temperature of the NAND flash memory 10.

The memory controller 200 may instruct the NAND flash memory 10 to enable the "program pulse skip" function and the "automatic temperature check" function. For example, the memory controller 200 may enable the "program pulse skip" function and the "automatic temperature check" function by transmitting a set feature command sequence (command EFh, address ADD, and data Data-In) to the NAND flash memory 10. The memory controller 200 may transmit a set feature command sequence for enabling the "program pulse skip" function and a set feature command sequence for enabling the "automatic temperature check" function to the NAND flash memory 10.

Alternatively, the memory controller 200 may instruct the NAND flash memory 10 to enable any one of the combinations of the following functions.

(1) Combination of "program pulse skip" function and "automatic temperature check" function (2) Combination of "program pulse skip" function, "program verification skip" function, and "automatic temperature check" function (3) Combination of "program pulse skip" function, "automatic data pattern generation" function, and "automatic temperature check" function (4) Combination of "program pulse skip" function, "program verification skip" function, "automatic data pattern generation" function, and "automatic temperature check" function Hereinafter, an operation ("program pulse skip+automatic temperature check" mode) when both the "program pulse skip" function and the "automatic temperature check" function are enabled will be described.

That is, as shown in FIG. 16, the memory controller 200 transmits a set feature command sequence (command EFh, address ADD, and data Data-In) to the NAND flash memory 10 in order to enable the "program pulse skip" function and the "automatic temperature check" function. Subsequently, the memory controller 200 transmits a program command sequence (for example, command 8xh, address Add, data Din, and command lxh) to the NAND flash memory 10. The command lxh may be the command 15h or may be the command 10h. When the command 10h is used, the NAND flash memory 10 is maintained in the busy state for a period during which the write operation is performed.

In the NAND flash memory 10, the "program pulse skip" function and the "automatic data path check" function are enabled according to the set feature command sequence. The write data (Din) received from the memory controller 200 is transmitted to the cache 14 (XDL) via the data path 15. When the command 10h is received, the write data (Din) is transmitted to the sense amplifier (S/A) 13 from the cache 14 (XDL), and the write operation is started in the "program pulse skip+automatic temperature check" mode.

This write operation is performed by the following procedure.

(1) Measurement of Chip Internal Temperature

In an initial state of the program command sequence, the control circuit 23 measures an internal temperature of the NAND flash memory 10 by the temperature sensor 28. Accordingly, data (in the form of Temp Code) of a current temperature is updated. A value of the temperature measured in this example is used for determining a voltage of the program pulse applied to the selected word line WLn and a voltage applied to the bit lines BL0 to BL (L-1) in the subsequently performed program (Prog) and program verification (Pvfy) operations.

When the measurement of the temperature is completed, the first operation and the second operation are repeatedly performed. In this case, the first operation includes only the bit line charge period t1 and the word line/bit line reset period t3, and does not include the write pulse application period t2.

(2) Re-Measurement of Chip Internal Temperature

When the program command sequence is completed, the ready/busy signal RY/BYn is returned to be in a high level. Thereafter, a command B9h is transmitted to the NAND flash memory 10 from the memory controller 200. The command B9h is a command for instructing the measurement of the temperature. In response to the reception of the command B9h, the control circuit 23 re-measures the internal temperature of the NAND flash memory 10 by the temperature sensor 28. This re-measurement is performed for determining how much the internal temperature of the NAND flash memory 10 increased by the first operation and the second operation.

(3) Output of Value of Temperature

When the re-measurement of the internal temperature of the NAND flash memory 10 is completed, the ready/busy signal RY/BYn is returned to be in a high level. Thereafter, when the NAND flash memory 10 receives a command 7Ch from the memory controller 200, the control circuit 23 outputs the value of the re-measured temperature to the memory controller 200.

When the value of the temperature output to the memory controller 200 reaches a desired temperature (a temperature at which the test operation is performed), the command sequence of FIG. 16 is ended. When the value of the temperature output to the memory controller 200 does not reach the desired temperature (the temperature at which the test operation is desired to be performed), the overall command sequence of FIG. 16 is performed again. The overall command sequence of FIG. 16 is repeated until the internal temperature of the NAND flash memory 10 reaches the desired temperature.

As mentioned above, the "automatic temperature check" function is enabled, and thus, it is possible to raise the chip internal temperature of the NAND flash memory 10 at the desired temperature. The "automatic temperature check" function and the "program pulse skip" function are combined, and thus, the application of the write pulse to the selected word line is able to be skipped. Accordingly, it is possible to raise the temperature without burdening the memory core 12.

Figure 17:
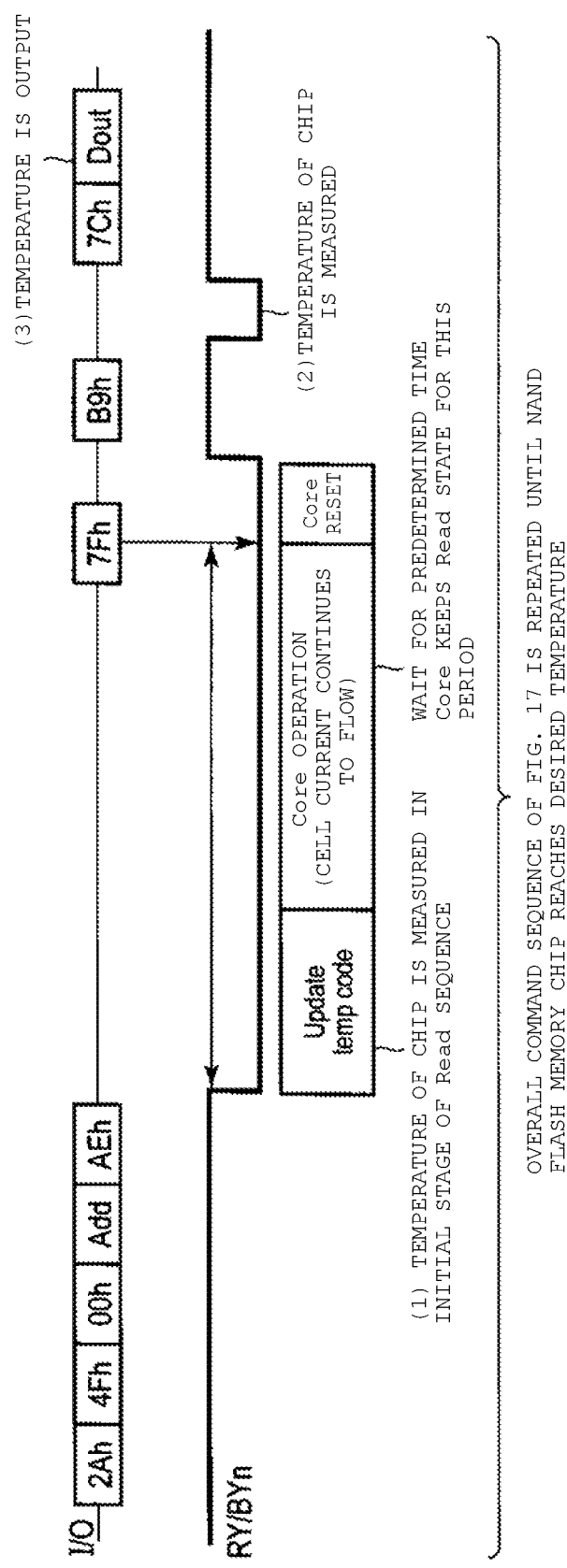
FIG. 17 is a diagram showing a read operation, in which a read period is able to be controlled from the outside and the internal temperature of the chip is automatically checked, and which is performed by the non-volatile semiconductor storage device of the first embodiment.

FIG. 17 shows the read operation in which a read period is able to be controlled from the outside and the internal temperature of the chip is automatically checked.

The memory controller 200 transmits a read command sequence (for example, command 2Ah, command 4Fh, command 00h, address Add, and command AEh) to the NAND flash memory 10. In this example, the command 2Ah is a command for requesting the data read operation from all the planes. The command 4Fh is a command for enabling a mode for controlling a time of the read operation from the outside.

When the read command sequence is received from. The NAND flash memory 10, operations to be described below are performed.

(1) Measurement of Temperature

In an initial stage of the read command sequence, the control circuit 23 measures the internal temperature of the NAND flash memory 10 by the temperature sensor 28. Accordingly, data (in the form of Temp Code) of a current temperature is updated.

After the measurement of the temperature is performed, the core operation is performed. In this core operation, the read voltage depending on the measured temperature is applied to the selected word line. A cell current flows to the bit line connected to the turned-on memory cell transistor MT. This state is maintained until the NAND flash memory 10 receives a command 7Fh from the memory controller 200. That is, the cell current continues to flow to the bit line until the command 7Fh is received. This command 7Fh is a command for ending the read operation. A timing when the memory controller 200 transmits the command 7Fh is controlled, and thus, it is possible to control a time when the read state of the memory core 12 is maintained.

When the NAND flash memory 10 receives the command 7Fh, the read operation is ended, the word lines WL0 to WL7 and the bit lines BL0 to BL (L-1) are reset to be in an initial state (core reset).

(2) Re-Measurement of Chip Internal Temperature

When the word lines WL0 to WL7 and the bit lines BL0 to BL (L-1) are reset to be in the initial state, the ready/busy signal RY/BYn is returned in a high level. Thereafter, a command B9h is transmitted to the NAND flash memory 10 from the memory controller 200. The control circuit 23 re-measures the internal temperature of the NAND flash memory 10 by the temperature sensor 28. The re-measurement is performed for determining how much the internal temperature of the NAND flash memory 10 increased by the read operation.

(3) Output of Value of Temperature

When the re-measurement of the internal temperature of the NAND flash memory 10 is completed, the ready/busy signal RY/BYn is returned to be in a high level. Thereafter, when the NAND flash memory 10 receives a command 7Ch from the memory controller 200, the control circuit 23 outputs the value of the re-measured temperature to the memory controller 200.

When the value of the temperature output to the memory controller 200 reaches the desired temperature (i.e., the temperature at which the test operation is performed), the command sequence of FIG. 17 is ended. When the value of the temperature output to the memory controller 200 does not reach the desired temperature, the overall command sequence of FIG. 17 is performed again. The overall command sequence of FIG. 17 is repeated until the internal temperature of the NAND flash memory 10 reaches the desired temperature.

As mentioned above, the time of the read operation is controlled from the outside, and thus, it is possible to efficiently increase the internal temperature of the NAND flash memory 10.

Second Embodiment

Hereinafter, the NAND flash memory 10 having the on-chip FBC function will be described as the second embodiment.

The NAND flash memory 10 of the second embodiment has the same hardware configuration as that of the NAND flash memory according to the first embodiment described in FIG. 3. The NAND flash memory 10 of the second embodiment is implemented as a single-level cell (SLC)-flash memory that stores one bit per memory cell, a multi-level cell (MLC)-flash memory capable of storing two bits per memory cell, or a triple-level cell (TLC)-flash memory capable of storing three bits per memory cell. The memory cell array 12 of the NAND flash memory 10 of the second embodiment has the same configuration as that of the memory cell array 12 of the NAND flash memory of the first embodiment described in FIG. 4.

Figure 18:
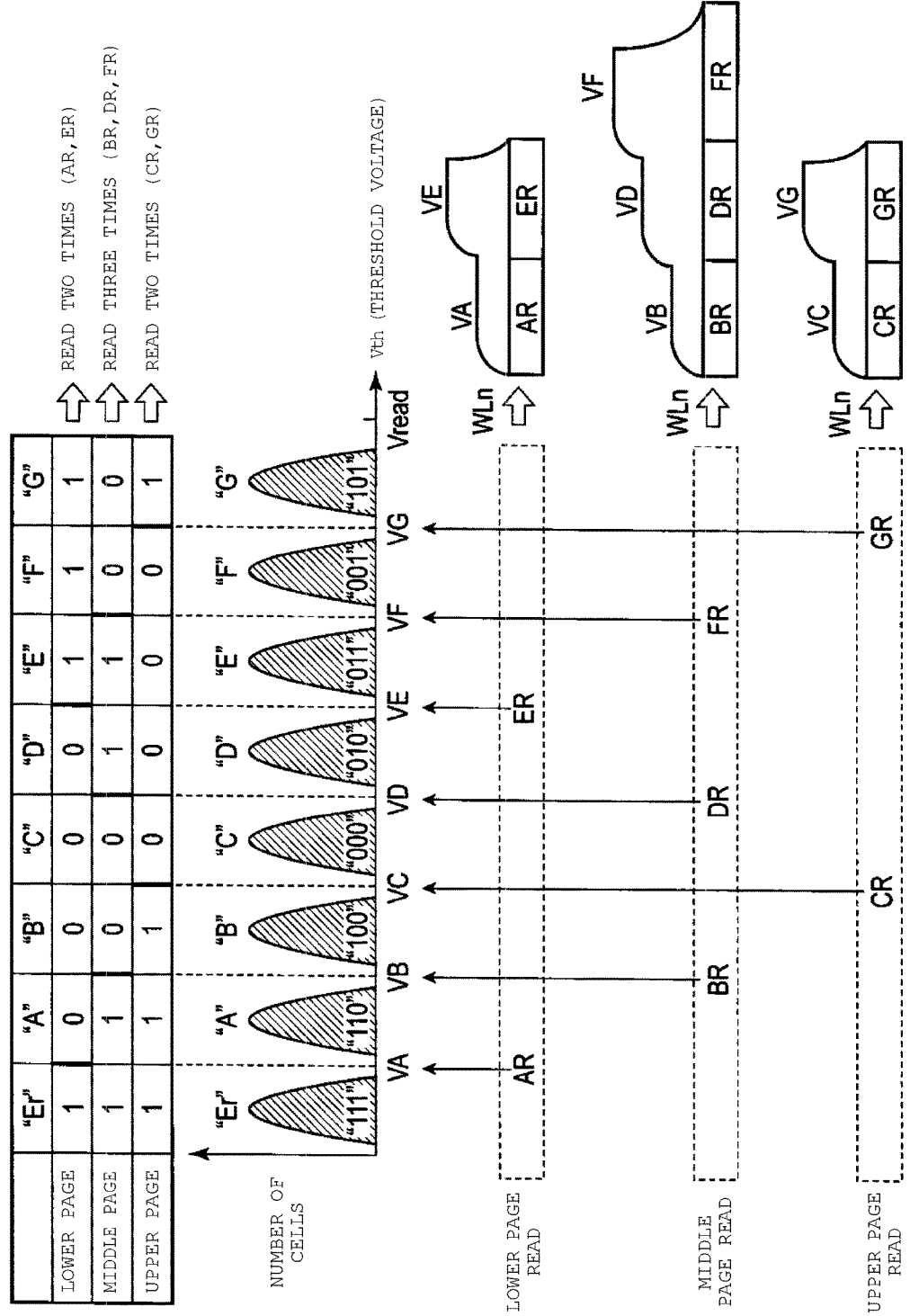
FIG. 18 is a diagram showing the relationship between 3-bit data and eight threshold voltage levels corresponding to a triple-level cell (TLC) in a non-volatile semiconductor storage device of a second embodiment.

FIG. 18 shows the relationship between eight threshold voltage levels corresponding to the triple-level cell (TLC) and 3-bit data items mapping to eight threshold voltage levels.

The memory cell transistors MT within the memory cell array 12 are respectively set to be in eight states (one erase state and seven program states). The eight states are referred to as an "Er" state, an "A" state, a "B" state, a "C" state, a "D" state, an "E" state, an "F" state, and a "G" state. The "Er", "A", "B", "C", "D", "E", "F", and "G" states have different threshold voltage levels. Thus, these states are also referred to as an "Er" level, an "A" level, a "B" level, a "C" level, a "D" level, an "E" level, an "F" level, and a "G" level. The threshold voltage levels have increasing voltage levels in the order of the "Er", "A", "B", "C", "D", "E", "F", and "G" states.

In the read operation, any one of seven voltages VA, VB, VC, VD, VE, VF, and VG for separating the "Er", "A", "B", "C", "D", "E", "F", and "G" states from each other are used as a read voltage VCGRV. The read voltage VCGRV is a voltage applied to the selected word line. The voltage VA is a voltage corresponding to the boundary between the "Er" state and the "A" state, the voltage VB is a voltage corresponding to the boundary between the "A" state and the "B" state, the voltage VC is a voltage corresponding to the boundary between the "B" state and the "C" state, the voltage VD is a voltage corresponding to the boundary between the "C" state and the "D" state, the voltage VE is a voltage corresponding to the boundary between the "D" state and the "E" state, the voltage VF is a voltage corresponding to the boundary between the "E" state and the "F" state, and the voltage VG is a voltage corresponding to the boundary between the "F" state and the "G" state (VA<VB<VC<VD<VE<VF<VG). In the read operation, the voltage Vread is applied to the non-selected word line. The voltage Vread is a voltage capable of turning on the memory cell transistor MT irrespective of retention data (VG<Vread).

In the write operation, three pages (including lower page data, middle page data, and upper page data) of data items are written in a group of memory cell transistors MT connected to the same word line. Accordingly, the threshold voltages of the memory cell transistors MT are respectively set to be the "Er", "A", "B", "C", "D", "E", "F", and "G" states according to 3-bit data items (including upper page bit, middle page bit, and lower page bit) stored in these memory cell transistors.

For example, 3-bit data items "111", "110", "100", "000", "010", "011", "001", and "101" may map to the "Er", "A", "B", "C", "D", "E", "F", and "G" states, respectively. When the 3-bit data is represented by "xyz", x represents the high-order bit corresponding to an upper page, y represents the middle-order bit corresponding to a middle page, and z represents the low-order bit corresponding to a lower page.

In the lower page, the boundary between "0" and "1" is present in the boundary between the "Er" state and the "A" state and the boundary between the "D" state and the "E" state. Accordingly, in the read operation of the lower page, a read operation AR that uses the read voltage VA corresponding to the "A" state and a read operation ER that uses the read voltage VE corresponding to the "E" state are performed. The read operation AR is a read operation for determining whether the memory cell transistors MT connected to the selected word line WLn have threshold voltages which are less than the "A" state, or have the threshold voltages which are equal to or greater than the "A" state. The read operation ER is a read operation for determining whether the memory cell transistors MT connected to the selected word line WLn have threshold voltages which are less than the "E" state or have the threshold voltages which are equal to or greater than the "E" state. The lower page data is determined by the data read by the read operation AR and the data read by the read operation ER.

In the read operation of the lower page, the voltage VA is initially applied to the selected word line WLn, as the read voltage VCGRV, and the data items are read into the bit lines BL0 to BL (L-1) from the memory cell transistors MT. Subsequently, the voltage VE is applied to the selected word line WLn as the read voltage VCGRV, and the data items are read into the bit lines BL0 to BL (L-1) from the memory cell transistors MT.

In the middle page, the boundary between "0" and "1" is present in the boundary between the "A" state and the "B" state, the boundary between the "C" state and the "D" state, and the boundary between the "E" state and the "F" state. Accordingly, in the read operation of the middle page, a read operation BR that uses the read voltage VB corresponding to the "B" state, a read operation DR that uses the read voltage VD corresponding to the "D" state, and a read operation FR that uses the read voltage VF corresponding to the "F" state are performed. The middle page data is determined by the data read by the read operation BR, the data read by the read operation DR, and the data read by the read operation FR.

In the read operation of the middle page, the voltage VB is initially applied to the selected word line WLn, as the read voltage VCGRV, and the data items are read into the bit lines BL0 to BL (L-1) from the memory cell transistors MT. Subsequently, the voltage VD is applied to the selected word line WLn, as the read voltage VCGRV, and the data items are read into the bit lines BL0 to BL (L-1) from the memory cell transistors MT. The voltage VF is applied to the selected word line WLn, as the read voltage VCGRV, and the data items are read into the bit lines BL0 to BL (L-1) from the memory cell transistors MT.

In the upper page, the boundary between "0" and "1" is present in the boundary between the "B" state and the "C" state and the boundary between the "F" state and the "G" state. Accordingly, in the read operation of the upper page, a read operation CR that uses the read voltage VC corresponding to the "C" state and a read operation GR that uses the read voltage VG corresponding to the "G" state are performed. The upper page data is determined by the data read by the read operation CR and the data read by the read operation GR.

In the read operation of the upper page, the voltage VC is initially applied to the selected word line WLn, as the read voltage VCGRV, and the data items are read into the bit lines BL0 to BL (L-1) from the memory cell transistors MT. Subsequently, the voltage VG is applied to the selected word line WLn, as the read voltage VCGRV, and the data items are read into the bit lines BL0 to BL (L-1) from the memory cell transistors MT.

Figure 19:
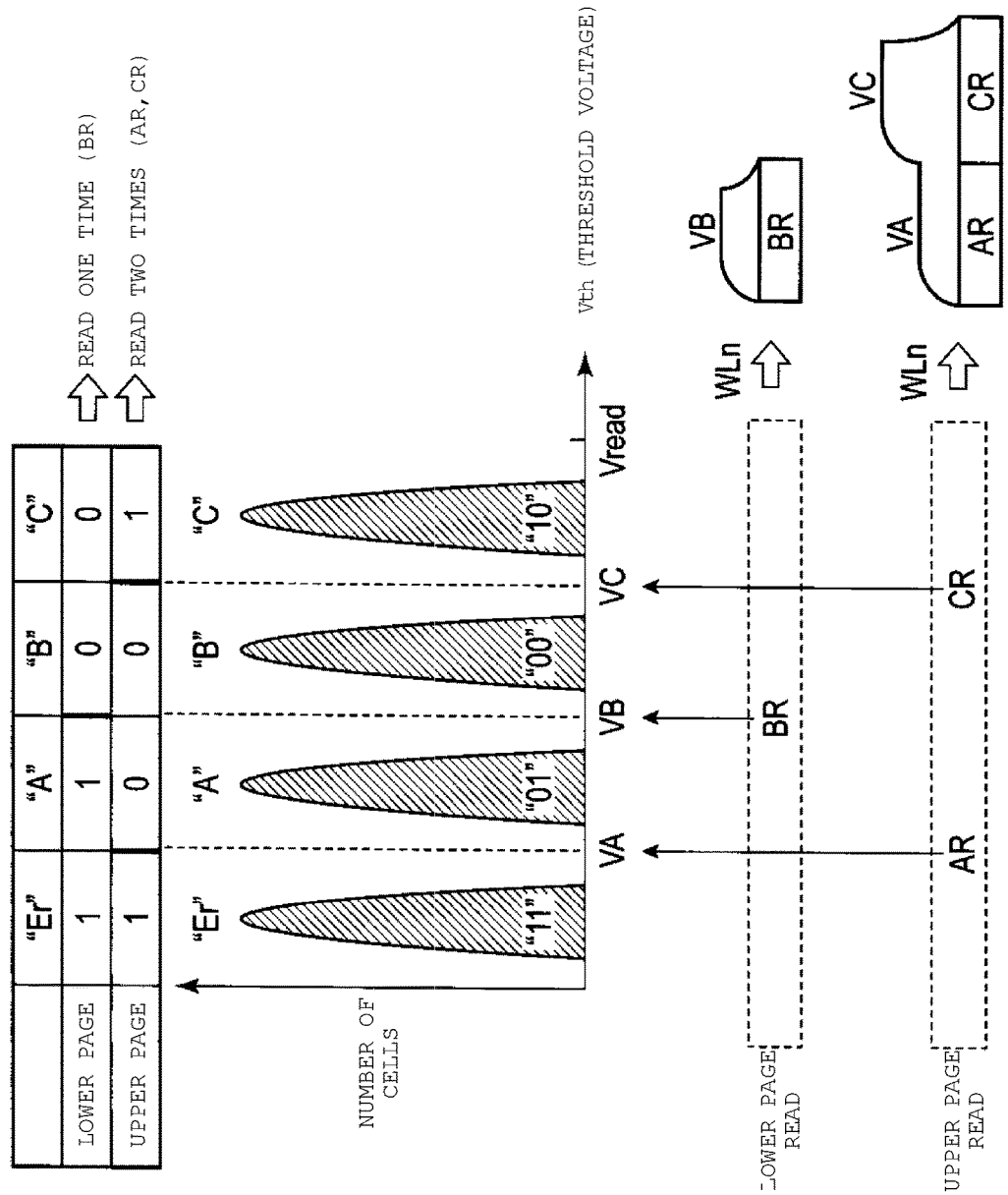
FIG. 19 is a diagram showing the relationship between 2-bit data and four threshold voltage levels corresponding to a multi-level cell (MLC) in the non-volatile semiconductor storage device of the second embodiment.

FIG. 19 shows an example of the relationship between 2-bit data items and four threshold voltage levels corresponding to the multi-level cell (MLC).

The memory cell transistors MT within the memory cell array 12 are set to be in four states (one erase state and three program states). The four states are referred to as the "Er" state, the "A" state, the "B" state, and the "C" state. The "Er" state (erase state) may be referred as the "E" state. The "Er", "A", "B", and "C" states have different threshold voltage levels from each other. Thus, these states are referred to as the "Er" level, the "A" level, the "B" level", and the "C" level. The threshold voltage levels are increased in the order of the "Er", "A", "B", and "C" states.

In the read operation, any one of three voltages VA, VB and VC for separating the "Er", "A", "B", and "C" states from each other is used as the read voltage VCGRV.

In the write operation, two pages of data items (including lower page data and upper page data) are written in a group of memory cell transistors MT connected to the same word line. Accordingly, the threshold voltages of the memory cell transistors MT are respectively set to be in the "Er", "A", "B", and "C" states according to the 2-bit data items (including upper page bit and lower page bit) stored in the memory cell transistors.

For example, the 2-bit data items "11", "01", "00", and "10" may map to the "Er", "A", "B", and "C" states, respectively. When the 2-bit data is represented by "xy", x represents the high-order bit corresponding to an upper page, and y represents the low-order bit corresponding to a lower page.

In the lower page, the boundary between "0" and "1" is present only in the boundary between the "A" state and the "B" state. Accordingly, the read operation of the lower page, only a read operation BR that uses the read voltage VB corresponding to the "B" state is performed. The lower page data is determined by only the data read by the read operation BR.

In the read operation of the lower page, the voltage VB is applied to the selected word line WLn, as the read voltage VCGRV, and the data items are respectively read into the bit lines BL0 to BL (L-1) from the memory cell transistors MT.

In the upper page, the boundary between the "0" and "1" is present in the boundary between the "Er" state and the "A" state and the boundary between the "B" state and the "C" state. Accordingly, in the read operation of the upper page, a read operation AR that uses the read voltage VA corresponding to the "A" state and a read operation CR that uses the read voltage VC corresponding to the "C" state are performed. The upper page data is determined by the data read by the read operation AR and the data read by the read operation CR.

In the read operation of the upper page, the voltage VA is initially applied to the selected word line WLn, as the read voltage VCGRV, and the data items are read into the bit lines BL0 to BL (L-1) from the memory cell transistors MT. Subsequently, the voltage VC is applied to the selected word line WLn, as the read voltage VCGRV, and the data items are respectively read into the bit lines BL0 to BL (L-1) from the memory cell transistors MT.

In the TLC/MLC, the control circuit 23 writes data items corresponding to m (where m is an integer of 2 or more) pages in the group of memory cell transistors MT connected to the selected word line WLn, and respectively sets the memory cell transistors MT to be in $2^m$ states (i.e., $2^m$ threshold voltage levels). In the read operation of the lower page/middle page/upper page data items of the TLC, the read operation is performed at least two times (e.g., a read operation in which a read voltage corresponding to a first state of the $2^m$ states is applied to the selected word line WLn and a read operation in which a read voltage corresponding to a second state of the $2^m$ states is applied to the selected word line WLn are performed). Even in the read operation of the upper page data of the MLC, the read operation is performed two times.

Figure 20:
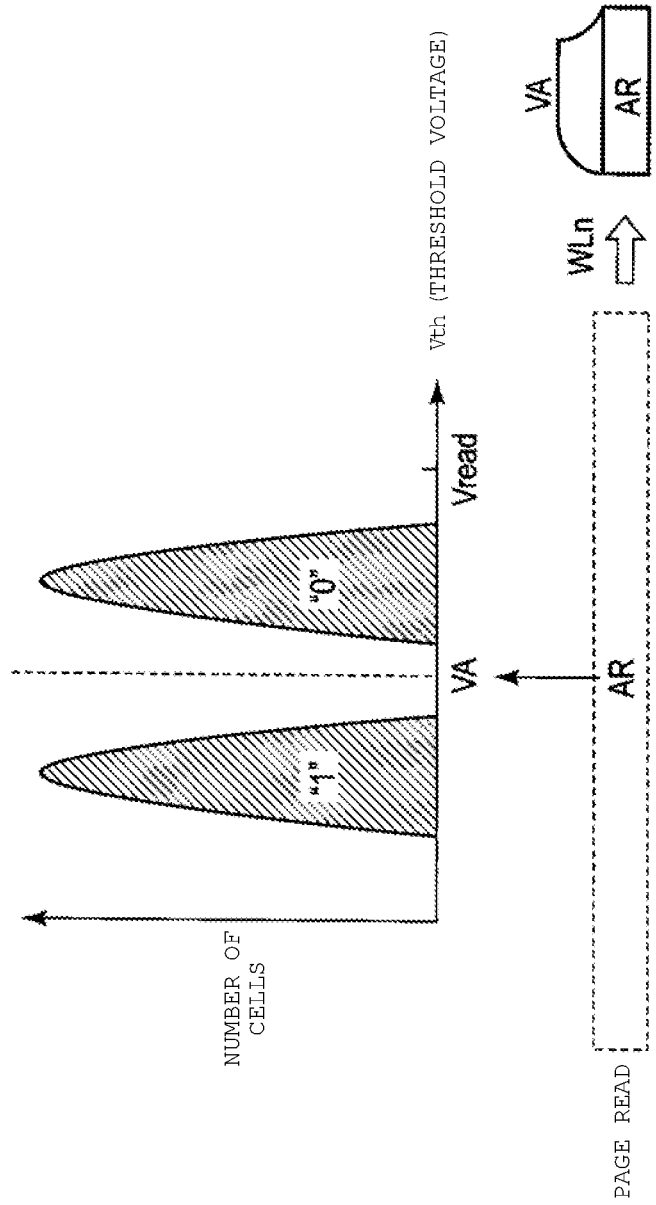
FIG. 20 is a diagram showing an example of the relationship between 1-bit data and two threshold voltage levels corresponding to a single-level cell (SLC) in the non-volatile semiconductor storage device of the second embodiment.

FIG. 20 shows an example of the relationship between 1-bit data and two threshold voltage levels corresponding to the single-level cell (SLC).

The memory cell transistors MT within the memory cell array 12 are respectively set to be in two states (one erase state and one program state). In the read operation, the voltage VA is used as the read voltage VCGRV. That is, in the read operation, the voltage VA is applied to the selected word line WLn, as the read voltage VCGRV, and the data items are respectively read into the bit lines BL0 to BL (L-1) from the memory cell transistors MT.

Figure 21:
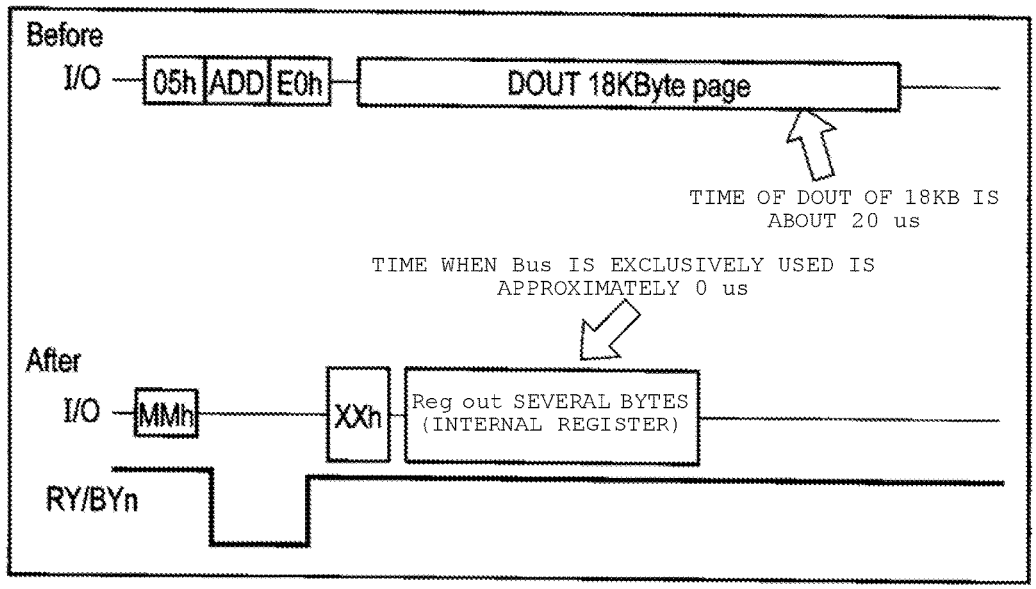
FIG. 21 is a diagram showing a fail bit count function of the non-volatile semiconductor storage device of the second embodiment.

FIG. 21 shows an outline of the on-chip FBC function. Hereinafter, the on-chip FBC function when the NAND flash memory 10 is the TLC-flash memory will be described, but the NAND flash memory 10 is not limited to the TLC-flash memory. The NAND flash memory may be the MLC-flash memory, or may be the SLC-flash memory. Alternatively, a specific block within the TLC/MLC-flash memory may be used as an SLC block. In this case, in the data write operation of the data in the SLC block, only the lower page data items may be written in the group of memory cell transistors MT connected to the selected word line.

In the NAND flash memory 10, the threshold voltages of the memory cell transistors MT may be changed with the elapse of time or due to stress on the memory cell transistors MT. As a result, since a threshold voltage distribution of each of the states expands or shifts, the number of errors included in the read data is increased. As one method for reducing the number of errors, there is a method for adjusting the read voltage to be an appropriate value. For example, in a case where two threshold voltage distributions corresponding to two states adjacent to each other overlap each other, the read voltage is preferably adjusted to be a voltage corresponding to an intersection (which is at a valley between the threshold voltage distributions) between the two threshold voltage distributions.

In general, in order to acquire an optimum voltage corresponding to the intersection between the threshold voltage distributions, it is necessary for the memory controller 200 to read the page data from the NAND flash memory 10 and to count a fail bit count based on the page data. In this case, as shown in the upper side of FIG. 21, the memory controller 200 issues, for example, a command sequence (for example, command 05h, address ADD, and command E0h) to the NAND flash memory 10, and reads data corresponding to one page from the cache 14 (XDL). For example, this data has a data length of 18 kilobytes (resulting in user data of 18 kilobytes and ECC of 2 kilobyte). Thus, a long time, for example, about 20 microseconds are necessary to read the data in the memory controller 200 from the cache 14 (XDL). For a long period, the memory bus (I/O bus) 11 may be exclusively used in the reading of the data, and the memory controller 200 is not able to access another NAND flash memory 10.

In recent years, a memory package capable of accelerating data input and output and reducing power consumption by a through-silicon via (TSV) technology that uses an electrode passing vertically through the inside of the NAND flash memory chips stacked within the package has been developed. The memory package includes an interface chip, and the data is input and output to and from the outside via the interface chip. Communication between the interface chip and each NAND flash memory chip is performed via a plurality of vertical vias. Thus, it is possible to exclude an external high-speed I/O interface from each of the NAND flash memory chips. However, in a case where the NAND flash memory chip is tested for each chip, the NAND flash memory chip may include only an external I/O interface having a 1-bit width, a longer time is necessary to read the data in the memory controller 200 from the cache 14 (XDL).

The on-chip FBC function is a function of counting the fail bit count within the chip by the counter 23A in the NAND flash memory 10 to output only a digital value indicating the fail bit count to the memory controller 200. In this example, the fail bit count indicates the number of turned-on memory cell transistors MT, that is, the number of on-cells. When the memory cell transistors MT corresponding to the bit line BL0 in the group of memory cell transistors MT connected to the selected word line WLn are turned on, data items of "0" are read into the bit line BL0 from the memory cell transistors MT. When the memory cell transistors MT corresponding to the bit line BL1 are turned off, data items of "1" are read into the bit line BL1 from the memory cell transistors MT. Accordingly, in a certain page (which is a group of memory cell transistors MT connected to the selected word line WLn), the number of on-cells is equivalent to the number of data items of "0" included in the read data from the group of memory cell transistors MT.

As described in FIG. 3, the on-chip FBC function may be performed by using the counter 23A and the register 23B provided within the control circuit 23.

As shown in the lower side of FIG. 21, the memory controller 200 may transmit a command (for example, MMh) for requesting that the number of on-cells is to be counted and a command (for example, XXh) for requesting that the number of on-cells counted is to be output to the NAND flash memory 10.

In response to the reception of the command (for example, MMh), the NAND flash memory 10 enters the busy state, and performs a fail bit count operation in which the fail bit count is performed based on the read data stored in the cache 14 (XDL). A digital value indicating the number of on-cells counted is stored in the register 23B. When the counting of the number of on-cells is completed, the NAND flash memory 10 is returned to be in the ready state. In response to the reception of the command (for example, XXh), the NAND flash memory 10 performs a fail bit count output operation, and transmits data stored in the register 23B to the memory controller 200. The data stored in the register 23B is not the read data, and is a digital value indicating the number of on-cells. Accordingly, a length of the data stored in the register 23B is several bytes at most. The reading of the digital value to the memory controller 200 from the register 23B is immediately completed. Thus, it is possible to prevent the memory bus (I/O bus) 11 from being exclusively used for a long time in order to acquire the number of on-cells from a certain specific NAND flash memory. For example, in the configuration in which the plurality of NAND flash memories 10 is connected to the memory controller 200 as in FIG. 1, since the bus is exclusively used by a specific NAND flash memory, it is possible to prevent a circumstance in which another NAND flash memory is not able to be accessed for a long time from occurring.

Figure 22:
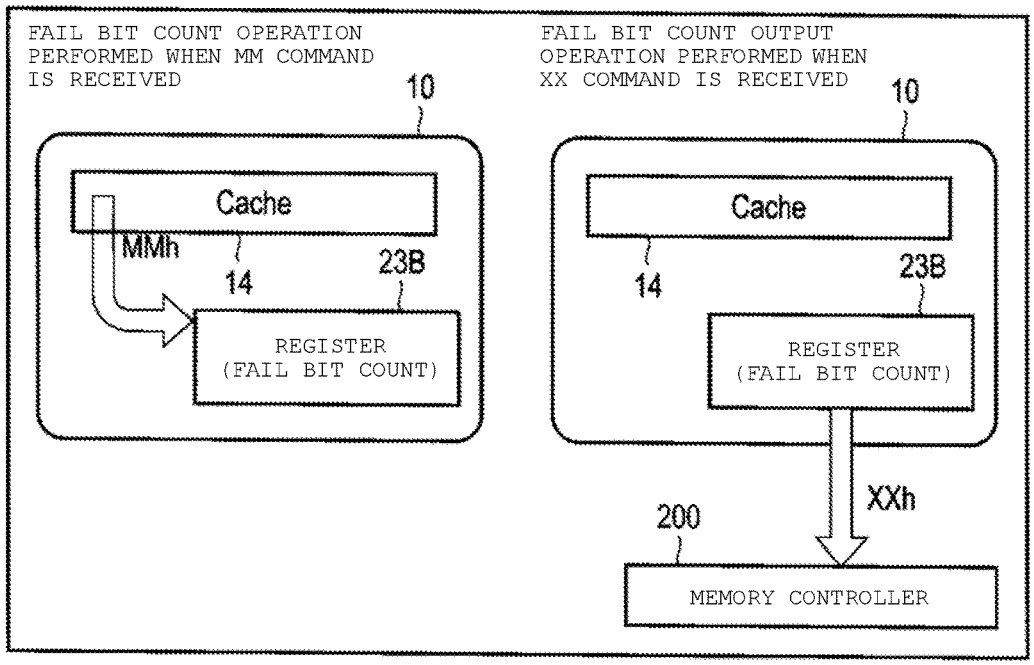
FIG. 22 is a diagram showing a fail bit count output operation and a fail bit count operation performed by the non-volatile semiconductor storage device of the second embodiment.

FIG. 22 shows the fail bit count operation and the fail bit count output operation.

When the command (for example, MMh) is received, the counter 23A of the control circuit 23 counts the number of data items of "0" within the read data within the cache 14 (XDL), and acquires the number of on-cells, as shown in the left side of FIG. 22. The control circuit 23 stores the digital value indicating the number of on-cells acquired, as the fail bit count, in the register 23B.

When the command (for example, XXh) is received, the control circuit 23 outputs the fail bit count (the number of on-cells) to the memory controller 200 from the register 23B, as shown in the right side of FIG. 22.

Figure 23:
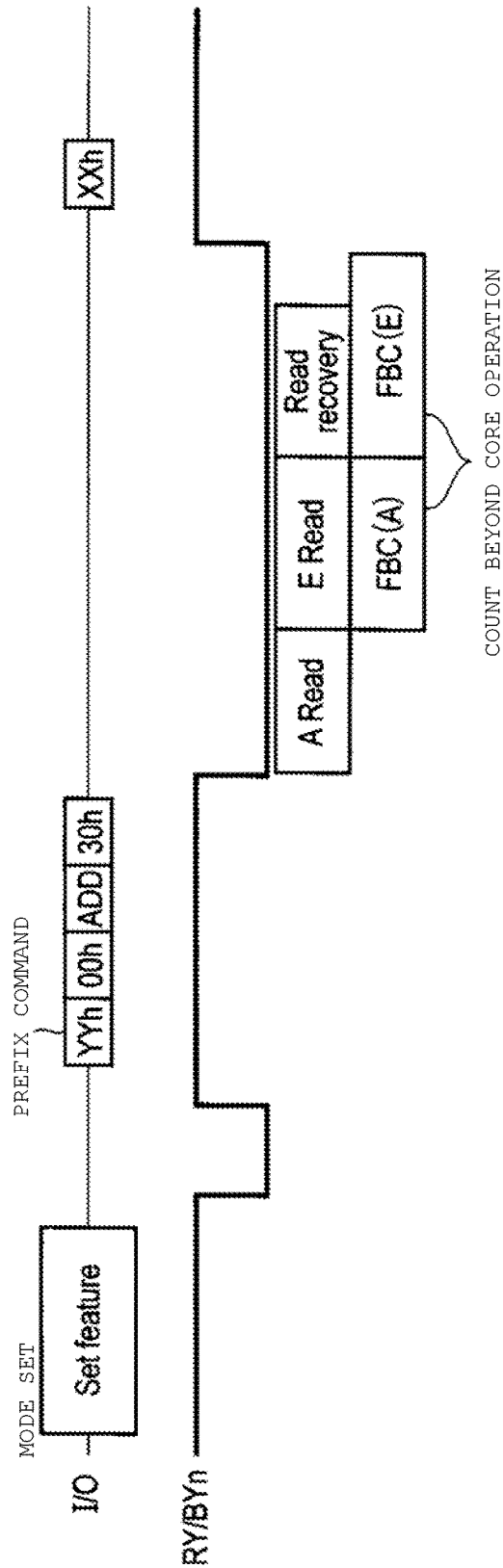
FIG. 23 is a diagram showing a data read/fail bit count operation performed by the non-volatile semiconductor storage device of the second embodiment according to a read command.

FIG. 23 shows the data read/fail bit count operation performed according to the read command.

In the data read/fail bit count operation, the number of data items of "0" (the number of on-cells) included in the read data is counted in the background of the read operation in which the data designated by the read command is read.

The memory controller 200 may designate various modes related to the fail bit count operation by using the set feature command sequence. These modes includes a mode in which the number of on-cells is counted in each state (threshold voltage level). In this mode, in response to the reception of one read command, a plurality of fail bit count operations corresponding to several states (a plurality of threshold levels) is performed. For example, in the TLC-flash memory, when the page designated by the read command is the lower page, the read operation AR that uses the read voltage VA corresponding to the "A" state and the read operation ER that uses the read voltage VE corresponding to the "E" state are performed, and the number of on-cells corresponding to the "A" state and the number of on-cells corresponding to the "E" state are counted. In the TLC-flash memory, when the page designated by the read command is the upper page, the read operation CR that uses the read voltage VC corresponding to the "C" state and the read operation GR that uses the read voltage VG corresponding to the "G"" state are performed, and the number of on-cells corresponding to the "C" state and the number of on-cells corresponding to the "G" state are counted.

The memory controller 200 issues a prefix command (for example, YYh) before a read command sequence (00h, address ADD, and 30h) is issued. The prefix command (for example, YYh) and a read command sequence (00h, address ADD, and 30h) subsequent to the prefix command request the NAND flash memory 10 to read data items from a page (memory cell group) designated by the address ADD and to count the number of on-cells corresponding to this page.

Hereinafter, the data read/fail bit count operation when the page designated by the address ADD is the lower page of the TLC will be described.

In the read operation in which the lower page data is read, the control circuit 23 of the NAND flash memory 10 performs the read operation AR that uses the read voltage VA corresponding to the "A" state and the read operation AE that uses the read voltage VE corresponding to the "E" state.

In a read operation AR (A Read), the read voltage VA is applied to the selected word line WLn, and data (A Data) is read from the page (a memory cell group connected to the selected word line WLn) designated by the address ADD. In a read operation ER (E Read), the read voltage VE is applied to the selected word line WLn, and data (E Data) is read from a memory cell group connected to the selected word line WLn.

For a period of the read operation ER (E Read), the data (A data) is transmitted to the XDL, and the control circuit 23 counts the number (FBC(A)) of data items of "0" within the data (A Data). The FBC(A) is stored in the register 23B.

For a period of a read recovery operation, data (E Data) is transmitted to the XDL, and the control circuit 23 counts the number (FBC(E)) of data items of "0" within the data (E Data). The FBC(E) is also stored in a remaining empty area of the register 23B. The lower page data acquired from the data (A Data) and the data (E Data) is stored in the XDL.

When the read recovery operation is completed, the NAND flash memory 10 is returned to the ready state from the busy state. When the command (for example, XXh) is received from the memory controller 200, the control circuit 23 outputs the FBC(A) and the FBC(E) within the register 23B to the memory controller 200. The memory controller 200 may read the lower page data from the XDL by asserting a signal REn.

Hereinafter, examples of the read operation AR and the fail bit count operation will be described with reference to FIGS. 24 and 25.

Figure 24:
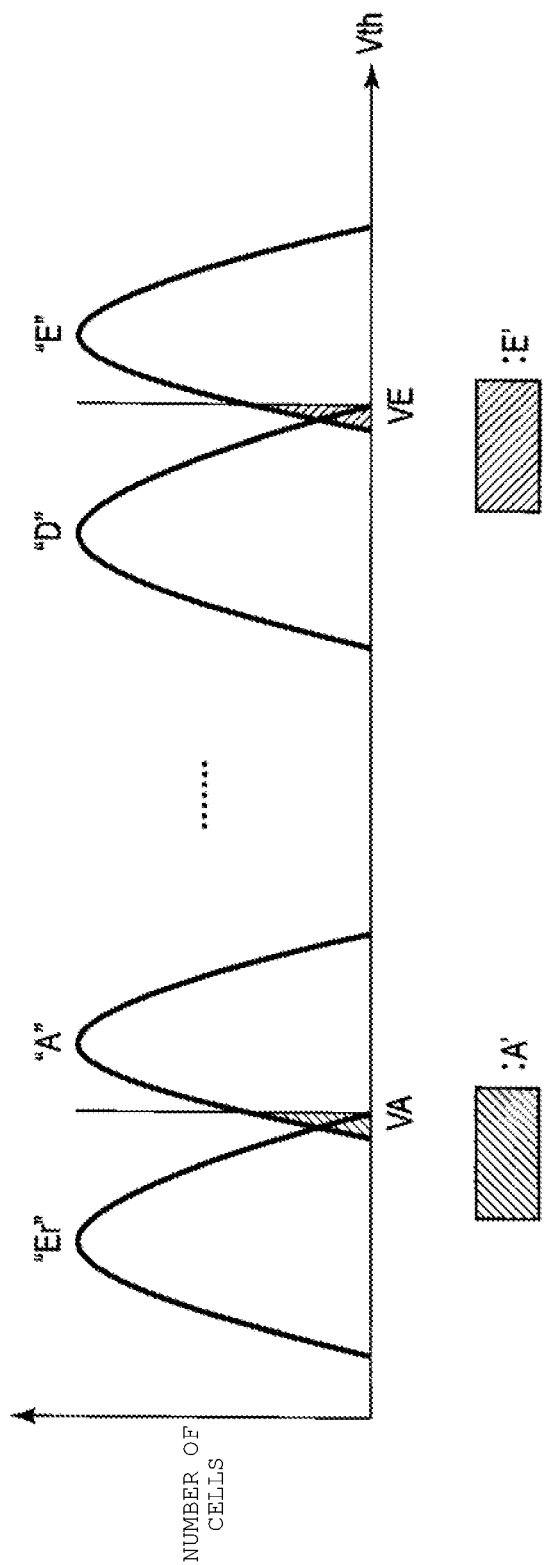
FIG. 24 is a diagram showing a change in the threshold voltage level of the memory cell.

As shown in FIG. 24, in the NAND flash memory 10, a threshold voltage distribution of each state may expand and shift with the elapse of time or due to stress on the memory cell transistor MT.

Accordingly, the threshold voltages of several memory cell transistors MT programmed in the "A" state ("A" level) may be lower than the read voltage VA. A range (hatched area) which is surrounded by a portion under a normal distribution curve corresponding to the "A" state and the voltage VA represents the number of memory cell transistors MT of which the threshold voltages are decreased to be less than the read voltage VA (the states of the memory cell transistors MT are referred to as the "A" state). For the period of the read operation AR, the memory cell transistors MT in a "A'" state may be turned on, and thus, the read data includes an error.

Similarly, the threshold voltages of several memory cell transistors MT programmed in the "E" state may be lower than the read voltage VE. A range (hatched area) which is surrounded by a portion under a normal distribution curve corresponding to the "E" state and the voltage VE represents the number of memory cell transistors MT of which the threshold voltages are decreased to be less than the read voltage VE (the states of the memory cell transistors MT are referred to as the "E" state).

Figure 25:
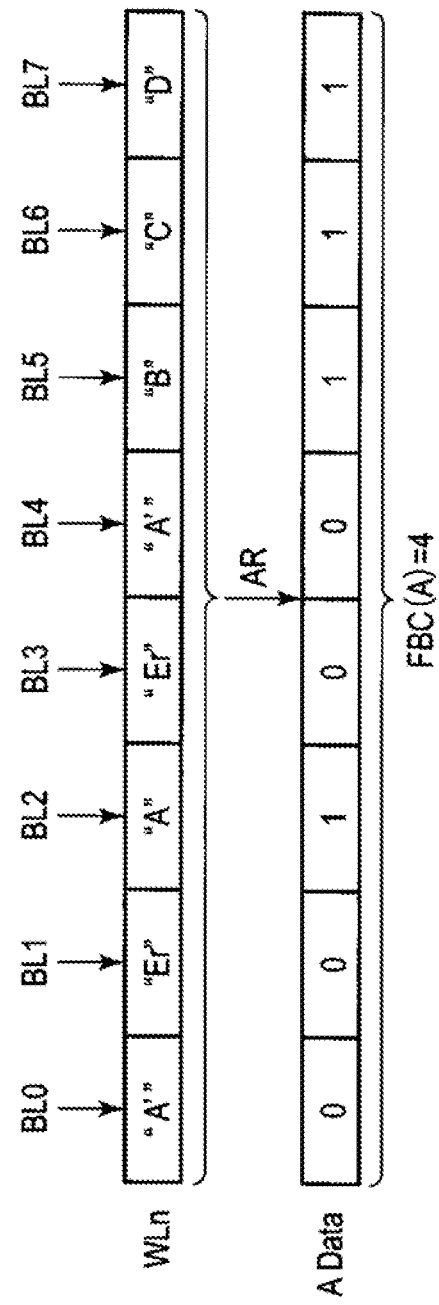
FIG. 25 is a diagram showing a read operation AR and the fail bit count operation performed by the non-volatile semiconductor storage device of the second embodiment.

FIG. 25 shows the read operation AR and the fail bit count operation.

In FIG. 25, it is assumed that eight memory cell transistors MT are connected to the selected word line WLn for simplicity of illustration. The memory cell transistor MT corresponding to the bit line BL0 enters the "A" state, the memory cell transistor MT corresponding to the bit line BL1 enters the "Er" state, the memory cell transistor MT corresponding to the bit line BL2 enters the "A" state, the memory cell transistor MT corresponding to the bit line BL3 enters the "Er" state, the memory cell transistor MT corresponding to the bit line BL4 enters the "A" state, the memory cell transistor MT corresponding to the bit line BL5 enters the state, the memory cell transistor MT corresponding to the bit line BL6 enters the "C" state, and the memory cell transistor MT corresponding to the bit line BL7 enters the "D" state.

The voltage VA is applied to the selected word line WLn, as the read voltage VCGRV during the read operation AR. The memory cell transistor MT corresponding to the bit line BL0 is turned on. The memory cell transistor MT corresponding to the bit line BL1 is turned on. The memory cell transistor MT corresponding to the bit line BL2 is turned off. The memory cell transistor MT corresponding to the bit line BL3 is turned on. The memory cell transistor MT corresponding to the bit line BL4 is turned on. The memory cell transistors MT corresponding to the bit lines BL5 to BL7 are turned off. As a result, the data (A Data) read from the bit lines BL0 to BL7 from the memory cell transistors MT connected to the selected word line WLn is "0, 0, 1, 0, 0, 1, 1, 1". The number (FBC(A)) of data items of "0" within the data (A Data) is counted. The FBC(A) indicates the number of on-cells. In this example, the FBC(A) is 4. A value of the FBC(A) is stored in the register 23B.

FIG. 26 shows an example of a mode (also referred to as function) capable of being set by the set feature command.

The control circuit 23 has a "XNOR" function, a "Each State" function, a "Start and End Col" function, a "Read cycles" function, a "VCG Step" function, and a "TEMPCODE Update Option" function.

In an operation in which data is read multiple times in each state, when the "XNOR" function is available, a difference between the number of on-cells acquired an initial read operation corresponding to a certain state and the number of on-cells acquired in a next read operation corresponding to this state is acquired.

When the "Each State" function is available, the number of on-cells is counted in each state.

When the "Start and End Col" function is available, the number of on-cells included in not all the data items within the XDL but the designated data range is counted.

For example, the "Read cycles" function enables an arbitrary value of 1 to 15 to be designated as the read cycles. When two or more read cycles are designated, an operation in which the data is read multiple times.

The "VCG Step" function selects a step width for raising the read voltage VCGRV. When a small step width is selected, the read voltage VCGRV is gradually raised with the small step width. When a large step width is selected, the read voltage VCGRV is gradually raised with the large step width. The number of candidates of the step width may be three or more.

The "TEMPCODE Update Option" function designates the number of times of temperature measurement to be performed during the operation in which the data is read multiple times.

Figure 27:
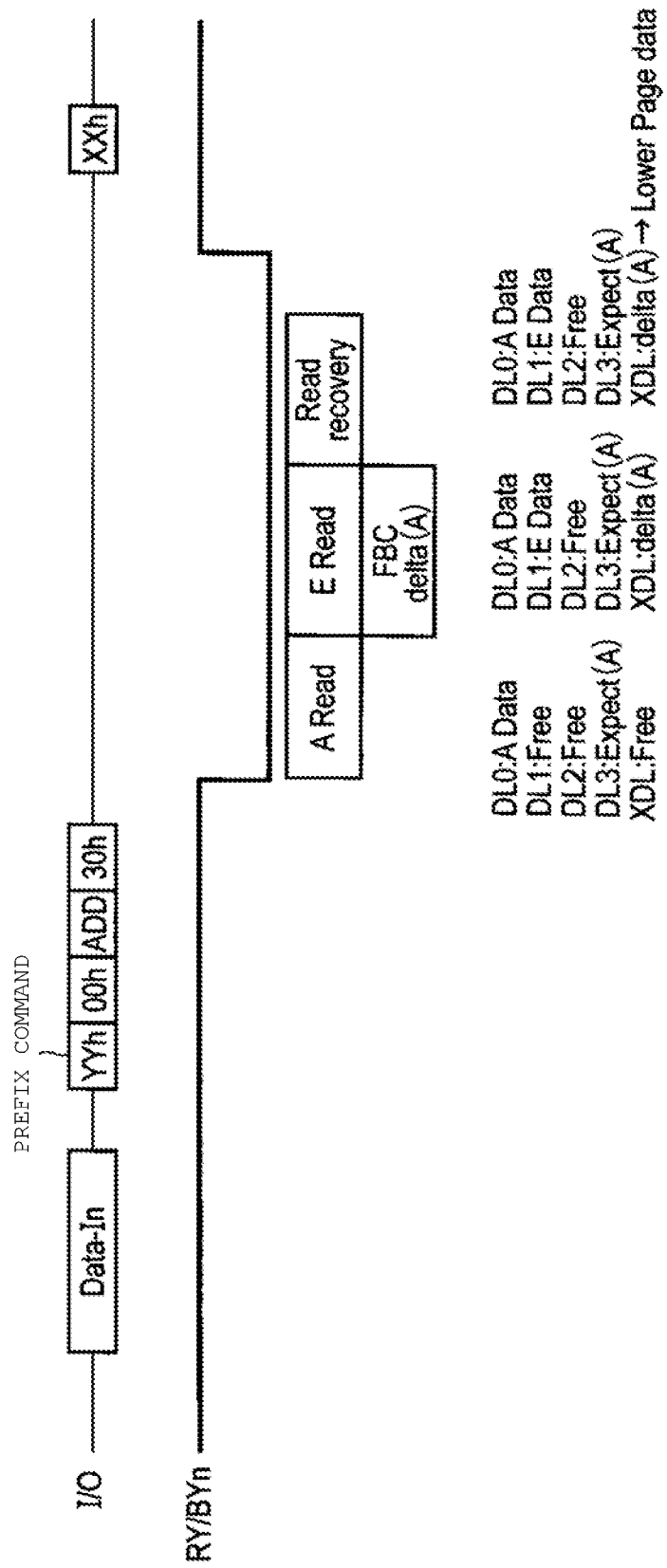
FIG. 27 is a diagram showing the data read/fail bit count operation performed by the non-volatile semiconductor storage device of the second embodiment in a test mode.

FIG. 27 shows the data read/fail bit count operation performed by the NAND flash memory 10 in the test mode.

In the test mode, the NAND flash memory 10 may count a different between the number of on-cells designated by the expected value data and the actual number of on-cells, as the fail bit count.

As shown in FIG. 27, the memory controller 200 initially transmits expected value data (Data In) corresponding to data (hereinafter, referred to as data X) read from the memory core 12 to the NAND flash memory 10. For example, in a test for checking the number of memory cell transistors MT turned on when the read operation AR (A Read) for a certain lower page is performed, the memory controller 200 may transmit a data pattern to be read by the read operation AR (A Read), as the expected value data, to the NAND flash memory 10.

In the NAND flash memory 10, the expected value data (Data In) received from the memory controller 200 is transmitted to a data latch DL3 from the I/O control circuit 16 via the XDL. Hereinafter, the expected value data (Data In) is referred to as expected value data Expect(A). The Expect(A) is a data pattern expected to be read by the read operation AR (A Read).

Subsequently, the memory controller 200 transmits a read command sequence (command YYh, command 00h, address ADD, and command 30h) for designating the data read operation and the fail bit count operation to the NAND flash memory 10.

In the NAND flash memory 10, the read operation AR (A Read) is performed. In the read operation AR (A Read), the voltage VA is applied to the selected word line WLn, as the read voltage VCGRV. The data (A DATA) read from the group of memory cell transistors MT connected to the selected word line WLn is stored in the DL0.

Subsequently, the read operation ER (E Read) is performed. In the read operation ER (E Read), the voltage VE is applied to the selected word line WLn, as the read voltage VCGRV. The data (E DATA) read from the group of memory cell transistors MT connected to the selected word line WLn is stored in the DL1.

For the period of the read operation ER (E Read), difference data (delta(A)) between the expected value data Expect (A) and the data (A DATA) is acquired by OP, and the difference data (delta(A)) is stored in the XDL. The difference data (delta(A)) may be acquired by the XNOR operation of the Expect (A) and the A DATA. The control circuit 23 counts the fail bit count (FBC delta(A)) based on the difference data (delta(A)) within the XDL. The fail bit count (FBC delta(A)) indicates a difference between the number of on-cells indicated by the expected value data and the actual number of on-cells. The fail bit count (FBC delta (A)) is stored in the register 23B.

When the read operation ER (E Read) is completed, a read recovery operation in which the word lines WL0 to WL7 and the bit lines BL0 to BL (L-1) is reset is performed. For a period of the read recovery operation, the lower page data is generated from the data (A DATA) and the data (E DATA), and the lower page data is stored instead of the difference data (delta(A)) in the XDL.

When the NAND flash memory 10 receives the command XXh from the memory controller 200, the fail bit count (FBC delta(A)) stored in the register 23B is output to the memory controller 200.

Although it has been described in FIG. 27 that the number of on-cells (in this example, FBC delta(A)) corresponding to the "A" state is counted, the number of on-cells (for example, FBC delta(E)) corresponding to the "E" state may be counted, or both the FBC delta (A) and the FBC delta(E) may be counted.

Figure 28:
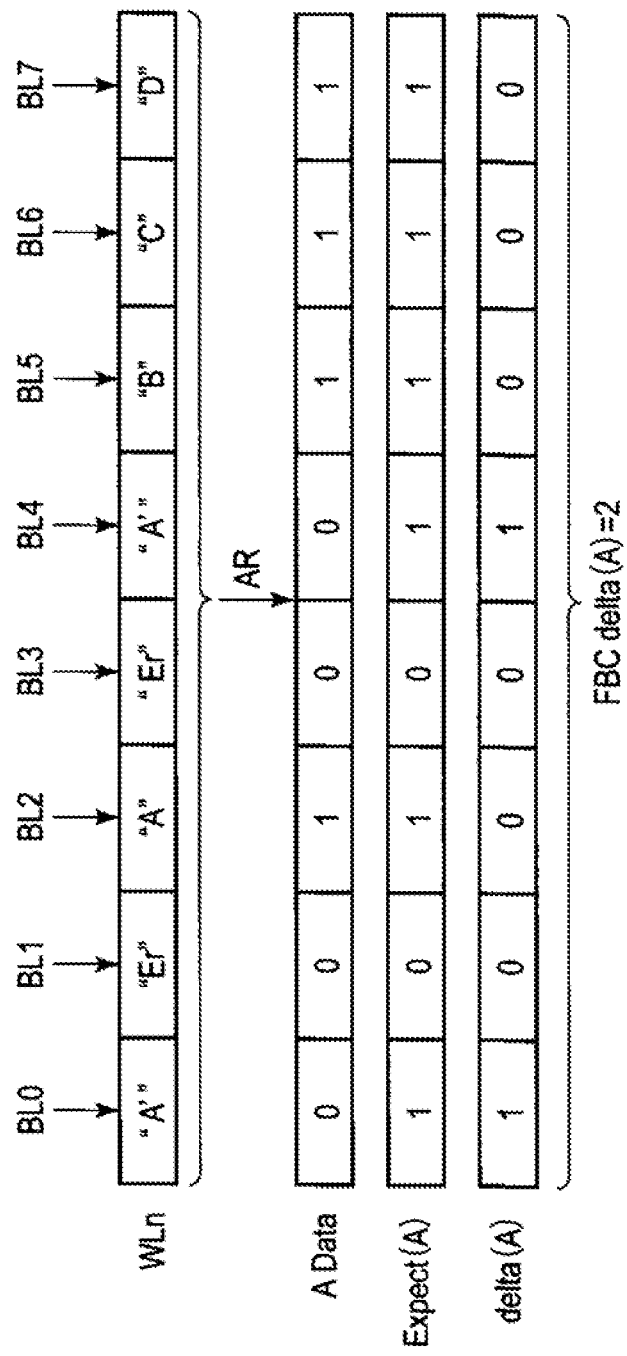
FIG. 28 is a diagram showing an example of the data read/fail bit count operation.

FIG. 28 shows an example of the data read/fail bit count operation.

In the topmost stage of FIG. 28, the states corresponding to the memory cell transistors MT connected to the selected word line WLn are depicted. The memory cell transistor MT corresponding to the bit line BL0 enters the "A'" state, the memory cell transistor MT corresponding to the bit line BL1 enters the "Er" state, the memory cell transistor MT corresponding to the bit line BL2 enters the "A" state, the memory cell transistor MT corresponding to the bit line BL3 enters the "Er" state, the memory cell transistor MT corresponding to the bit line BL4 enters the "A'" state, the memory cell transistor MT corresponding to the bit line BL5 enters the state, the memory cell transistor MT corresponding to the bit line BL6 enters the "C" state, and the memory cell transistor MT corresponding to the bit line BL7 enters the "D" state.

The read operation AR (A Read) is performed. Accordingly, the data (A DATA) is read from the memory cell transistors MT. The data of "0" is read from the turned-on memory cell transistor MT, and the data of "1" is read from the memory cell transistor MT maintained in the OFF state. The data (A Data) read from the bit lines BL0 to BL7 from the memory cell transistors MT connected to the selected word line WLn is "0, 0, 1, 0, 0, 1, 1, 1". The data pattern of the expected value data Expect(A) is "1, 0, 1, 0, 1, 1, 1, 1". This is because it is expected that the memory cell transistors MT which respectively correspond to the bit lines BL0 and BL4 enter the "A" state.

The difference data (delta(A)) between the expected value data Expect(A) and the data (A DATA) is acquired. The difference data (delta(A)) may be acquired by the XNOR operation of the Expect (A) and the A DATA. The control circuit 23 counts the number of "1"s (in this example, 2) within the difference data (delta(A)), as the fail bit count (FBC delta(A)). The fail bit count (FBC delta (A)) indicates a difference between the number of on-cells indicated by the expected value data and the actual number of on-cells.

Alternatively, a value acquired by subtracting the number of data items of "0" included in the expected value data Expect (A) from the number of data items of "0" included in the data (A Data) may be calculated as the fail bit count.

Figure 29:
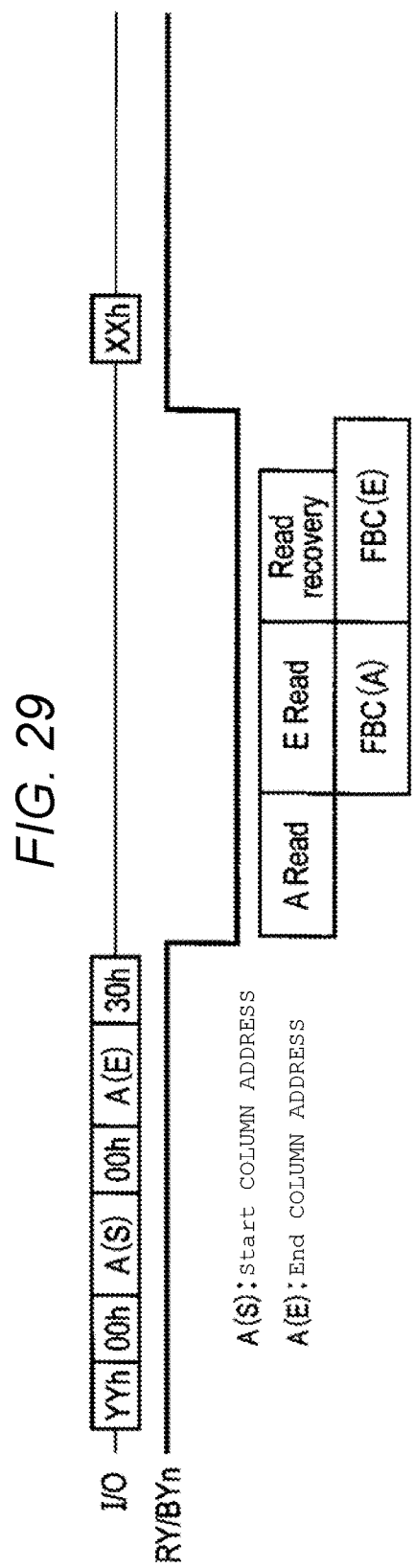
FIG. 29 is a diagram showing the fail bit count function capable of designating a start column and an end column by the memory controller.

FIG. 29 shows the fail bit count function capable of designating a start column and an end column by the memory controller 200.

The memory controller 200 may enable the "Start and End Col" function by transmitting the set feature command sequence to the NAND flash memory 10. The "Start and End Col" function is a function of counting the number of on-cells based on only the data in the designated range rather than counting the number of on-cells based on the all the data items corresponding to one page when the fail bit count operation is performed.

The memory controller 200 transmits a read command sequence (command YYh, command 00h, start column address A(S), command 00h, end column address A(E), and command 30h) for performing the fail bit count operation in which the data range is designated to the NAND flash memory 10. In this example, the start column address A(S) is used for designating a start position of a count range in which the fail bit count operation is to be performed. The end column address A(E) is used for designating an end position of the count range.

Hereinafter, the fail bit count operation when the lower page data is read will be described.

The control circuit 23 of the NAND flash memory 10 performs the read operation AR (A Read) for applying the voltage VA to the selected word line WLn, the read operation ER (E Read) for applying the voltage VE to the selected word line WLn, and the read recovery operation in which the word lines WL0 to WL7 and the bit lines BL0 to BL (L-1) are reset. In the read operation AR (A Read), the data (A Data) is read from the group of memory cell transistors MT connected to the selected word line WLn. In the read operation ER (E Read), the data (E Data) is read from the group of memory cell transistors MT.

For the period of the read operation ER (E Read), the data (A Data) is transmitted to the XDL, and the control circuit 23 performs the fail bit count operation in which the number (FBC(A)) of data items of "0" included in the count range in the data (A Data) is counted. The FBC(A) is stored in the register 23B.

For the period of the read recovery operation, the data (E Data) is transmitted to the XDL, and the control circuit 23 performs the fail bit count operation in which the number (FBC(E)) of data items of "0" included in the count range in the data (E Data) is counted. The FBC(E) is also stored in a remaining empty area of the register 23B. The lower page data acquired from the data (A Data) and the data (E Data) is stored in the XDL.

When the read recovery operation is completed, the NAND flash memory 10 is returned to the ready state from the busy state. When the command (for example, XXh) is received from the memory controller 200, the control circuit 23 outputs the FBC(A) and the FBC(E) within the register 23B to the memory controller 200. The memory controller 200 may read the lower page data from the XDL by asserting a signal REn.

Figure 30:
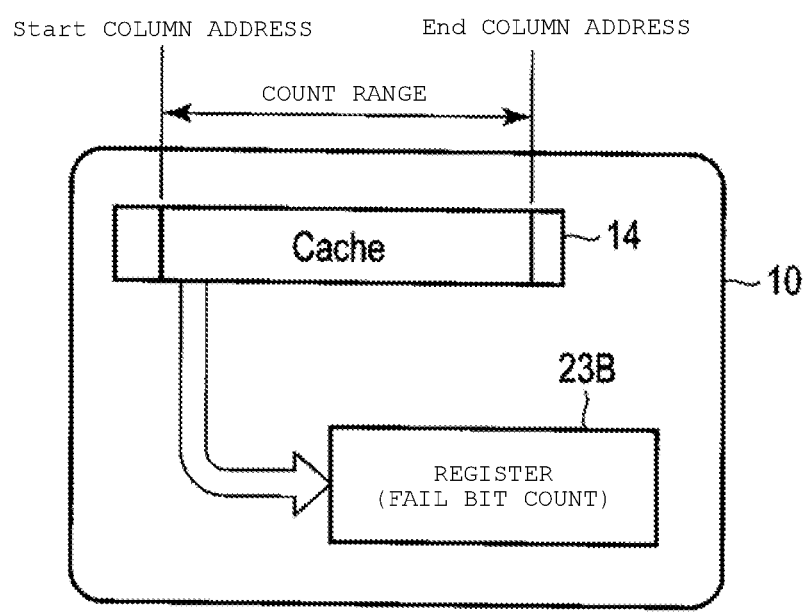
FIG. 30 is a diagram showing the fail bit count operation performed based on data within a count range defined by the designated start column and end column.

FIG. 30 shows the fail bit count operation performed based on the data in the count range defined by the designated start column and end column.

A data portion in a range designated by the start column address A(S) and the end column address A(E) is specified from the data stored in the cache 14 (XDL). The number of data items of "0" included in the specified data portion is counted as the fail bit count, and the result thereof is stored in the register 23B.

Figure 31:
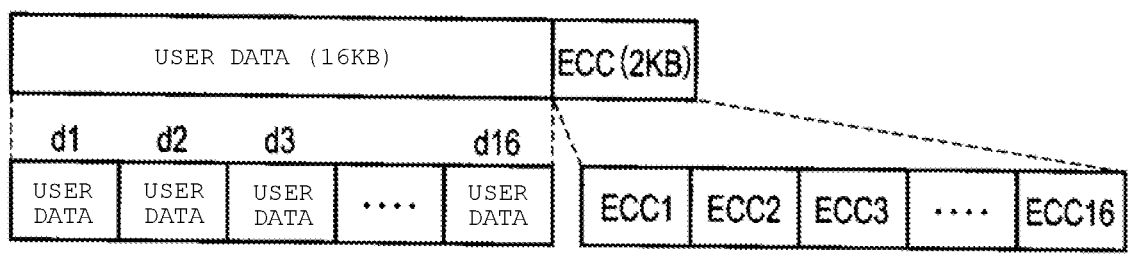
FIG. 31 is a diagram showing an example of the relationship between user data and ECC.

FIG. 31 shows an example of the relationship between the user data and the ECC.

In general, the ECC is generated for each set data size. For example, when the ECC is generated for data of 1 kilobytes, ECC1, ECC2, ECC3, . . . , and ECC 16 corresponding to user data d1, user data d2, user data d3, . . . , and user data d16 are generated. For example, when it is previously known that the number of errors occurring in only the data range including the user data d2 and the user data d3 exceeds the number of errors capable of being corrected, the data range including the user data d2 and the user data d3 may be designated as the count range by the start column address A(S) and the end column address A(E), and the fail bit count operation for the designated count range may be performed. In this case, the counter 23A of the control circuit 23 performs the fail bit count operation in which the number of data items of "0" included in the data belonging to the count range is counted, as the number of on-cells. The count range is designated in this manner, and thus, it is possible to efficiently perform the fail bit count operation.

Figure 32:
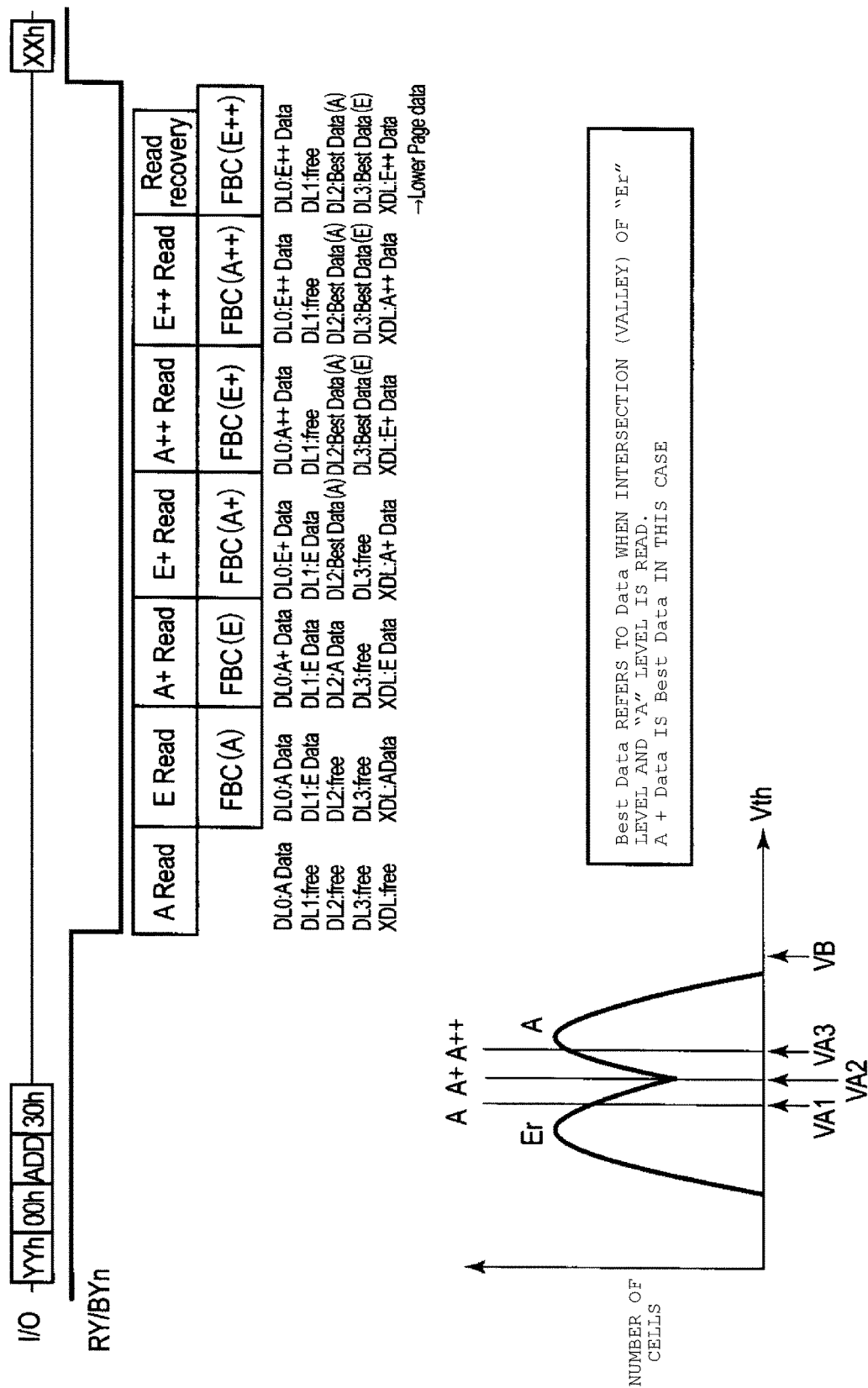
FIG. 32 is a diagram showing an operation in which data is read multiple times in each state which is performed by the non-volatile semiconductor storage device of the second embodiment.

FIG. 32 shows an operation in which data is read multiple times in each state, which is performed by the NAND flash memory 10.

For example, when three read cycles are designated and the read operation of the lower page is performed, a read operation AR (A Read), a read operation ER (E Read), a read operation AR (A+ Read), a read operation ER (E+ Read), a read operation AR (A++ Read), and a read operation ER (E++ Read) are performed in this order.

Three voltage values VA1, VA2, and VA3 near the voltage VA are respectively used in the read operation AR (A Read), the read operation AR (A+ Read), and the read operation AR (A++ Read) as shown in the lower left side of FIG. 32 (VA1<VA2<VA3 and VA3<VB).

Similarly, three voltage values VE1, VE2, and VE3 near the voltage VE are respectively used in the read operation ER (E Read), the read operation ER (E+ Read), and the read operation ER (E++ Read) (VE1<VE2<VE3, VD<VE1, and VE3<VF).

The memory controller 200 transmits a read command sequence (command YYh, command 00h, address ADD, and command 30h) for counting the number of on-cells changed according to the value of the read voltage applied to the selected word line to the NAND flash memory 10.

The control circuit 23 performs the read operation AR (A Read). In the read operation AR (A Read), the voltage VA1 is applied to the selected word line WLn designated by the address ADD. The data (A Data) is read into the bit lines BL0 to BL (L-1) from the group of memory cell transistors MT connected to the selected word line WLn. The data (A Data) is stored in the data latch DL0.

The control circuit 23 performs the read operation ER (E Read). In the read operation ER (E Read), the voltage VE1 is applied to the selected word line WLn. The data (E Data) is read into the bit lines BL0 to BL (L-1) from the group of memory cell transistors MT connected to the selected word line WLn. The DL0 stores the data (A Data), the DL1 stores the data (E Data), and the XDL stores the data (A Data). The control circuit 23 counts the number (FBC(A)) of data items of "0" within the data (A Data) of the XDL. This FBC(A) is stored in the register 23B.

The control circuit 23 performs the read operation AR (A+ Read). In the read operation AR (A+ Read), the voltage VA2 is applied to the selected word line WLn. The data (A+ Data) is read into the bit lines BL0 to BL (L-1) from the group of memory cell transistors MT connected to the selected word line WLn. The DL0 stores the data (A+ Data), the DL1 stores the data (E Data), the DL2 stores the data (A Data), and the XDL stores the data (E Data). The control circuit 23 counts the number (FBC(E)) of data items of "0" in the data (E Data) of the XDL. The FBC(E) is stored in a remaining empty area of the register 23B.

The control circuit 23 performs the read operation ER (E+ Read). In the read operation ER (E+ Read), the voltage VE2 is applied to the selected word line WLn. The data (E+Data) is read into the bit lines BL0 to BL (L-1) from the group of memory cell transistors MT connected to the selected word line WLn. The DL0 stores the data (E+ Data), the DL1 stores the data (E Data), the DL2 stores the data (Best Data and the XDL stores the data (A+ Data). The control circuit 23 counts the number (FBC(A+)) of data items of "0" in the data (A+ Data) of the XDL. The FBC(A+) is stored in a remaining empty area of the register 23B. The Best Data(A) is selected from the data (A+ Data) or the data (A Data). For example, when FBC(A+)−FBC(A)<X is satisfied, the data (A+ Data) may be selected as the Best Data(A). When FBC(A+)−FBC(A)<X is not satisfied, the data (A Data) may be selected as the Best Data(A). X is a constant.

The control circuit 23 performs the read operation AR (A++ Read). In the read operation AR (A++ Read), the voltage VA3 is applied to the selected word line WLn. The data (A++ Data) is read into the bit lines BL0 to BL (L-1) from the group of memory cell transistors MT connected to the selected word line WLn. The DL0 stores the data (A++ Data), the DL2 stores the data (Best Data the DL3 stores the data (Best Data(E)), and the XDL stores the data (E+ Data). The control circuit 23 counts the number (FBC(E+) of data items of "0") in the data (E+ Data) of the XDL. The FBC(E+) is stored in a remaining empty area of the register 23B. The Best Data (E) is selected from the data (E+ Data) or the data (E Data). For example, when FBC(E+)−FBC(E)<X is satisfied, the data (E+ Data) may be selected as the Best Data(E). When FBC(E+)−FBC(E)<X is not satisfied, the data (E Data) may be selected as the Best Data(E).

The control circuit 23 performs the read operation ER (E++ Read). In the read operation ER (E++ Read), the voltage VE3 is applied to the selected word line WLn. The data (E++ Data) is read into the bit lines BL0 to BL (L-1) from the group of memory cell transistors MT connected to the selected word line WLn. The DL0 stores the data (E++ Data), the DL2 stores the data (Best Data the DL3 stores the data (Best Data(E)), and the XDL stores the data (A++ Data). The control circuit 23 counts the number (FBC(A++)) of data items of "0" in the data (A++ Data) of the XDL. The FBC(A++) is stored in a remaining empty area of the register 23B. The Best Data(A) is selected from the current Best Data (A) or the data (A++ Data). For example, when (FBC(A++)−FBC(A+))<(FBC(A+)−FBC(A)) is satisfied, the Best Data(A) may be updated, and thus, the data (A++ Data) may be new Best Data(A). When (FBC(A++)−FBC(A+))<(FBC(A+)−FBC(A)) is not satisfied, the current Best Data(A) may be maintained with no change.

In the period of the read recovery operation, the DL0 stores the data (E++ Data), the DL2 stores the data (Best Data the DL3 stores the data (Best Data(E)), and the XDL stores the data (E++ Data). The control circuit 23 counts the number (FBC(E++)) of data items of "0" in the data (E++ Data) of the XDL. The FBC(E++) is stored in a remaining empty area of the register 23B. The Best Data(E) is selected from the current Best Data (E) or the data (E++ Data). For example, when (FBC(E++)−FBC(E+))>(FBC(E+)−FBC(E)) is satisfied, the Best Data (E) may be updated, and thus, the data (E++ Data) may be new Best Data(E). When (FBC(E++)−FBC(E+))>(FBC(E+)−FBC(E)) is not satisfied, the current Best Data(E) may be maintained with no change. The data of the XDL is changed to the lower page data from the data (E++ Data). The lower page data is generated from the Best Data (A) and the Best Data (E).

Figure 33:
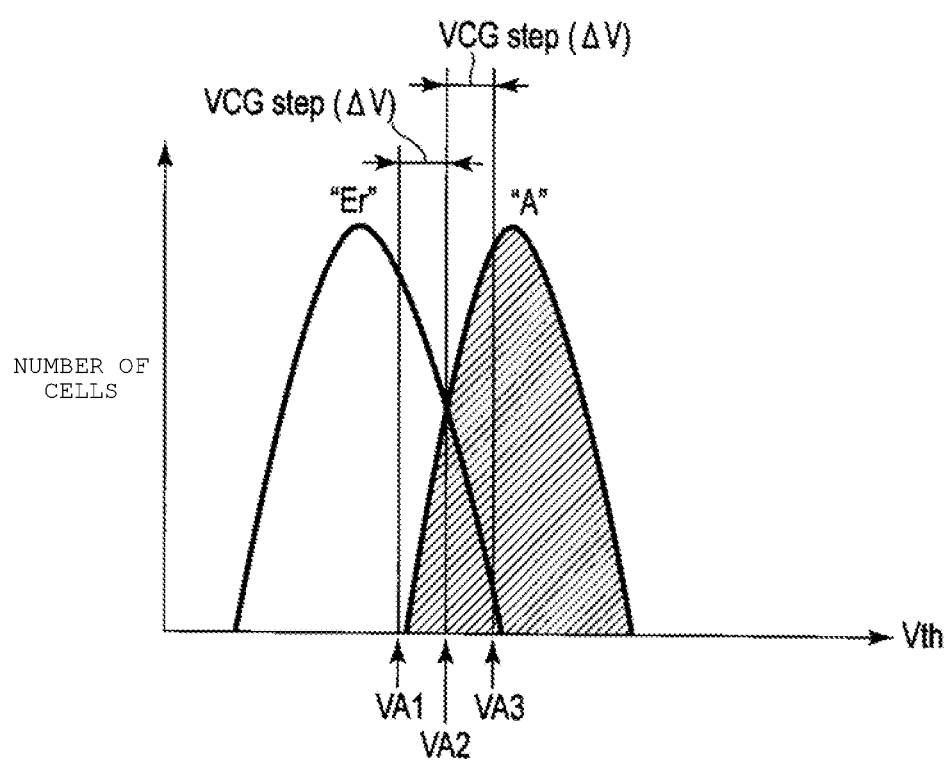
FIG. 33 is a diagram showing a VCG step width used for performing the operation in which the data is read multiple times in each state.

FIG. 33 shows a VCG step width used for performing the operation in which the data is read multiple times in each state.

The memory controller 200 may select any one of VCG step width #1 and VCG step width #2 (VCG step width #1<VCG step width #2). The VCG step width #1 and the VCG step width #2 correspond to the small step width and the large step width, respectively.

In the operation in which the data is read multiple times in each state, when the VCG step width #1 is selected, the read voltage VCGRV is raised by voltage ΔV#1 corresponding to the VCG step width #1 whenever the data is read. When the VCG step width #2 is selected, the read voltage VCGRV is raised by voltage ΔV#2 corresponding to the VCG step width #2 whenever the data is read (voltage ΔV#1<voltage ΔV#2). Each of ΔV#1 and ΔV#2 may be acquired from only a digital value indicating the VCG step width. Alternatively, each of ΔV#1 and ΔV#2 may be acquired by using a function F (VCG step width and temperature) of the digital value indicating the VCG step width and the temperature.

Figure 34:
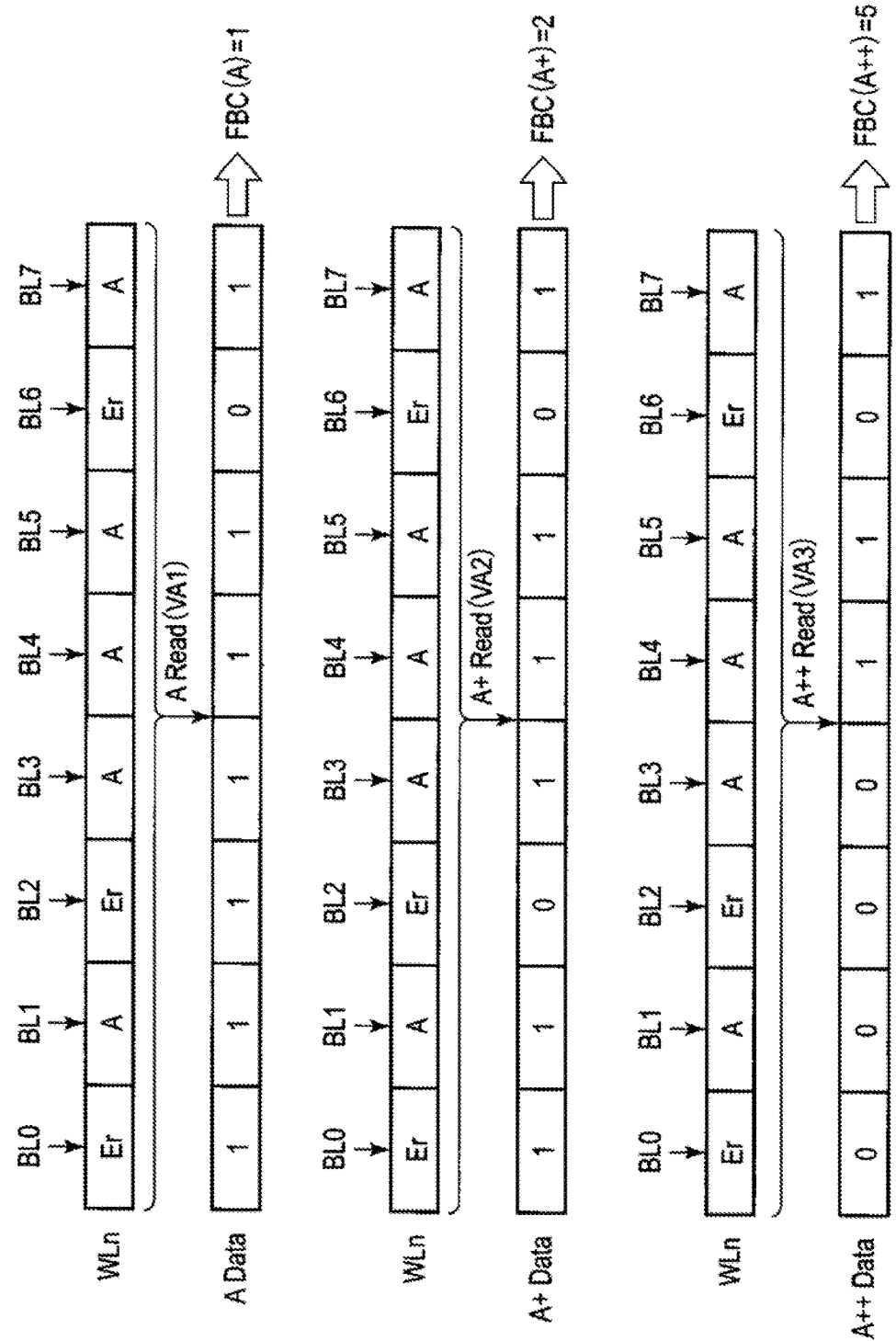
FIG. 34 is a diagram showing an example of the data read/fail bit count operation performed by the non-volatile semiconductor storage device of the second embodiment when the data is read multiple times in each state.

FIG. 34 shows an example of the data read/fail bit count operation performed when the data is read multiple times in each state.

In FIG. 34, it is assumed that eight memory cell transistors MT are connected to the selected word line WLn for simplicity of illustration.

The memory cell transistor MT corresponding to the bit line BL0 enters the "Er" state, the memory cell transistor MT corresponding to the bit line BL1 enters the "A" state, the memory cell transistor MT corresponding to the bit line BL2 enters the "Er" state, the memory cell transistor MT corresponding to the bit line BL3 enters the "A" state, the memory cell transistor MT corresponding to the bit line BL4 enters the state, the memory cell transistor MT corresponding to the bit line BL5 enters the "A" state, the memory cell transistor MT corresponding to the bit line BL6 enters the "Er" state, and the memory cell transistor MT corresponding to the bit line BL7 enters the "A" state.

Hereinafter, it is assumed that VA1, VA2 and VA3 are set in an overlap area of the threshold voltage distribution of the "Er" state and the threshold voltage distribution of the "A" state as shown in FIG. 33.

Initially, the voltage VA1 is applied to the selected word line WLn. The voltage VA1 is lower than the maximum threshold voltage of the "Er" state. Accordingly, among the memory cell transistors MT belonging to the "Er" state, the memory cell transistors MT of which the threshold voltages are less than the voltage VA1 are turned on, and the memory cell transistors MT (the memory cell transistors MT belonging to the area surrounded by a portion under the normal distribution curve of the "Er" state and the voltage VA1) of which the threshold voltages are equal to or greater than the voltage VA1 are turned off. Accordingly, a relatively large number of memory cell transistors MT corresponding to the "Er" state are turned off. Almost all the memory cell transistors MT belonging to the "A" state are turned off. Accordingly, for example, 1, 1, 1, 1, 1, 1, 0, 1 is read as the data (A DATA). The number (FBC (A)) of on-cells when the voltage VA1 is applied is 1.

The voltage VA2 is applied to the selected word line WLn. In the memory cell transistor MT belonging to the "Er" state, the number of turned-on memory cell transistors MT is increased. Accordingly, for example, 1, 1, 0, 1, 1, 1, 0, 1 is read as the data (A+ DATA). The number (FBC (A+)) of on-cells when the voltage VA2 is applied is 2.

The voltage VA3 is applied to the selected word line WLn. Almost all the memory cell transistors MT belonging to the "Er" state are turned on. In the memory cell transistor MT belonging to the "A" state, several memory cell transistors MT are turned on. Accordingly, for example, 0, 0, 0, 0, 1, 1, 0, 1 is read as the data (A++ DATA). The number (FBC (A++)) of on-cells when the voltage VA3 is applied is 5.

Figure 35:
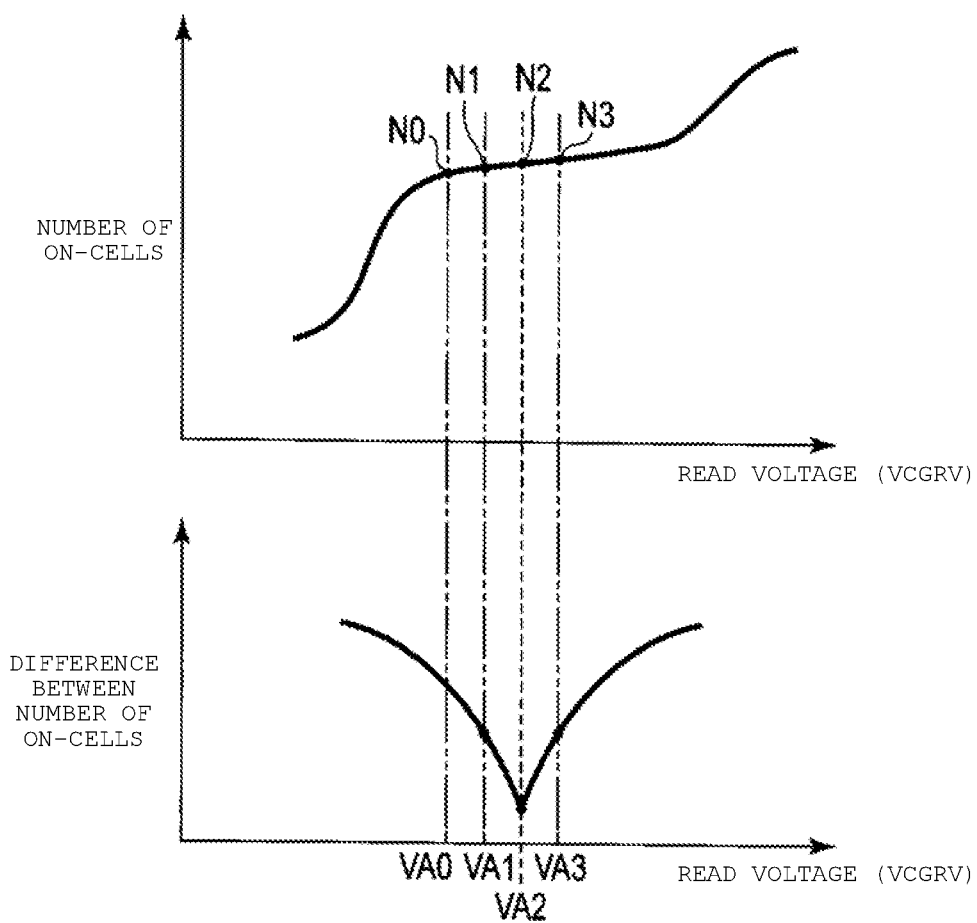
FIG. 35 is a diagram showing an operation in which an optimum read voltage corresponding to an intersection of two states is acquired from the number of on-cells changed according to a read voltage.

FIG. 35 shows an operation in which an optimum read voltage corresponding to an intersection of two states is acquired from the number of on-cells changes according to the read voltage.

A top side of FIG. 35 shows the relationship between the read voltage VCGRV and the number of on-cells. A bottom side of FIG. 35 shows the relationship between the read voltage VCGRV and the difference in the number of on-cells between the read voltage adjacent to each other.

In this example, it is assumed that the voltages VA0, VA1, VA2, and VA3 are used as the read voltage VCGRV (VA0<VA1<VA2<VA3). N0 indicates the number of on-cells when the voltage VA0 is applied to the selected word line WLn, N1 indicates the number of on-cells when the voltage VA1 is applied to the selected word line WLn, N2 indicates the number of on-cells when the voltage VA2 is applied to the selected word line WLn, and N3 indicates the number of on-cells when the voltage VA3 is applied to the selected word line WLn. A difference (N1−N0) in the number of on-cells indicates the number of on-cells increased by raising the read voltage VCGRV to VA1 from VA0. Similarly, a difference (N2−N1) in the number of on-cells indicates the number of on-cells increased by raising the read voltage VCGRV to VA2 from VA1, and a difference (N3−N2) in the number of on-cells indicates the number of on-cells increased by raising the read voltage VCGRV to VA3 from VA2. The differences (N1−N0), (N2−N1), and (N3−N2) in the number of on-cells are plotted on the graph of FIG. 35, and thus, the threshold voltage distribution of the memory cell transistors MT may be drawn. It is possible to acquire the optimum read voltage corresponding to the intersection between the threshold voltage distribution of the "Er" state and the threshold voltage distribution of the "A" state.

Figure 36:
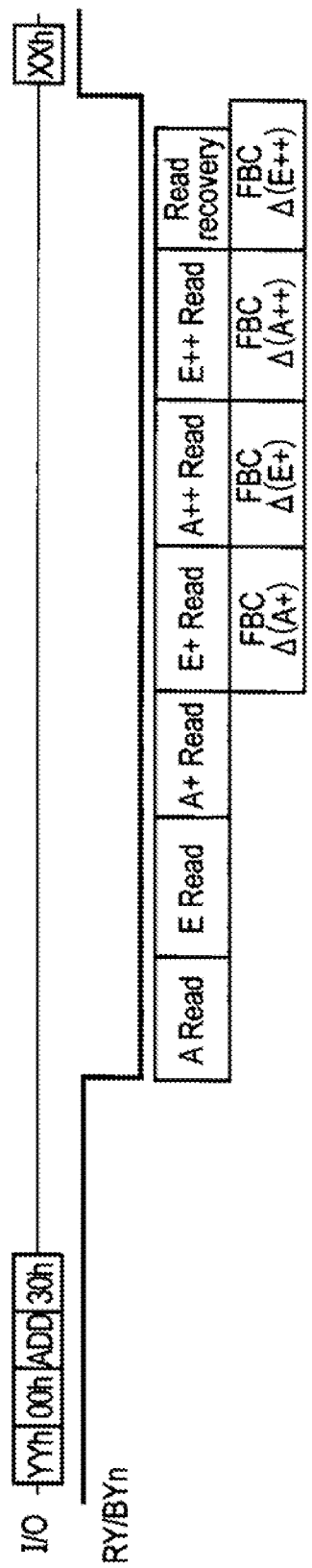
FIG. 36 is a diagram showing another example of the operation in which the data is read multiple times in each state which is performed by the non-volatile semiconductor storage device of the second embodiment.

FIG. 36 shows another example of reading the data multiple times in each state.

The control circuit 23 performs the read operation AR (A Read). In the read operation AR (A Read), the voltage VA1 is applied to the selected word line WLn. The data (A Data) is read into the bit lines BL0 to BL (L-1) from the group of memory cell transistors MT connected to the selected word line WLn.

The control circuit 23 performs the read operation ER (E Read). In the read operation ER (E Read), the voltage VE1 is applied to the selected word line WLn. The data (E Data) is read into the bit lines BL0 to BL (L-1) from the group of memory cell transistors MT connected to the selected word line WLn.

The control circuit 23 performs the read operation AR (A+ Read). In the read operation AR (A+ Read), the voltage VA2 is applied to the selected word line WLn. The data (A+ Data) is read into the bit lines BL0 to BL (L-1) from the group of memory cell transistors MT connected to the selected word line WLn.

The control circuit 23 performs the read operation ER (E+ Read). In the read operation ER (E+ Read), the voltage VE2 is applied to the selected word line WLn. The data (E+ Data) is read into the bit lines BL0 to BL (L-1) from the group of memory cell transistors MT connected to the selected word line WLn. For the period of the read operation ER, the control circuit 23 counts the number (FBC(ΔA)) of data items of "0" included in the difference data between the data (A+ Data) and the data (A Data). The FBC(ΔA) is stored in the register 23B. The FBC(ΔA) indicates a difference between the number of on-cells indicating the number of memory cell transistors MT turned on through the application of the voltage VA1 and the number of on-cells indicating the number of memory cell transistors MT turned on through the application of the voltage VA2.

The control circuit 23 performs the read operation AR (A++ Read). In the read operation AR (A++ Read), the voltage VA3 is applied to the selected word line WLn. The data (A++ Data) is read into the bit lines BL0 to BL (L-1) from the group of memory cell transistors MT connected to the selected word line WLn. For the period of the read operation AR, the control circuit 23 counts the number (FBC(ΔE)) of data items of "0" included in the difference data between the data (E+ Data) and the data (E Data). The FBC(ΔE) is stored in the register 23B. The FBC(ΔE) indicates a difference between the number of on-cells indicating the number of memory cell transistors MT turned on through the application of the voltage VE1 and the number of on-cells indicating the number of memory cell transistors MT turned on through the application of the voltage VE2.

The control circuit 23 performs the read operation ER (E++ Read). In the read operation ER (E++ Read), the voltage VE3 is applied to the selected word line WLn. The data (E++ Data) is read into the bit lines BL0 to BL (L-1) from the group of memory cell transistors MT connected to the selected word line WLn. For the period of the read operation ER, the control circuit 23 counts the number (FBC(ΔA++)) of data items of "0" included in the difference data between the data (A++ Data) and the data (A+ Data). The FBC (ΔA++) is stored in the register 23B. The FBC (ΔA++) indicates a difference between the number of on-cells indicating the number of memory cell transistors MT turned on through the application of the voltage VA2 and the number of on-cells indicating the number of memory cell transistors MT turned on through the application of the voltage VA3.

For the period of the read recovery operation, the control circuit 23 counts the number (FBC(ΔE++)) of data items of "0" included in the difference data between the data (E++ Data) and the data (E+ Data). The FBC(ΔE++) is stored in the register 23B. The FBC(ΔE++) indicates the difference between the number of on-cells indicating the number of memory cell transistors MT turned on through the application of the voltage VE2 and the number of on-cells indicating the number of memory cell transistors MT turned on through the application of the voltage VE3.

When the command (XXh) is received from the memory controller 200, the control circuit 23 outputs the FBC(ΔA), the FBC(ΔE), the FBC(ΔA++), and the FBC(ΔE++) stored in the register 23B to the memory controller 200.

Figure 37:
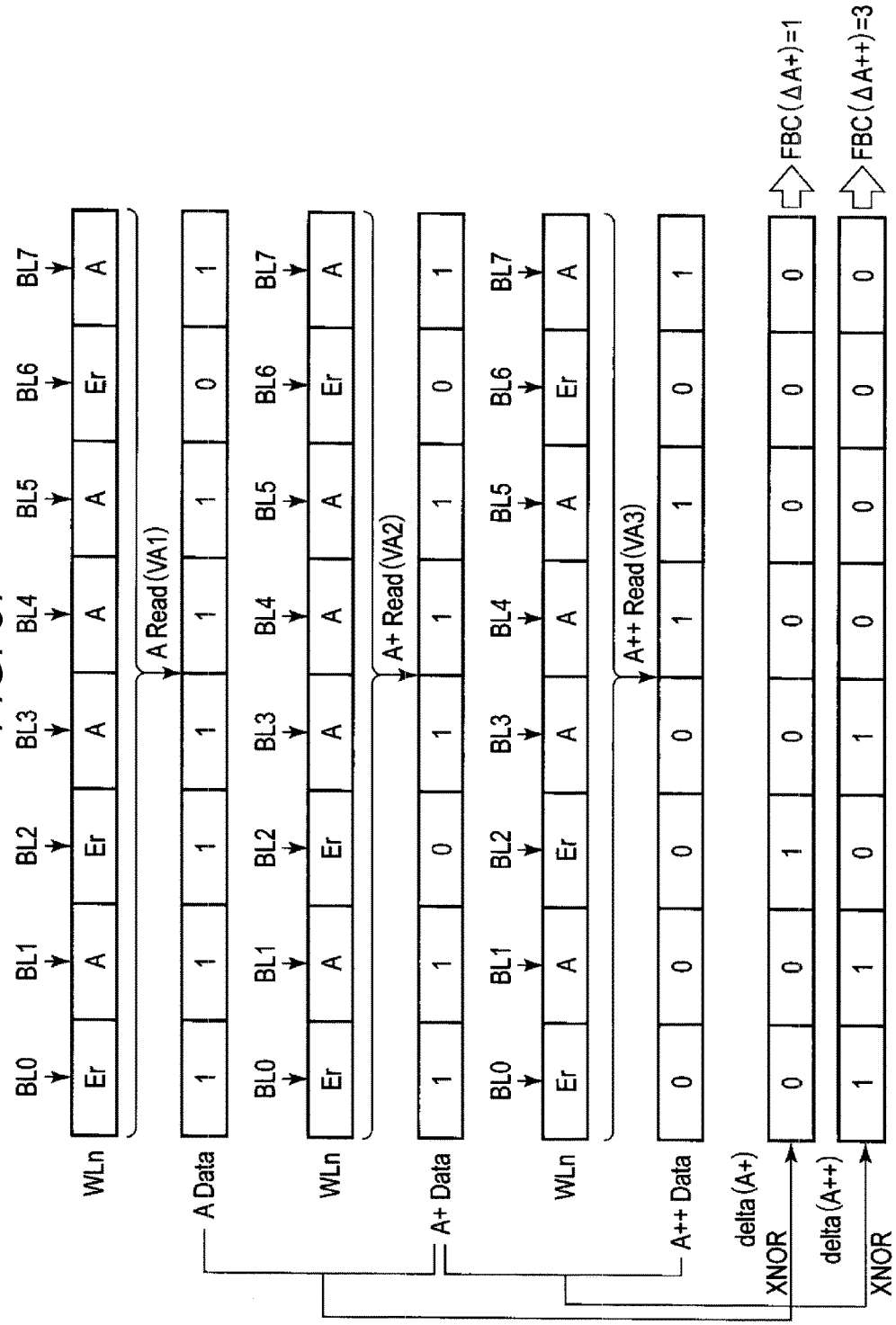
FIG. 37 is a diagram showing another example of the data read/fail bit count operation which is performed by the non-volatile semiconductor storage device of the second embodiment when the data is read multiple times in each state.

FIG. 37 shows examples of the FBC(ΔA) and the FBC (ΔA++) counted in the data read/fail bit count operation of FIG. 36.

In FIG. 37, it is assumed that eight memory cell transistors MT are connected to the selected word line WLn for simplicity of illustration.

The memory cell transistor MT corresponding to the bit line BL0 enters the "Er" state, the memory cell transistor MT corresponding to the bit line BL1 enters the "A" state, the memory cell transistor MT corresponding to the bit line BL2 enters the "Er" state, the memory cell transistor MT corresponding to the bit line BL3 enters the "A" state, the memory cell transistor MT corresponding to the bit line BL4 enters the "A" state, the memory cell transistor MT corresponding to the bit line BL5 enters the "A" state, the memory cell transistor MT corresponding to the bit line BL6 enters the "Er" state, and the memory cell transistor MT corresponding to the bit line BL7 enters the "A" state.

Initially, the voltage VA1 is applied to the selected word line WLn. In this case, the memory cell transistors MT belonging to the area surrounded by a portion under the normal distribution curve of the "Er" state and the voltage VA1 are turned off. Almost all the memory cell transistors MT belonging to the "A" state are turned off. Accordingly, for example, 1, 1, 1, 1, 1, 1, 0, 1 is read as the data (A DATA).

The voltage VA2 is applied to the selected word line WLn. In the memory cell transistor MT belonging to the "Er" state, the number of turned-on memory cell transistors MT is increased. Accordingly, for example, 1, 1, 0, 1, 1, 1, 0, 1 is read as the data (A+ DATA).

The XNOR operation of the data (A DATA) and the data (A+ DATA) is performed, and the difference data (delta (A+)) between the data (A Data) and the data (A+ Data) is acquired. The delta (A+) is 0, 0, 1, 0, 0, 0, 0, 0. The number of "1"s included in the delta (A+) is the FBC ($\Delta$A+). The FBC ($\Delta$A+) is 1.

The voltage VA3 is applied to the selected word line WLn. Almost all the memory cell transistors MT belonging to the "Er" state are turned on. In the memory cell transistor MT belonging to the "A" state, several memory cell transistors MT are turned on. Accordingly, for example, 0, 0, 0, 0, 1, 1, 0, 1 is read as the data (A++ DATA).

The XNOR operation of the data (A+ DATA) and the data (A++ DATA) is performed, and the difference data (delta (A++)) between the data (A+ Data) and the data (A++ Data) is acquired. The delta (A++) is 1, 1, 0, 1, 0, 0, 0, 0. The number of "1"s included in the delta (A++) is the FBC ($\Delta$A++). The FBC ($\Delta$A++) is 3.

Figure 38:
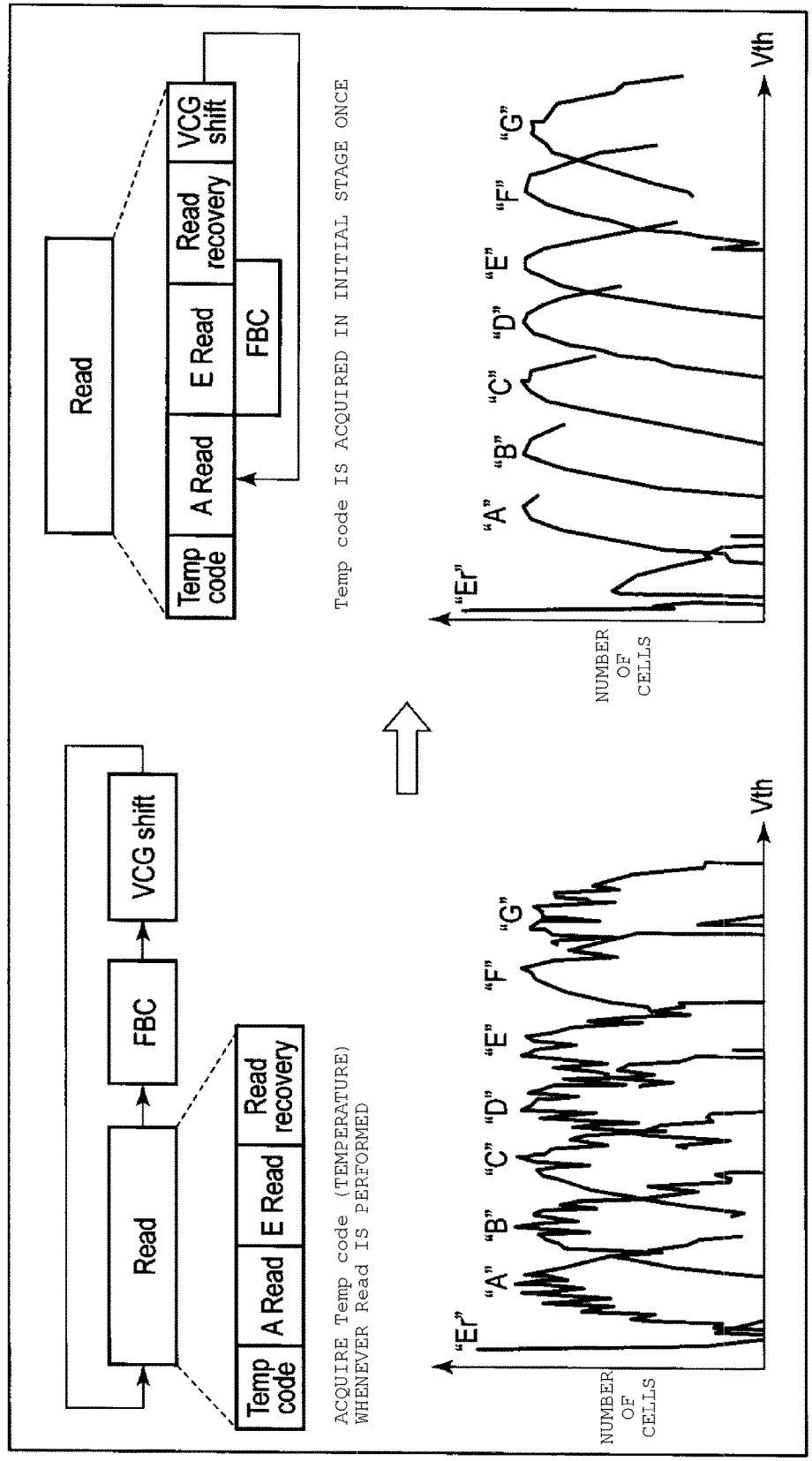
FIG. 38 is a diagram showing the data read/fail bit count operation and a temperature measurement operation performed by the non-volatile semiconductor storage device of the second embodiment.

FIG. 38 shows a temperature measurement operation and the data read/fail bit count operation.

As stated above, in the present embodiment, the operation of reading the data multiple times in each state while shifting the read voltage VCGRV is performed. The read voltage VCGRV is raised by the voltage $\Delta$V corresponding to the VCG step width such as VA1, VA2 (=VA1+$\Delta$V), VA3 (=VA2+$\Delta$V), VE1, VE2 (=VE1+$\Delta$V), and VE3 (=VE2+$\Delta$V) whenever the data is read (VCG shift).

As described in FIG. 33, the actual voltage $\Delta$V may depend on the measured temperature. Thus, when the temperature (represented by TEMP CODE) is acquired whenever the data is read as shown in the left side of FIG. 38, the VCG step width (voltage $\Delta$V) may be changed whenever the data is read. This is because the internal temperature of the chip is changed for the period of the operation of reading the data multiple times. Thus, even though the difference in the number of on-cells caused by only a change in the read voltage VCGRV is desired to be acquired, a noise caused by the change in the temperature is included in the difference in the number of on-cells acquired. As a result, the threshold voltage distribution is not able to be accurately drawn, and it is difficult to acquire the optimum read voltage.

In the present embodiment, in the operation in which the data is read multiple times in each state while shifting the read voltage VCGRV, the control circuit 23 acquires the temperature only once when a first read operation is performed, and does not acquire the temperature in the second and subsequent read operations, as shown in the right side of FIG. 38. Accordingly, it is possible to set the amount (that is, voltage $\Delta$V) by which the read voltage VCGRV is shifted to be constant. The noise caused by the change in the temperature is not included in the difference in the number of on-cells acquired. As a result, the memory controller 200 can accurately draw the threshold voltage distribution, and can acquire the optimum read voltage.

The control circuit 23 performs the following data read/fail bit count operation. Hereinafter, an example in which the FBC(A), the FBC(A+), and the FBC(A++) are acquired will be described.

The control circuit 23 acquires the temperature by the temperature sensor 28. The control circuit 23 performs the read operation (A Read) for applying the voltage VA1 to the selected word line WLn, and subsequently performs the read operation (E Read) for applying the voltage VE1 to the selected word line WLn. The control circuit 23 counts the FBC(A) during the E Read. After the read recovery operation is performed, the control circuit 23 performs control for raising the read voltage VCGRV by the VCG step width. In this case, the voltage $\Delta$V is determined by the acquired temperature and the VCG step width.

The control circuit 23 performs the read operation (A+ Read) for applying the voltage VA2 (=VA1+$\Delta$V) to the selected word line WLn, and subsequently performs the read operation (E+ Read) for applying the voltage VE2 (=VE1+$\Delta$V) to the selected word line WLn. The control circuit 23 counts the FBC(A+) during the E+ Read. After the read recovery operation is performed, the control circuit 23 performs control for raising the read voltage VCGRV by the VCG step width. In this case, the since the temperature is not updated, the voltage $\Delta$V is determined by the initially acquired temperature and the VCG step width.

The control circuit 23 performs the read operation (A++ Read) for applying the voltage VA3 (=VA2+$\Delta$V) to the selected word line WLn, and subsequently performs the read operation (E++ Read) for applying the voltage VE3 (=VE2+$\Delta$V) to the selected word line WLn. The control circuit 23 counts the FBC(A++) during the E++ Read.

Figure 39:
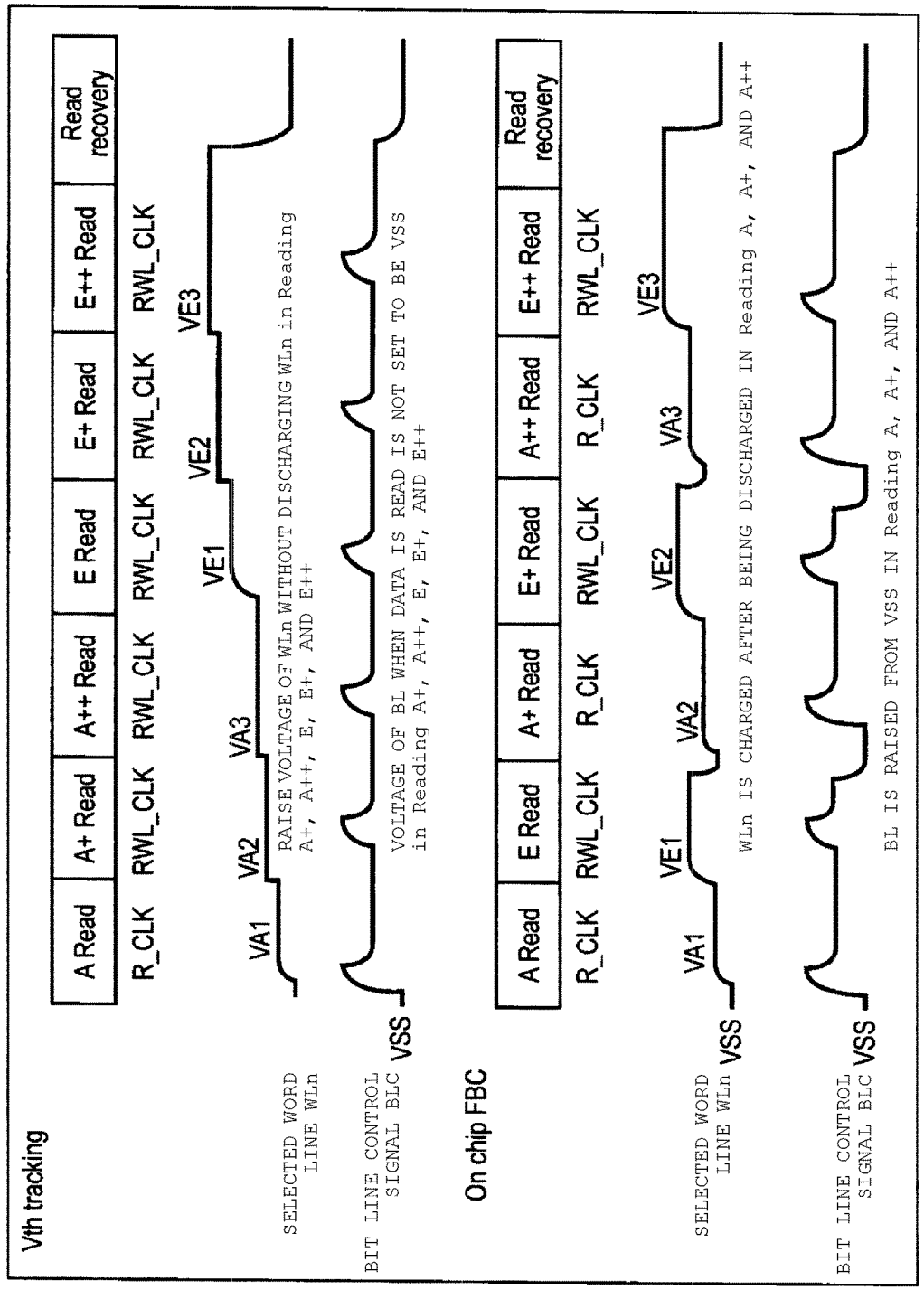
FIG. 39 is a diagram for describing a difference between Vth tracking and the data read/fail bit count operation performed by the non-volatile semiconductor storage device of the second embodiment.

Hereinafter, a difference between Vth tracking and the data read/fail bit count operation (On Chip FBC) of the present embodiment will be described with reference to FIG. 39.

The Vth tracking is an operation in which the data is read multiple times by raising the read voltage VCGRV. A top side of FIG. 39 shows the Vth tracking operation.

In a case where the lower page data is read multiple times by using the Vth tracking, the read operation (A Read) using the VA1, the read operation (A+ Read) using the VA2, the read operation (A++ Read) using the VA3, the read operation (E Read) using the VE1, the read operation (E+ Read) using the VE2, and the read operation (E++ Read) using the VE3 are sequentially performed.

During only the read operation (A read), the selected word line WLn and the bit lines BL0 to BL (L-1) are controlled in a first control mode (in this example, the first control mode is referred to as R_CLK). During all the other read operations, the selected word line WLn and the bit lines BL0 to BL (L-1) are controlled in a second control mode (in this example, the second control mode is referred to as RWL_CLK). The selected word line WLn and the bit lines BL0 to BL (L-1) are raised from the reference voltage VSS (VSS=ground voltage) in the first control mode (R_CLK), and the selected word line WLn and the bit lines BL0 to BL (L-1) are not set to be the reference voltage VSS in the second control mode (RWL_CLK).

The voltages of the bit lines BL0 to BL (L-1) are controlled by a bit line control signal BLC. The voltages of the bit lines BL0 to BL (L-1) are clamped by the bit line control signal BLC, and an upper limit of the voltage of the bit line control signal BLC is restricted to the voltage of the bit line control signal BLC. Thus, for example, the voltages of the bit lines BL0 to BL (L-1) are also the reference voltage VSS when the bit line control signal BLC is the reference voltage VSS.

In the Vth tracking, the control of each bit line BL and the control of the selected word line WLn are different between the A Read and the A+ Read (or A++ Read). Each bit line BL is raised to a desired voltage from the reference voltage VSS when the A Read is started. However, when the A+ Read is started (or the A++ Read is started), each bit line BL is not set to be the reference voltage VSS. The selected word line WLn is discharged when the A Read is started, but is not discharged when the A+ Read is started (or the A++ Read is started).

Accordingly, even though the difference in the number of on-cells caused by only the change in the read voltage VCGRV is desired to be acquired, a noise caused by the difference in the control of each bit line BL/selected word line WLn may be included in the difference of the number of on-cells acquired. As a result, the threshold voltage distribution is not able to be accurately drawn, and it is difficult to acquire the optimum read voltage.

In the data read/fail bit count operation (On Chip FBC) of the present embodiment, a set of the A Read and the E Read, a set of the A+ Read and the E+ Read, and a set of the A++ Read and the E++ Read are sequentially performed. The number of on-cells changed according to the value of the read voltage applied to the selected word line WLn is counted.

In each set, the read operations (A Read, A+ Read, and A++ Read) in the "A" state are controlled in the first control mode (R_CLK), and the read operations (E Read, E+ Read, and E++ Read) in the "E" state are controlled in the second control mode (RWL_CLK).

That is, when each set is started (that is, when transition from a certain set to a next set is performed), the A Read, the A+ Read, or the A++ Read is performed. In this case, the selected word line WLn and the bit lines BL0 to BL (L-1) are discharged and are then raised. For example, the voltages of the bit lines BL0 to BL (L-1) are discharged to the reference voltage VSS, and are raised to the pre-charge voltage from the reference voltage VSS.

More specifically, when transition from a next set from a certain set is performed, the bit line control signal BLC is lowered to the reference voltage VSS, and is raised from the reference voltage VSS. Thus, each bit line BL is discharged and is lowered to the reference voltage VSS. The voltage of each bit line BL is raised to a predetermined pre-charge voltage from the reference voltage VSS.

When each set is started (that is, when transition from a certain set to a next set is performed), the selected word line WLn is also discharged. For example, when transition from the E Read to the A+ Read is performed, the voltage of the selected word line WLn is initially lowered to the VA1 from the VE1, and is raised from the VA1 to VA2. When transition from the E+ Read to the A++ Read is performed, the voltage of the selected word line WLn is initially lowered to the VA2 from the VE2, and is raised to the VA3 from the VA2.

Thus, the control of each bit line BL may be similarly performed between the A Read and the A+ Read (or the A++ Read). The control of the selected word line WLn may also be similarly performed between the A Read and the A+ Read (or the A++ Read). Similarly, the control of each bit line BL may be similarly performed between the E Read and the E+ Read (or the E++ Read). The control of the selected word line WLn may also be similarly performed between the E Read and the E+ Read (or the E++ Read).

Accordingly, a noise caused by the difference in the control of each bit line BL/selected word line WLn is not included in the number of on-cells acquired in each read operation. Thus, it is possible to acquire the difference in the number of on-cells caused by only the change in the read voltage VCGRV. The memory controller 200 can accurately draw the threshold voltage distribution, and can acquire the optimum read voltage.

Figure 40:
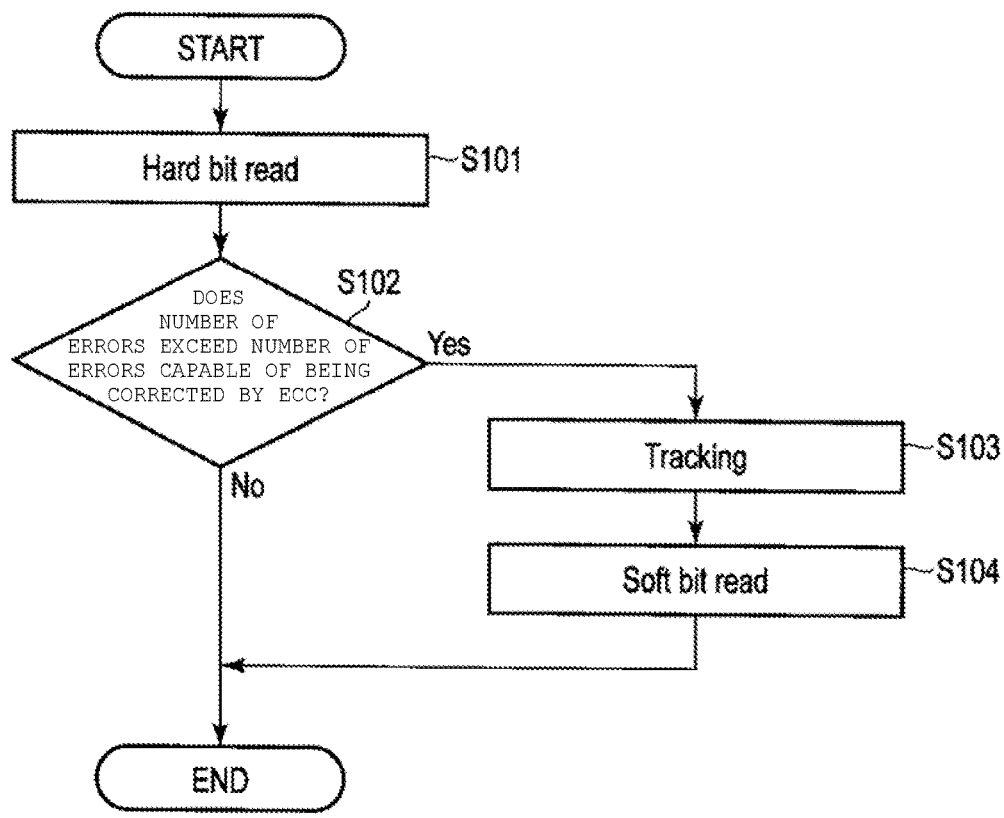
FIG. 40 is a flowchart showing a procedure of a read voltage adjustment process performed by the memory controller and the non-volatile semiconductor storage device of the second embodiment.

A flowchart of FIG. 40 shows a procedure of a read voltage adjustment processes performed by the memory controller 200 and the NAND flash memory 10.

The memory controller 200 transmits a read command including an address for designating a certain page to the NAND flash memory 10. In response to the reception of the read command, the control circuit 23 of the NAND flash memory 10 reads data from the page designated by the address (step S101). For example, when the page designated by the address is the lower page, the read operation AR and the read operation AE are performed, and the lower page data is returned to the memory controller 200.

The memory controller 200 determines whether or not the number of errors included in the lower page data exceeds the number of error capable of being corrected by the ECC (step S102). When the number of errors in the lower page data does not exceed the number of errors capable of being corrected by the ECC (NO of step S102), the process is ended. When the number of errors in the lower page data exceeds the number of errors capable of being corrected by the ECC (YES of step S102), the memory controller 200 transmits a command sequence (command YYh, command 00h, address ADD, and command 30h) for performing the fail bit count operation of this lower page to the NAND flash memory 10.

For example, the control circuit 23 of the NAND flash memory 10 performs the operation in which the data is read multiple times in each state, and counts the number of on-cells corresponding to each of the A Read, the A+ Read, the A++ Read, the E Read, the E+ Read, and the E++ Read (step S103). In response to the reception of the command (XXh) from the memory controller 200, the control circuit 23 transmits the number of on-cells to the memory controller 200 (step S104). The memory controller 200 acquires the optimum value of the read voltage VA and the optimum value of the read voltage VE based on the number of on-cells. The memory controller 200 transmits the command for instructing that the read voltages VA and VE are changed to the optimum values to the NAND flash memory 10.

Although the data read/fail bit count operation performed when the lower page data is read is described above, the data read/fail bit count operation may be applied to the reading of the middle page data/upper page data. For example, in the data read/fail bit count operation for the upper page, a read operation CR (C Read) using a read voltage VC1, a read operation GR (G Read) using a read voltage VG1, a read operation CR (C+ Read) using a read voltage VC2, a read operation GR (G+ Read) using a read voltage VG2, a read operation CR (C++ Read) using a read voltage VC3, and a read operation GR (G++ Read) using a read voltage VG3 are performed.

As described above, according to the on-chip FBC function of the second embodiment, the number of on-cells may be counted in the chip by the counter 23A of the NAND flash memory 10, and only the digital value indicating the number of on-cells may be output to the memory controller 200. Thus, it is possible to prevent the memory bus ((I/O) bus) 11 from being exclusively used for a long time in order to acquire the number of on-cells. In response to the reception of the read command one time, it is possible to acquire the number of on-cells in each state. It is possible to efficiently count the number of on-cells corresponding to a certain state in the background of the data read operation corresponding to another state. For example, in the operation in which the data is read multiple times in each state, the control of each bit line BL and the selected word line WLn can be similarly performed between the A Read and the A+ Read (or the A++ Read), and the control of each bit line BL and the selected word line WLn can be similarly performed between the E Read and the E+ Read (or the E++ Read). Accordingly, a noise caused by the difference in the control of each bit line BL/selected word line WLn is not included in the number of on-cells acquired in each read operation. Thus, it is possible to accurately acquire the difference in the number of on-cells caused by only the change of the read voltage VCGRV.

Another Configuration Example of Memory System

Figure 41:
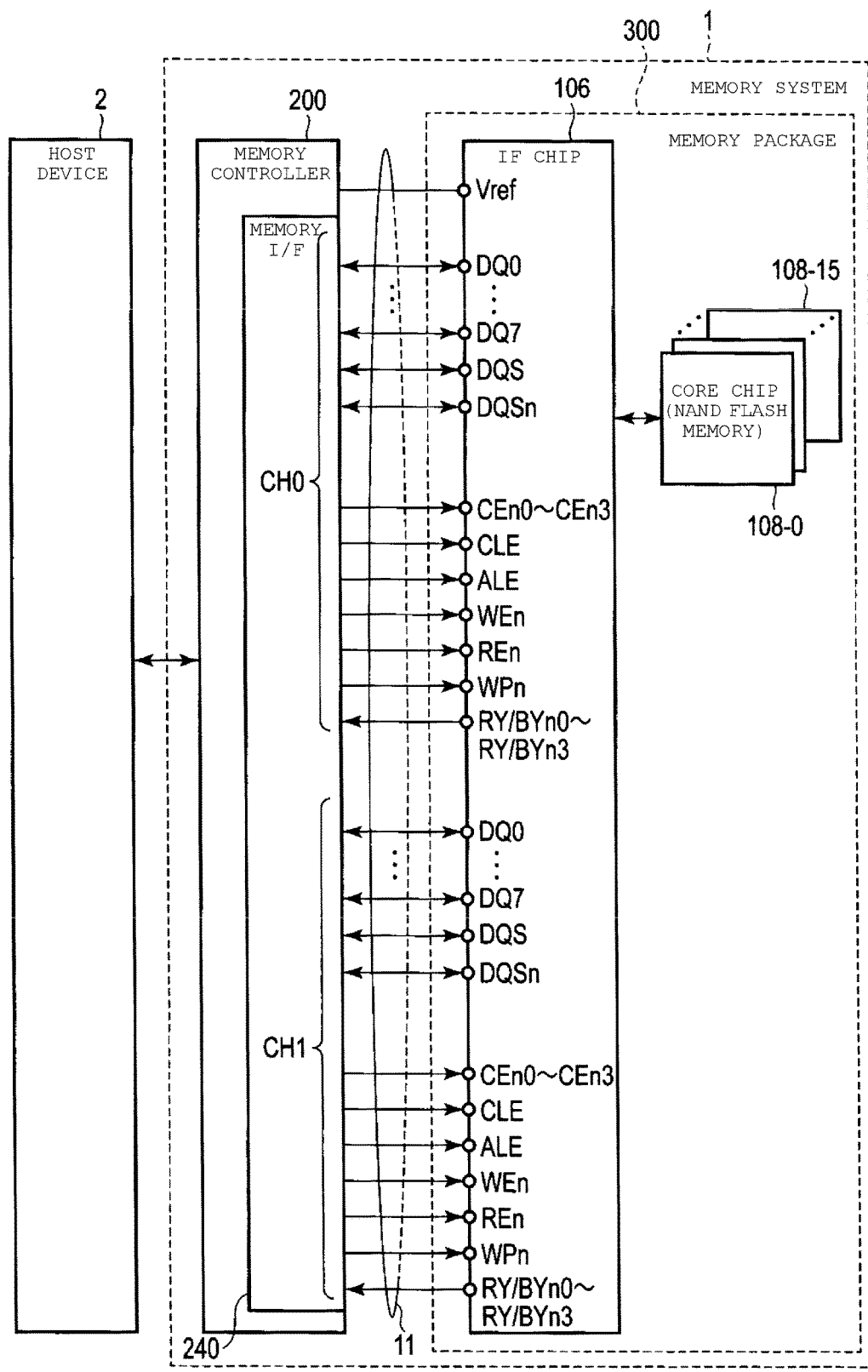
FIG. 41 is a block diagram showing another configuration example of the memory system.

FIG. 41 shows another configuration Example of the memory system 1.

In the memory system 1 of FIG. 41, a memory package 300 is used as a plurality of NAND flash memories 10. The memory package 300 includes an interface chip 106 and core chips 108-0 to 108-15. Each of the core chips 108-0 to 108-15 functions as the NAND flash memory 10. A part of the circuit configuration of the NAND flash memory 10 described in FIG. 3 may be provided in the interface chip 106.

The interface chip 106 and the core chips 108-0 to 108-15 are stacked within the memory package 300. A memory package 300 is a memory package capable of accelerating data input and output and reducing power consumption by a through-silicon via (TSV) technology that uses silicon through-electrodes passing vertically through the core chips 108-0 to 108-15 stacked within the package. The core chips 108-0 to 108-15 are connected to one another by a plurality of silicon through-electrodes.

The memory interface 240 of the memory controller 200 is connected to the memory package 300 via one or more channels. The memory interface 240 may be connected to a plurality of memory packages 300.

One or more channels function as the memory bus 11. Although it is described in this example that the memory interface 240 is connected to the memory package 300 via two channels CH0 and CH1, the memory interface 240 may be connected to the memory package 300 via only one channel, or may be connected to the memory package 300 via three or more channels.

Each channel includes, the chip enable signal CEn, the command latch enable signal CLE, the address latch enable signal ALE, the write enable signal WEn, the read enable signal REn, the write protect signal WPn, the ready/busy signal RY/BYn, the I/O signals DQ0 to DQ7 and DQn0 to DQn7, and the data strobe signals DQS and DQSn. The number of chip enable signals CEn per channel and the number of ready/busy signals RY/BYn per channel may be plural.

The memory controller 200 controls the core chips 108-0 to 108-15 via the interface chip 106. The core chips 108-0 to 108-15 are configured such that the functions described in the first embodiment and the functions described in the second embodiment are performed.

The interface chip 106 transmits the commands, the data items, and the addresses supplied from the memory controller 200 to the core chips 108-0 to 108-15, and transmits the data items received from the core chips 108-0 to 108-15 to the memory controller 200. The communication between the interface chip 106 and the core chips 108-0 to 108-15 is performed via the plurality of silicon through-electrodes.

Figure 42:
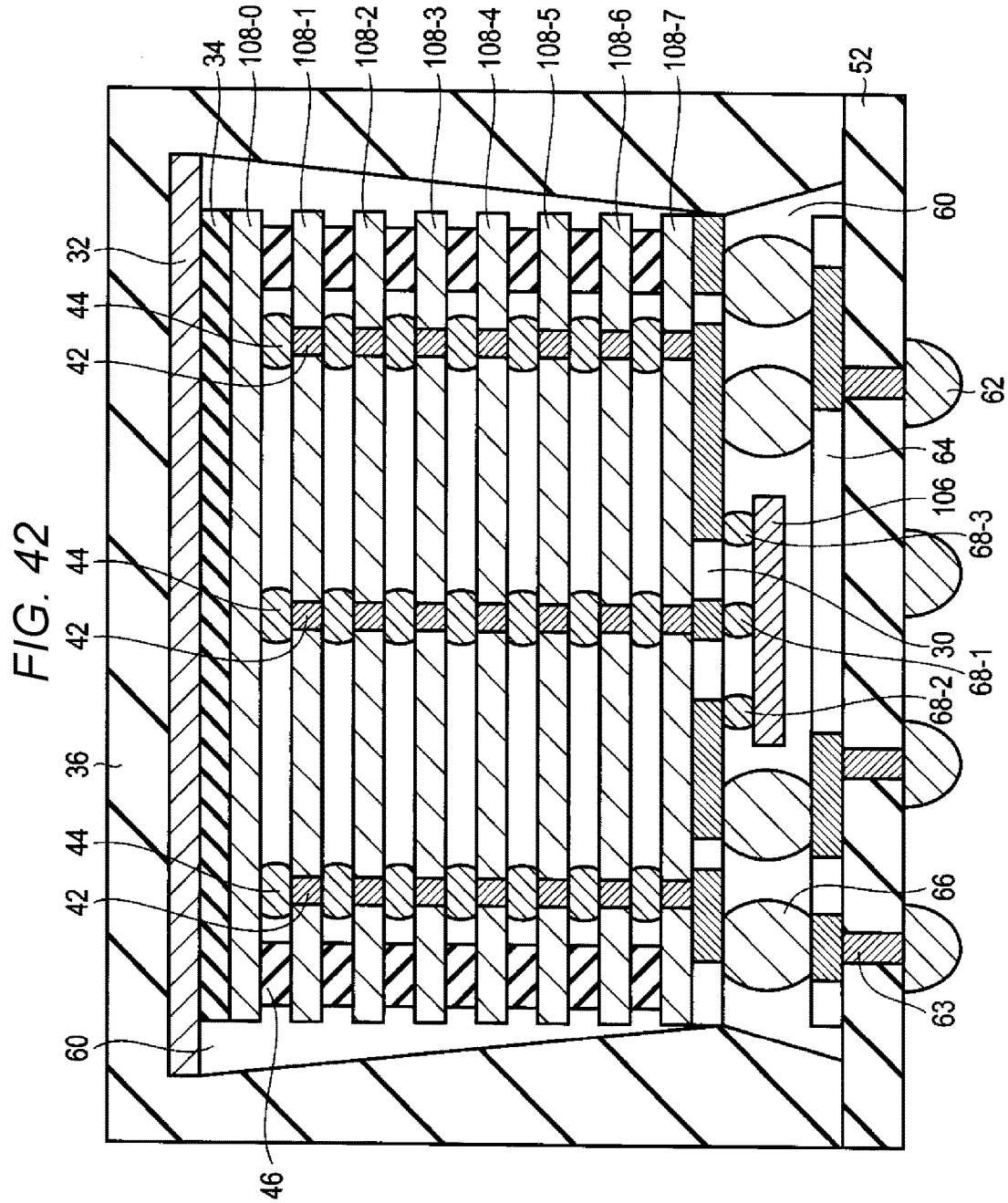
FIG. 42 is a sectional view of a memory package used in the memory system of FIG. 41.

FIG. 42 is a sectional view showing an example of the configuration of the memory package 300.

Although it is described in this example that eight core chips 108-0 to 108-7 are stacked, the number of stacked core chips is not limited to eight, and may be two or an arbitrary number of two or more.

The interface chip 106 is disposed in an upper part of a package substrate 52. The package substrate 52 may be a ball grid array (BGA) substrate. In this case, the package substrate 52 includes a plurality of solder balls (referred to as solder bumps) 62 which are terminals connected to an external device. The interface chip 106 is sealed with a sealing resin 60.

The core chips 108-0 to 108-7 are stacked above the interface chip 106. A spacer 46 is disposed between two core chips 108 adjacent to each other. Each core chip 108 includes a front surface wiring and a rear surface wiring. The core chips 108 are stacked in an orientation in which a surface on which the front surface wiring is formed is the bottom surface (face down).

A top surface (surface on which the rear surface wiring is formed) of the topmost core chip 108-0 adheres to a support plate 32 via an adhesive 34.

The plurality of silicon through-electrodes (hereinafter, simply referred to as through-electrodes) 42 is formed in the semiconductor substrates of the core chips 108-1 to 108-7. Each core chip 108 includes a cell area in which the memory cell is formed and a peripheral area in which the sense amplifier and the decoder are formed. The through-electrode 42 may be formed in the peripheral area.

The through-electrodes 42 of the core chips 108-1 to 108-7 are connected to the through-electrodes 42 of the core chips 108-0 to 108-6 located on the upper side via the solder balls 44. Thus, the through-electrodes 42 located in the same position of the core chips 108-1 to 108-7 are connected to one another, and the core chips 108-0 to 108-7 are connected to one another via the through-electrodes 42 and the solder balls 44.

A rewiring layer 30 is formed on a bottom surface (surface on the front surface wiring is formed) of the bottommost core chip 108-7. A wiring layer 64 is formed on a top surface of the package substrate 52. Solder balls 66 are formed between the rewiring layer 30 and the wiring layer 64. A plurality of pads formed on the front surface of the interface chip 106 is connected to the rewiring layer 30 via a plurality of solder balls (for example, solder balls 68-1, 68-2, and 68-3).

For example, the interface chip 106 s connected to a stacked body of the core chips 108 via the solder balls 68-1 and the rewiring layer 30. For example, the interface chip 106 is electrically connected to the memory controller 200 via the solder balls 68-2 and 68-3, the rewiring layer 30, the solder balls 66, the wiring layer 64, a wiring 63, and solder balls 62. The stacked body of the core chips 108 is electrically connected to the memory controller 200 via the rewiring layer 30, the solder balls 66, the wiring layer 64, the wiring 63, and the solder balls 62. A power supply voltage from the memory controller 200 may be directly supplied to the core chips 108 without using the interface chip 106. The above-described structure is disposed within a resin package 36 filled with the sealing resin 60. The resin package 36 may be made of the same material as that the sealing resin 60.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
a memory cell array that includes a plurality of non-volatile memory cells that are connected to a plurality of bit lines and a plurality of word lines; and a control circuit configured to control a data write operation for the memory cell array in one of first and second write modes in response to a write command sequence, wherein
in the first write mode, the control circuit performs a first write operation, which includes a first operation in which one or more bit lines of the plurality of bit lines are charged according to write data, a second operation in which a write voltage is applied to a selected word line of the plurality of word lines selected according to address data included in the write command sequence, and a third operation in which the plurality of bit lines are reset, the third operation beginning immediately after the second operation ends,
in the second write mode, the control circuit performs a second write operation, which includes the first operation in which the one or more bit lines are charged according to the write data and the third operation in which the plurality of bit lines are reset, the third operation beginning immediately after the first operation ends, and wherein the second write mode does not include the second operation in which the write voltage is applied to the selected word line.

2. The non-volatile semiconductor storage device according to claim 1, wherein in the third operation, the one or more bit lines are reset to a reference voltage.

3. The non-volatile semiconductor storage device according to claim 2, wherein the second write operation is repeated so that the first operation in which the one or more bit lines are charged and the third operation in which the one or more bit lines are reset to the reference voltage are repeatedly performed without the second operation in which the write voltage is applied to the selected word line being performed.

4. The non-volatile semiconductor storage device according to claim 1, wherein
in the first write mode, the control circuit performs the first write operation and then a verification operation in which data written in a memory cell group connected to the selected word line is verified, and
in the second write mode, the control circuit performs the second write operation and does not perform the verification operation thereafter.

5. The non-volatile semiconductor storage device according to claim 1, further comprising:
an input/output circuit; and
a data buffer that is connected to the input/output circuit, wherein
in the first write mode, the control circuit charges the one or more bit lines according to the write data received through the input/output circuit and stored in the data buffer, and
in the second write mode, the control circuit automatically generates the write data and charges the one or more bit lines according to the automatically generated write data.

6. The non-volatile semiconductor storage device according to claim 1,
wherein the control circuit acquires an internal temperature of the non-volatile semiconductor storage device after the second write operation is completed, and outputs the acquired temperature in response to a command.

7. The non-volatile semiconductor storage device according to claim 1, further comprising:
an input/output circuit; and
a data buffer that is connected to the input/output circuit via a data path, wherein
during the second write operation, the control circuit loads first data to the data buffer, transmits data from the data buffer to an internal register via the data path, returns data from the internal register to the data buffer via the data path, and sets a result of comparing the data returned to the data buffer with the first data in a status register.

8. A non-volatile semiconductor storage device comprising:
a memory cell array that includes a plurality of non-volatile memory cells that are connected to a plurality of bit lines and a plurality of word lines;
a control circuit configured to control a data write operation for the memory cell array in one of first and second write modes in response to a write command sequence;
an input/output circuit; and
a data buffer that is connected to the input/output circuit via a data path, wherein
in the first write mode, the control circuit performs a first write operation, which includes an operation in which one or more bit lines of the plurality of bit lines are charged according to write data and an operation in which a write voltage is applied to a selected word line of the plurality of word lines selected according to address data included in the write command sequence, and
in the second write mode, the control circuit performs a second write operation, which includes the operation in which the one or more bit lines are charged according to the write data and does not include the operation in which the write voltage is applied to the selected word line, and
during the second write operation, the control circuit loads first data to the data buffer, transmits data from the data buffer to an internal register via the data path, returns data from the internal register to the data buffer via the data path, and sets a result of comparing the data returned to the data buffer with the first data in a status register.

9. The non-volatile semiconductor storage device according to claim 8, wherein the internal register is a part of the input/output circuit.

10. A method of operating a non-volatile semiconductor storage device having a memory cell array that includes a plurality of non-volatile memory cells that are connected to a plurality of bit lines and a plurality of word lines in one of a first write mode and a second write mode in response to a write command sequence, said method comprising:
setting the non-volatile semiconductor storage device in a first write mode or a second write mode in response to a set feature command sequence;
while in the first write mode, in response to the write command sequence, performing a first write operation, which includes a first operation in which one or more bit lines of the plurality of bit lines are charged according to write data, a second operation in which a write voltage is applied to a selected word line of the plurality of word lines selected according to address data included in the write command sequence, and a third operation in which the plurality of bit lines are reset, the third operation beginning immediately after the second operation ends, and
while in the second write mode, in response to the write command sequence, performing a second write operation, which includes the first operation in which the one or more bit lines are charged according to the write data and the third operation in which the plurality of bit lines are reset, the third operation beginning immediately after the first operation ends, and wherein the second write mode does not include the second operation in which the write voltage is applied to the selected word line.

11. The method according to claim 10, wherein in the third operation, the one or more bit lines are reset to a reference voltage.

12. The method according to claim 11, wherein the second write operation is repeated so that the first operation in which the one or more bit lines are charged and the third operation in which the one or more bit lines are reset to the reference voltage are repeatedly performed without the second operation in which the write voltage is applied to the selected word line being performed.

13. The method according to claim 10, further comprising:
   while in the first write mode, in response to the write command sequence, after the first write operation, performing a verification operation in which data written in a memory cell group connected to the selected word line is verified and then repeating the first write operation and the verification operation, and
   while in the second write mode, in response to the write command sequence, repeating the second write operation without performing any verification operation prior to repeating the second write operation.

14. The method according to claim 10, wherein the non-volatile semiconductor storage device further includes an input/output circuit, and a data buffer that is connected to the input/output circuit, said method further comprising:
   in the first write mode, in response to the write command sequence, charging the one or more bit lines according to the write data received through the input/output circuit and stored in the data buffer, and
   in the second write mode, in response to the write command sequence, generating the write data and charging the one or more bit lines according to the generated write data.

15. The method according to claim 10, further comprising:
   acquiring an internal temperature of the non-volatile semiconductor storage device after the second write operation is completed, and outputting the acquired temperature in response to a command.

16. The method according to claim 10, wherein the non-volatile semiconductor storage device further includes an input/output circuit, and a data buffer that is connected to the input/output circuit via a data path, the method further comprising:
   during the second write operation, loading first data to the data buffer, transmitting data from the data buffer to an internal register via the data path, returning data from the internal register to the data buffer via the data path, and setting a result of comparing the data returned to the data buffer with the first data in a status register.

17. A method of operating a non-volatile semiconductor storage device having a memory cell array that includes a plurality of non-volatile memory cells that are connected to a plurality of bit lines, a plurality of word lines in one of a first write mode and a second write mode in response to a write command sequence, an input/output circuit, and a data buffer that is connected to the input/output circuit via a data path, the method comprising:
   setting the non-volatile semiconductor storage device in a first write mode or a second write mode in response to a set feature command sequence;
   while in the first write mode, in response to the write command sequence, performing a first write operation, which includes an operation in which one or more bit lines of the plurality of bit lines are charged according to write data and an operation in which a write voltage is applied to a selected word line of the plurality of word lines selected according to address data included in the write command sequence; and
   while in the second write mode, in response to the write command sequence, performing a second write operation, which includes the operation in which the one or more bit lines are charged according to the write data and does not include the operation in which the write voltage is applied to the selected word line; and
   during the second write operation, loading first data to the data buffer, transmitting data from the data buffer to an internal register via the data path, returning data from the internal register to the data buffer via the data path, and setting a result of comparing the data returned to the data buffer with the first data in a status register.

18. The method according to claim 17, wherein the internal register is a part of the input/output circuit.

* * * * *